(12) United States Patent
Millward et al.

(10) Patent No.: US 8,642,157 B2
(45) Date of Patent: *Feb. 4, 2014

(54) ONE-DIMENSIONAL ARRAYS OF BLOCK COPOLYMER CYLINDERS AND APPLICATIONS THEREOF

(75) Inventors: Dan B. Millward, Boise, ID (US); Karl Stuen, Madison, WI (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/312,383

(22) Filed: Dec. 6, 2011

(65) Prior Publication Data

US 2012/0076978 A1  Mar. 29, 2012

Related U.S. Application Data

(63) Continuation of application No. 12/030,562, filed on Feb. 13, 2008, now Pat. No. 8,101,261.

(51) Int. Cl.
*B32B 5/12* (2006.01)

(52) U.S. Cl.
USPC .......................... 428/105; 428/113

(58) Field of Classification Search
USPC .................................. 428/105, 113
See application file for complete search history.

(56) References Cited

U.S. PATENT DOCUMENTS

| | | | |
|---|---|---|---|
| 4,623,674 A | 11/1986 | Bailey et al. |
| 4,797,357 A | 1/1989 | Mura et al. |
| 4,877,647 A | 10/1989 | Klabunde |
| 5,328,810 A | 7/1994 | Lowrey et al. |
| 5,374,367 A | 12/1994 | Edamura et al. |
| 5,382,373 A | 1/1995 | Carlson |
| 5,482,656 A | 1/1996 | Hiraoka et al. |
| 5,512,131 A | 4/1996 | Kumar et al. |
| 5,538,655 A | 7/1996 | Fauteux |
| 5,580,700 A | 12/1996 | Rahman |
| 5,620,850 A | 4/1997 | Bamdad et al. |
| 5,622,668 A | 4/1997 | Thomas |
| 5,772,905 A | 6/1998 | Chou |
| 5,834,583 A | 11/1998 | Hancock et al. |
| 5,849,810 A | 12/1998 | Muller |
| 5,879,582 A | 3/1999 | Havelka et al. |
| 5,879,853 A | 3/1999 | Azuma |
| 5,891,356 A | 4/1999 | Inoue et al. |
| 5,904,824 A | 5/1999 | Oh |
| 5,925,259 A | 7/1999 | Biebuyck et al. |
| 5,948,470 A | 9/1999 | Harrison et al. |
| 5,958,704 A | 9/1999 | Starzl et al. |
| 6,111,323 A | 8/2000 | Carter et al. |
| 6,143,647 A | 11/2000 | Pan et al. |
| 6,207,787 B1 | 3/2001 | Fahey et al. |
| 6,270,946 B1 | 8/2001 | Miller |
| 6,309,580 B1 | 10/2001 | Chou |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,414,164 B1 | 7/2002 | Afzali-Ardakani et al. |
| 6,423,465 B1 | 7/2002 | Hawker et al. |
| 6,423,474 B1 | 7/2002 | Holscher |
| 6,503,841 B1 | 1/2003 | Criscuolo |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross et al. |
| 6,812,132 B2 | 11/2004 | Ramachandrarao et al. |
| 6,825,358 B2 | 11/2004 | Afzali-Ardakani et al. |

(Continued)

FOREIGN PATENT DOCUMENTS

| | | |
|---|---|---|
| CN | 1562730 | 1/2005 |
| EP | 0784543 B1 | 4/2000 |

(Continued)

OTHER PUBLICATIONS

Jun, et al., Langmuir, 2002, 18(9), pp. 3415-3417, Abstract only.

(Continued)

*Primary Examiner* — Edward Cain
(74) *Attorney, Agent, or Firm* — TraskBritt

(57) ABSTRACT

Methods for fabricating sub-lithographic, nanoscale microstructures in one-dimensional arrays utilizing self-assembling block copolymers, and films and devices formed from these methods are provided.

28 Claims, 31 Drawing Sheets

(56) References Cited

U.S. PATENT DOCUMENTS

| | | | |
|---|---|---|---|
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wirnsberger et al. |
| 6,957,608 B1 | 10/2005 | Hubert et al. |
| 6,962,823 B2 | 11/2005 | Empedocles et al. |
| 6,989,426 B2 | 1/2006 | Hu et al. |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,060,774 B2 | 6/2006 | Sparrowe et al. |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,195,733 B2 | 3/2007 | Rogers et al. |
| 7,202,308 B2 | 4/2007 | Boussand et al. |
| 7,208,836 B2 | 4/2007 | Manning |
| 7,252,791 B2 | 8/2007 | Wasserscheid et al. |
| 7,259,101 B2 | 8/2007 | Zurcher et al. |
| 7,282,240 B1 | 10/2007 | Jackman et al. |
| 7,291,284 B2 | 11/2007 | Mirkin et al. |
| 7,311,943 B2 | 12/2007 | Jacobson et al. |
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 | 9/2009 | Manning |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,767,099 B2 | 8/2010 | Li et al. |
| 7,888,228 B2 | 2/2011 | Blanchard |
| 7,959,975 B2 | 6/2011 | Millward |
| 8,039,196 B2 | 10/2011 | Kim et al. |
| 8,083,953 B2 | 12/2011 | Millward et al. |
| 8,097,175 B2 | 1/2012 | Millward et al. |
| 8,101,261 B2 * | 1/2012 | Millward et al. ............ 428/105 |
| 8,114,300 B2 | 2/2012 | Millward |
| 8,294,139 B2 | 10/2012 | Marsh et al. |
| 2001/0024768 A1 | 9/2001 | Matsuo et al. |
| 2002/0055239 A1 | 5/2002 | Tuominen et al. |
| 2002/0084429 A1 | 7/2002 | Craighead et al. |
| 2002/0158342 A1 | 10/2002 | Tuominen et al. |
| 2002/0167117 A1 | 11/2002 | Chou |
| 2003/0034329 A1 | 2/2003 | Chou |
| 2003/0068639 A1 | 4/2003 | Haneder et al. |
| 2003/0077452 A1 | 4/2003 | Guire et al. |
| 2003/0080471 A1 | 5/2003 | Chou |
| 2003/0080472 A1 | 5/2003 | Chou |
| 2003/0091752 A1 | 5/2003 | Nealey et al. |
| 2003/0100822 A1 | 5/2003 | Lew et al. |
| 2003/0108879 A1 | 6/2003 | Klaerner et al. |
| 2003/0143375 A1 | 7/2003 | Noguchi et al. |
| 2003/0157248 A1 | 8/2003 | Watkins et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski |
| 2003/0222048 A1 | 12/2003 | Asakawa et al. |
| 2003/0235930 A1 | 12/2003 | Bao et al. |
| 2004/0028875 A1 | 2/2004 | Van Rijn et al. |
| 2004/0058059 A1 | 3/2004 | Linford et al. |
| 2004/0084298 A1 | 5/2004 | Yao et al. |
| 2004/0124092 A1 | 7/2004 | Black et al. |
| 2004/0125266 A1 | 7/2004 | Miyauchi et al. |
| 2004/0127001 A1 | 7/2004 | Colburn |
| 2004/0142578 A1 | 7/2004 | Wiesner et al. |
| 2004/0159633 A1 | 8/2004 | Whitesides et al. |
| 2004/0163758 A1 | 8/2004 | Kagan et al. |
| 2004/0175628 A1 | 9/2004 | Nealey et al. |
| 2004/0192013 A1 | 9/2004 | Ryu et al. |
| 2004/0222415 A1 | 11/2004 | Chou et al. |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol |
| 2005/0079486 A1 | 4/2005 | Abbott et al. |
| 2005/0100830 A1 | 5/2005 | Xu et al. |
| 2005/0120902 A1 | 6/2005 | Adams et al. |
| 2005/0124135 A1 | 6/2005 | Ayazi et al. |
| 2005/0147841 A1 | 7/2005 | Tavkhelidze et al. |
| 2005/0167651 A1 | 8/2005 | Merkulov et al. |
| 2005/0208752 A1 | 9/2005 | Colburn et al. |
| 2005/0238889 A1 | 10/2005 | Iwamoto |
| 2005/0238967 A1 | 10/2005 | Rogers et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0035387 A1 | 2/2006 | Wagner et al. |
| 2006/0038182 A1 | 2/2006 | Rogers et al. |
| 2006/0046079 A1 | 3/2006 | Lee |
| 2006/0046480 A1 | 3/2006 | Guo |
| 2006/0060863 A1 | 3/2006 | Lu et al. |
| 2006/0062867 A1 | 3/2006 | Choi |
| 2006/0078681 A1 | 4/2006 | Hieda et al. |
| 2006/0097134 A1 | 5/2006 | Rhodes |
| 2006/0105562 A1 | 5/2006 | Yi |

(56) References Cited

U.S. PATENT DOCUMENTS

| | | |
|---|---|---|
| 2006/0124467 A1 | 6/2006 | Ho et al. |
| 2006/0128165 A1 | 6/2006 | Theiss et al. |
| 2006/0134556 A1 | 6/2006 | Nealey et al. |
| 2006/0137554 A1 | 6/2006 | Kron et al. |
| 2006/0141222 A1 | 6/2006 | Fischer et al. |
| 2006/0141245 A1 | 6/2006 | Stellacci et al. |
| 2006/0154466 A1 | 7/2006 | Lee et al. |
| 2006/0163646 A1 | 7/2006 | Black |
| 2006/0192283 A1 | 8/2006 | Benson |
| 2006/0205875 A1 | 9/2006 | Cha et al. |
| 2006/0211871 A1 | 9/2006 | Dai |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze et al. |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells |
| 2007/0045562 A1 | 3/2007 | Parekh |
| 2007/0045642 A1 | 3/2007 | Li |
| 2007/0071881 A1 | 3/2007 | Chua et al. |
| 2007/0072403 A1 | 3/2007 | Sakata |
| 2007/0122749 A1 | 5/2007 | Fu et al. |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0183035 A1 | 8/2007 | Asakawa et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0224823 A1 | 9/2007 | Sandhu |
| 2007/0227383 A1 | 10/2007 | Decre et al. |
| 2007/0249117 A1 | 10/2007 | Kang et al. |
| 2007/0272951 A1 | 11/2007 | Lieber et al. |
| 2007/0281220 A1 | 12/2007 | Sandhu et al. |
| 2007/0289943 A1 | 12/2007 | Lu et al. |
| 2007/0293041 A1 | 12/2007 | Yang et al. |
| 2008/0032238 A1 | 2/2008 | Lu et al. |
| 2008/0038467 A1 | 2/2008 | Jagannathan et al. |
| 2008/0038923 A1 | 2/2008 | Edelstein et al. |
| 2008/0041818 A1 | 2/2008 | Kihara et al. |
| 2008/0047930 A1 | 2/2008 | Blanchet et al. |
| 2008/0064217 A1 | 3/2008 | Horii |
| 2008/0073743 A1 | 3/2008 | Alizadeh et al. |
| 2008/0083991 A1 | 4/2008 | Yang et al. |
| 2008/0085601 A1 | 4/2008 | Park et al. |
| 2008/0093743 A1 | 4/2008 | Yang et al. |
| 2008/0102252 A1 | 5/2008 | Black et al. |
| 2008/0103256 A1 | 5/2008 | Kim et al. |
| 2008/0113169 A1 | 5/2008 | Cha et al. |
| 2008/0164558 A1 | 7/2008 | Yang et al. |
| 2008/0174726 A1 | 7/2008 | Kim |
| 2008/0176767 A1 | 7/2008 | Millward |
| 2008/0193658 A1 | 8/2008 | Millward |
| 2008/0217292 A1 | 9/2008 | Millward et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |
| 2008/0311347 A1 | 12/2008 | Millward et al. |
| 2008/0315270 A1 | 12/2008 | Marsh et al. |
| 2008/0318005 A1 | 12/2008 | Millward |
| 2009/0062470 A1 | 3/2009 | Millward et al. |
| 2009/0155579 A1 | 6/2009 | Greco et al. |
| 2009/0200646 A1 | 8/2009 | Millward et al. |
| 2009/0206489 A1 | 8/2009 | Li et al. |
| 2009/0218567 A1 | 9/2009 | Mathew et al. |
| 2009/0236309 A1 | 9/2009 | Millward et al. |
| 2009/0240001 A1 | 9/2009 | Regner |
| 2009/0263628 A1 | 10/2009 | Millward |
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward |
| 2010/0316849 A1 | 12/2010 | Millward et al. |
| 2010/0323096 A1 | 12/2010 | Sills et al. |
| 2011/0232515 A1 | 9/2011 | Millward |
| 2012/0133017 A1 | 5/2012 | Millward et al. |

FOREIGN PATENT DOCUMENTS

| | | |
|---|---|---|
| EP | 1416303 A2 | 5/2004 |
| EP | 1593164 B1 | 6/2010 |
| JP | 11080414 | 3/1999 |
| JP | 2003155365 | 5/2003 |
| JP | 2004335962 | 11/2004 |
| JP | 2005029779 A | 2/2005 |
| JP | 2006036923 | 2/2005 |
| JP | 2006055982 | 3/2006 |
| JP | 2006110434 A | 4/2006 |
| JP | 2005008882 | 7/2006 |
| JP | 2007194175 A | 8/2007 |
| JP | 2008036491 | 2/2008 |
| KR | 100771886 B1 | 11/2007 |
| TW | 200400990 A | 1/2004 |
| TW | 200419017 | 10/2004 |
| TW | 200511364 | 3/2005 |
| TW | I253456 | 4/2006 |
| TW | 256110 | 6/2006 |
| WO | 9007575 | 7/1990 |
| WO | 9706013 | 2/1997 |
| WO | 9839645 A1 | 9/1998 |
| WO | 9947570 | 9/1999 |
| WO | 0031183 A1 | 6/2000 |
| WO | 0218080 A1 | 3/2002 |
| WO | 02081372 A2 | 10/2002 |
| WO | 03045840 A2 | 6/2003 |
| WO | 2005122285 A2 | 12/2005 |
| WO | 2006003592 A2 | 1/2006 |
| WO | 2006003594 A2 | 1/2006 |
| WO | 2006076016 | 7/2006 |
| WO | 2006078952 | 7/2006 |
| WO | 2006112887 A2 | 10/2006 |
| WO | 2007001294 | 1/2007 |
| WO | 2007/013889 A2 | 2/2007 |
| WO | 2007019439 A3 | 2/2007 |
| WO | 2007024241 | 3/2007 |
| WO | 2007024323 A2 | 3/2007 |
| WO | 2007055041 | 5/2007 |
| WO | 2008055137 A2 | 5/2008 |
| WO | 2008091741 A2 | 7/2008 |
| WO | 2008096335 A2 | 8/2008 |
| WO | 2008097736 A2 | 8/2008 |
| WO | 2008118635 A2 | 10/2008 |
| WO | 2008124219 A2 | 10/2008 |
| WO | 2008130847 A1 | 10/2008 |
| WO | 2008145268 A2 | 12/2008 |
| WO | 2008156977 A2 | 12/2008 |
| WO | 2009099924 A2 | 8/2009 |
| WO | 2009102551 A2 | 8/2009 |
| WO | 2009117238 A2 | 9/2009 |
| WO | 2009117243 A1 | 9/2009 |
| WO | 2009134635 A2 | 11/2009 |

(56) References Cited

FOREIGN PATENT DOCUMENTS

OTHER PUBLICATIONS

Karim, Alamgir et al., Control of Ordering Kinetics and Morphology Using Zone Annealing of Thin Block Copolymer Filmes , Abstract submitted for the Mar. 2007 Meeting of The American Physical Society, Nov. 20, 2006.
Kim, IS, et al., Int J Pharm., Sep. 15, 2000; 205(1-2): 109-16, Abstract only.
Kim, Sang Ouk, et al., Nature, vol. 424, Jul. 24, 2003, pp. 411-414.
Kim, Sang Ouk, et al., Adv. Mater., 2007, 19, pp. 3271-3275.
Kim, Seung Hyun, et al., Adv. Mater. 2004, 16, No. 3, Feb. 3, pp. 226-231.
Kim, Seung Hyun, et al., Macromolecules 2006, vol. 39, No. 24, 2006, pp. 8473-8479.
Kim, Seung Hyun, et al., Advanced Mater., vol. 16, No. 23-24, pp. 2119-2123, Dec. 17, 2004.
Kim, SH, J Biomater Appl., Jul. 2000; 15(1): 23-46 Abstract only.
Kim, SH, J Biomater Res., Mar. 15, 2000; 49(4): 517-27 Abstract only.
Kim, Su-Jin, et al., J. Vac. Sci. Technol. B26(1), Jan./Feb. 2008, 189-194.
Krishnamoorthy, Sivashankar, et al., MaterialsToday, vol. 9, No. 9, Sep. 2006, pp. 40-47.
La, Young-Hye, et al., Chem. Mater, 2007, vol. 19, No. 18, pp. 4538-4544.
La, Young-Hye, et al., J. Vac. Sci. Technol. B 25[6], Nov./Dec. 2007, pp. 2508-2513.
Laracuente, A.R., et al., Surface Science 545, 2003, pp. 70-84.
Lentz, David, et al., Whole Wafer Imprint Patterning Using Step and Flash Imprint Lithography: A Manufacturing Solution for Sub 100 nm Patterning , SPIE Advanced Lithography Paper, http://molecularimprints.com/ NewsEvents/tech_articles/new_articles/SPIE_07_MII_WW_Paper.pdf], Feb. 2007, pp. 1-10.
Li, Mingqi, et al., MaterialsToday, vol. 9, No. 9, Sep. 2006, pp. 30-39.
Li, Wai-kin, et al, J. Vac. Sci. Technol. B 25[6], Nov./Dec. 2007, pp. 1982-1984.
Li, Xue, et al., ScienceDirect, Polymer 48 [2007], pp. 2434-2443.
Lin, Zhiqun, et al., Adv. Mater. 2002, 14 No. 19, Oct. 2, pp. 1373-1376.
Lin-Gibson, Sheng, et al., Macromolecules 2005, 38, pp. 2897-2902.
Lutolf, M.P., et al, Nature Biotechnology, 23, 47-55 (2005), Abstract only.
Malkoch, Michael, et al., Chem. Commun., 2006, pp. 2774-2776.
Mansky, P., et al., Science, vol. 275, Mar. 7, 1997, pp. 1458-1460.
Martens, P., et al., Polymer, vol. 41, Issue 21, Oct. 2000, pp. 7715-7722, Abstract only.
Matsuda, T., et al., ASAIO J, 1992 Jul.-Sep.; 38(3): M154-7, Abstract only.
Maye, Mathew A., et al., Journal of Chemical Education, vol. 79, No. 2, Feb. 2002, pp. 207-210.
Metters, Andrew, et al., Biomacromolecules 2005, 6, pp. 290-301, 2005.
Meyer, Evelyn, et al., Macromollecular Mater. Eng., 276/277, 2000, pp. 44-50.
Mezzenga, Raffaele, et al., Langmuir 2003, vol. 19, No. 20, 2003, pp. 8144-8147.
Mindel, Joseph., et.al., A Study of Bredig Platinum Sols , The Chemical Laboratories of New York University, vol. 65 pp. 2112.
Nealey, Paul F., et al., Self-Assembling Resists for Nanolithography , IEEE 2005.
Naito, et al., IEEE Transactions on Magnetics, vol. 38, No. 5, Sep. 2002, pp. 1949-1951.
Nishikubo, T., American Chemical Society Symposium Series, 1997, p. 214-230.
Niu, Sanjun, et al., Macromolecules, 36(7), 2428-2440, 2003 (web release date: Mar. 13, 2003) http://digitalcommons.uni.edu/cgi/viewcontent.cgi?article+1005&contect=chemeng_nanotechnology).

Olayo-Valles, Roberto et al., J. Mater. Chem, 2004, 14, 2729-2731.
Parejo, Pilar Garcia, et al., J. Mater. Chem., 2006, 16, pp. 2165-2169.
Park, Cheolmin, et al., Polymer 44, 2003, 6725-6760.
Park, Dae-Ho, Nanotechnology 18, 2007, 355304, pp. 1-7.
Park, Miri, et al., Science, v. 276, No. 5317, p. 1401-1404, May 30, 1997.
Park, Sang-Min, et al., Adv. Mater., 2007, 19, pp. 607-611.
Park, Sung Chan, et al., Macromolecules 2007, vol. 40, No. 22, pp. 8119-8124.
Peng, Juan et al., Macromol. Rapid Commun. 2007, 28, 1422-1428.
Peters, Richard D., et al., J. Vac. Sci. Technol. B, vol. 18, No. 6, Nov./Dec. 2000, pp. 3530-3532.
Peters, Richard D., et al., Macromolecules, vol. 35, No. 5, 2002, pp. 1822-1834.
Potemkin, Igor I., et al., Macromol. Rapid Commun., 2007, 28, pp. 579-584.
Resnick, Douglas, J., et al., J. Microlith., Microfab., Microsyst., vol. 3, No. 2, Apr. 2004, pp. 316-321.
Rogers, John A., ACS Nano, vol. 1, No. 3, pp. 151-153, 2007.
Rozkiewicz, Dorota I., et al., Angew. Chem. Int. Ed., 2006, 45, pp. 5292-5296.
Ali, H.A., et al., Solid-State Electronics 46 (2002), 1639-1642.
Arshady et al., Makromol. Chem., 1976, vol. 177, p. 2911-2918.
Bae, Joonwon, Surface Modification Using Photo-Crosslinkable Random Copolymers , Abstract submitted for the Mar. 2006 meeting of The American Physical Society, submitted Nov. 30, 2005.
Balsara et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.
Bang, J., Abstract submitted for the Mar. 2006 meeting of the American Physical Society, submitted Nov. 2005 (online), accessed via the Internet (retrieved on Apr. 5, 2010), URL: <http://absimage.aps.org/image/MWS_MAR06-2005-003641.pdf>.
Bang, Joona, The Effect of Humidity on the Ordering of Tri-block Copolymer Thin Films, Abstract submitted for the Mar. 2007 meeting of The American Physical Society, submitted Nov. 20, 2006.
Bass, Robert B., et al., Microcontact Printing with Octadecanethiol , Applied Surface Science, 226(4), pp. 335-340, Apr. 2004, http://www.ece.virginia.edu/UVML/sis/Papers/rbbpapers/assoct.pdf.
Bearinger, J.P., et al., Nature Materials 2, 259-264, 2003.
Berry, B.C., et al., Effects of Zone Annealing on Thin Films of Block Copolymers , National Institute of Standard and Technology, Polymers Division, Gaithersburg, MD., 2007.
Black, C.T., IEEE 2005 Custom Integrated Circuits Conference, pp. 87-91.
Black, C.T., Applied Physics Letters 87, 163116-1 to 1163116-3, 2005.
Black, C.T., et al., IBM J. Res. & Dev., vol. 51, No. 5, Sep. 2007, pp. 605-633.
Black, C.T., Proc. of SPIE, vol. 6153, 615302 (2006).
Black, Charles T., IEEE Transactions on Nanotechnology, vol. 3, No. 3, Sep. 2004, pp. 412-415.
Black, Charles T., ACSNano, vol. 1, No. 3, 2007, American Chemical Society, pp. 147-150.
Black, Charles T., et al., IEEE Electronon Device Letters, vol. 25, No. 9, Sep. 2004, pp. 622-624.
Botelho do Rego, A.M., et al., Surface Science, 482-485 (2001), pp. 1228-1234.
Brydson, Rik M., et al. (chapter authors), Generic Methodologies for Nanotechnology: Classification and Fabrication , Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).
Bulpitt, Paul et al, Journal of Biomedical Materials Research, vol. 47, Issue 2, pp. 152-169, Abstract only.
Canaria, Christi A., et al., Formation and Removal of Alkylthiolate Self-Assembled Monolayers on Gold in Aqueous Solutions , Lab Chip 6, 289-295 (2006), http://www.rsc.org/publishing/journals/LC/article.asp?doi=b51066c] (Abstract).
Candau et al., Polymer, 1977, vol. 18, p. 1253-1257.
Cavicchi, Kevin A., et al., Macromolecules 2007, vol. 40, 2007, pp. 1181-1186.

(56) References Cited

OTHER PUBLICATIONS

Chandekar, Arnol, et al., Template-Directed Adsorption of block Copolymers on Alkanethiol-Patterned Gold Surfaces, (circa 2006), http://www.nano.neu.edu/industry/industry_showcase/industry_day/documents/Chandekar.pdf) (Powerpoint template for scientific posters (Swarthmore College)).
Cheng, Joy T., et al., Nano Letters, vol. 0, No. 0, A-E, published on Web Aug. 16, 2006.
Cheng, Joy Y., et al., Nano Letters, vol. 6, No. 9, 2006, pp. 2009-2103.
Cheng, Joy Y., et al., Adv. Mater. 2003, vol. 15, No. 19, pp. 1599-1602.
Cheng, Joy Y., et al., Applied Physics Letters, 91, 143106-143106-3 (2007).
Daoulas Kostas Ch., et al., Physical Review Letters 96, week ending Jan. 27, 2006, pp. 036104-1-3.
Darling, S.B., Progress in Polymer Science, vol. 32, No. 10, Sep. 28, 2007, pp. 1152-1204.
Desai, Dr. Trejal A., et al., Business Briefing: Medical Device Manufacturing & Technology, 2002.
Edwards, Erik W., et al., Journal of Polymer Science: Part B Polymer Physics, vol. 43, 3444-3459, 2005.
Edwards, Erik W., et al., Advanced Mater, 16, No. 15, Aug. 4, 2004, pp. 1315-1319.
Elisseeff J., et al., Journal of Biomedical Materials Research, 51(2): 164-171, Aug. 2000, Abstract only.
Fasolka, Michael J. et al., Macromolecules 2000, vol. 33, No. 15, pp. 5702-5712.
Gates, Byron D., et al., Annu. Rev. Mater. Res. 2004, 34:339-72.
Ge, Zhenbin, et al., PRL 96, 186101-1 186101-4, The American Physical Society, week ending May 12, 2006.
Gelest Inc., Silane Coupling Agents: Connecting Across Boundaries, pp. 1-56, 2006.
Genua, A., et al., Nanotechnology, 18 (2007), pp. 1-7.
Gillmor, S.D., et al., Langmuir 2000, vol. 16, No. 18, 2000, pp. 7223-7228.
Gudipati, Chakravarthy S., et al., Journal of Polymer Science Part A: Polymer Chemistry, vol. 42, pp. 6193-6208.
Guo, Kai, et al., Abstract of Synthesis and Characterization of Novel Biodegradable Unsaturated Poly(ester amide)/Poly(ethylene glycol) Diacrylate Hydrogels, Journal of Polymer Science Part A: Polymer Chemistry, vol. 43, Issue 17, pp. 3932-3944, 2005 Wiley Periodicals, Inc.
Hamley, I. W., Introduction to Block Copolymers, Developments in Block Copolymers Science and Technology, 2004, John Wiley & Sons, Ltd., pp. 1-29.
Harrison, Christopher et al., Polymer, vol. 39, No. 13, pp. 2733-2744, 1998.
Hawker, et al., Facile Synthesis of Block Copolymers for Nanolithographic Applications; Polymer Reprints, 2005.
He, Yiyong et al., J. Am. Chem. Soc. 2006, 128, 2745-2750.
Hermans, Thomas M., et al., Application of Solvent-Directed Assembly of Block Copolymers to the Synthesis of Nanostructured Materials with Low Dielectric Constants, Angewandte Chem. Int. Ed. 2006, 45, pp. 6648-6652.
Hutchison, J. Brian, et al., Chem. Mater., vol. 17, No. 19, 2005, pp. 4789-4797.
In, Insik, et al., Langmuir, vol. 22, No. 18, 2006, pp. 7855-7860.
Ji, Shengxiang, et al., Preparation of Neutral Wetting Brushes for Block Copolymer Films from Homopolymer Blends, submitted to Advanced Materials, 20[16]: 3054-3060; published online Jul. 7, 2008.
Ji, Shengxiang, et al., Macromolecules, 2008, 41(23): 9098-9103.
Ruiz, Ricardo, et al., Adv. Mater, 2007, 19, pp. 587-591.
Ruiz, Ricardo et al., Science, vol. 321, Aug. 15, 2008, pp. 936-939.
Ryu, Du Yeol, et al., Macromolecules, vol. 40, No. 12, 2007, pp. 4296-4300.
Saraf, Ravi R., et al., Applied Physics Letters, vol. 80, No. 23, Jun. 10, 2002, pp. 4425-4427.
Sawhney, Amarpreet S., et al., Macromolecules 1993, 26, 581-587, Abstract only.
Segalman, Rachel A., Materials Science and Engineering R 48 (2005), pp. 191-226.
Shahrjerdi, Davood, et al., IEEE Electron Device Letters, vol. 28, No. 9, Sep. 2007, pp. 793-796.
Sharma, Sadhana, et al., Applied Surface Science, 206 [2003], pp. 218-229.
Sivaniah, E., et al., Macromolecules 2003, 36, pp. 5894-5896.
Sivaniah, et al., Macromolecules 2005, 38, 1837-1849.
Solak, Harun H., Journal of Physics D: Applied Physics, 2006, pp. R171-188.
Srinvivasan, Charan, et al., ACS Nano, vol. 1, No. 3, pp. 191-201, 2007.
Stoykovich, Mark P., et al., Science, vol. 308, Jun. 3, 2005, pp. 1442-1446.
Stoykovich, Mark P., et al., ACS Nano, vol. 1, No. 3, 2007, pp. 168-175.
Sundrani, Deepak, et al., Nano Lett., vol. 4, No. 2, 2004, pp. 273-276.
Sundrani, Deepak, et al., Langmuir 2004, vol. 20, No. 12, 2004, pp. 5091-5099.
Sigma-Aldrich, Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.
Van Poll, Maaike L., et al., Angew. Chem. Int. Ed. 2007, 46, pp. 6634-6637.
Wang, C., et al., Electrochimica Acta 52 (2006), pp. 704-709.
Wathier, Michel, et al., J. Am. Chem. Soc., 2004, 126 (40), pp. 12744-12745, Abstract only.
Winesett, D.A., et al., Langmuir 2003, 19, pp. 8526-8535.
Xiao, Shuaigang et al., Nanotechnology 16 (2005) S324-S329.
Xu, Ting et al., Polymer 42, [2001] 9091-9095.
Wu, C.Y., et al., IEEE, 2007, pp. 153-154.
Yamaguchi, Toru, et al., Journal of Photopolymer Science and Technology, vol. 19, No. 3, 2006, pp. 385-388.
Yan, Xiaohu, et al., J. Am. Chem. Soc., vol. 126, No. 32, 2004, pp. 10059-10066.
Yang, Xiao M., et al., Macromolecules 2000, vol. 33, No. 26, 2000, pp. 9575-9582.
Yang, XiaoMin, et al., J. Vac. Sci. Technol. B 22[6], Nov./Dec. 2004, 3331-3334.
Yurt, Serkan, et al., Macromolecules 2006, vol. 39, No. 5, 2006.
Zhang, Mingfu, et al., Adv. Mater. 2007, 19, pp. 1571-1576.
Berry et al., Nano Letters vol. 7, No. 9, Aug. 2007, p. 2789-2794.
Fukunaga et al., Macromolecules vol. 39, Aug. 2006, p. 6171-6179.
Hammond et al., Macromoleculars vol. 38, Jul. 2005, p. 6575-6585.
Knoll et al., "Phase Behavior in Thin Films of Cylinder-Forming Block Copolymers", Physical Review Letters, vol. 89, No. 3, Jul. 2002.
Zehner, et al., Langmuir, vol. 14, No. 2, pp. 241-244, Jan. 20, 1998.
Cha, Jennifer N., et al., Chem. Mater. 2007, 19, 839-843.
Chang, Li-Wen, Proc. Of SPIE, vol. 6156, 2006, 615611-1 to 615611-6.
Chang, Li-Wen, IEEE International Electron Devices Meeting (IEDM), paper 33.2, Dec. 6-8, San Francisco, 2010, pp. 33.2.1-33.2.4.
Ikeda, Susumu et al., NanotechJapan Bulletin—vol. 3, No. 3, Dec. 17, 2010/Focus 26-06.
Ji, Shengxiang et al., ACS Nano, vol. 4, No. 2, 2010, pp. 599-609.
Park, Seung Hak, et al., Soft Matter, 2010, 6, 2010, 120-125.
Wipf, "Handbook of Reagents for Organic Synthesis", 2005, John Wiley & Sons Ltd., p. 320.
Yamaguchi, Toru, et al., Microprocesses and Nanotechnology, 2007, Conference date Nov. 5-8, 2007, pp. 434-435.
Zhang, Yuan et al., Applied Physics Letter, 91, 013104, 2007, pp. 013104 to 013104-3.
Chandekar, A., et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).

(56) References Cited

OTHER PUBLICATIONS

Hawker, C. J., et al., Abstract for "Improving the Manufacturability and Structural Control of Block Copolymer Lithography," Abstracts of Papers, 232nd ACS National Meeting, San Francisco, CA, Sep. 10-14, 2006.
Helmbold, A., et al., "Optical Absorption of Amorphous Hydrogenated Carbon Thin Films," Thin Solid Films 283 (1996) pp. 196-203.
Lutolf, M., et al., "Cell-Responsive Synthetic Hydrogels," Adv. Mater., vol. 15, No. 11, Jun. 2003, pp. 888-892.
Nguyen, K. T., et al., "Photopolymerizable Hydrogels for Tissue Engineering Applications," Biomaterials 23, 2002, pp. 4307-4314.
Truskett, V. M., et. al., "Trends in Imprint Lithography for Biological Applications," TRENDS in Biotechnology, vol. 24, No. 7, Jul. 2006, pp. 312-315.
Zhu, X. Y., et al., "Molecular Assemblies on Silicon Surfaces via Si-O Linkages," Langmuir, vol. 16, 2000, American Chemical Society, pp. 6766-6772. [Published on Web Jul. 29, 2000].
Search Report of Taiwanese Patent Application No. 097121922, dated Oct. 16, 2011, 1 page.
Search Report of Taiwanese Patent Application No. 098108789, dated Dec. 18, 2012, 1 page.
Search Report of Taiwanese Patent Application No. 098109253, dated Aug. 22, 2012, 1 page.
Search Report of Taiwanese Patent Application No. 097110156, dated Mar. 22, 2012, 1 page.
Yu et al., Contact Printing Beyond Surface Roughness: Liquid Supramolecular Nanostamping, Advanced Materials, vol. 19, 2007, pp. 4338-4342.
Zaumseil et al., "Three-Dimensional and Multilayer Nanostructures Formed by Nanotransfer Printing," Nano Letters, 2003, vol. 3, No. 9, pp. 1223-1227.
Zhang et al., "Self-Assembled Monolayers of Terminal Alkynes on Gold," J. Am. Chem. Soc., vol. 129, No. 16, pp. 4876-4877, 2007.
Zhao et al, Colloidal Subwavelength Nanostructures for Antireflection Optical Coatings, Optics Letters, vol. 30, No. 14, pp. 1885-1887 (2005).
Zhou et al., Nanoscale Metal/Self-Assembled Monolayer/Metal Heterostructures, Appl. Phys. Lett., vol. 71, No. 5, 4 Aug. 1997, pp. 611-613.
Zhu, X.Y., et al., "Grafting of High-Density Poly(Ethylene Glycol) Monolayers on Si(111)," Langmuir, vol. 17, pp. 7798-7803, 2001.
Asakawa et al., Fabrication of Subwavelength Structure for Improvement in Light-Extraction Efficiency of Light-Emitting Devices Using a Self-Assembled Pattern of Block Copolymer, Applied Optics, vol. 44, No. 34, Dec. 1, 2005, pp. 7475-7482.
Black et al., Integration of Self-Assembled Diblock Copolymers for Semiconductor Capacitor Fabrication, Applied Physics Letters, vol. 79, No. 3, pp. 409-411 (2001).
Chai et al, Assembly of Aligned Linear Metallic Patterns on Silicon, Nature Nanotechnology, vol. 2, Aug. 2007, pp. 500-506.
Chai et al, Using Cylindrical Domains of Block Copolymers to Self-Assemble and Align Metallic Nanowires, American Chemical Society, www.acsnano.org, 2008. pp. A-M.
Chen et al., Highly Ordered Arrays of Mesoporous Silica Nanorods with Tunable Aspect Ratios from Block Copolymer Thin Films, Advanced Materials, vol. 20, 2008, pp. 763-767.
Cho et al., Nanoporous Block Copolymer Micelle/Micelle Multilayer Films with Dual Optical Properties, J. Am. Chem. Soc., vol. 128, No. 30, 2006, pp. 9935-9942.
Clark et al., Selective Deposition in Multilayer Assembly: SAMs as Molecular Templates, Supramolecular Science, vol. 4, 1997, pp. 141-146.
Erlandsson et al., Metallic Zinc Reduction of Disulfide Bonds Between Cysteine Residues in Peptides and Proteins, Int'l J. Peptide Res. & Therapeutics, vol. 11, No. 4, Dec. 2005, pp. 261-265.
Fasolka et al., Block Copolymer Thin Films: Physics and Applications, Annual Reviews Materials Res., vol. 31, Aug. 2001, pp. 323-355.
Gates, "Nanofabrication with Molds and Stamps," Materials Today, pp. 44-49, (Feb. 2005).

Grubbs, Hybrid Metal-Polymer Composites from Functional Block Copolymers, Journal of Polymer Science: Part A: Polymer Chemistry, vol. 43, pp. 4323-4336 (2005).
Guarini et al., Nanoscale Patterning Using Self-Assembled Polymers for Semiconductor Applications, J. Vac. Sci. Technol. B 19(6), pp. 2784-2788, Nov./Dec. (2001).
Hadziioannou, Semiconducting Block Copolymers for Self-Assembled Photovoltaic Devices, MRS Bulletin, pp. 456-460 (2002).
Hamers, Robert J., "Passivation and activation: How do monovalent atoms modify the reactivity of silicon surfaces? A perspective on the article, 'The mechanism of amine formation on Si(100) activated with chlorine atoms,'" Surface Science, vol. 600, pp. 3361-3362, 2006.
Hayward et al., Crosslinked Poly(styrene)-block-Poly(2-vinylpyridine) Thin Films as Swellable Templates for Mesostructured Silica and Titania, Advanced Materials, vol. 17, 2005, pp. 2591-2595.
Helmuth, Jo A., et al., "High-Speed Microcontact Printing," J. Am. Chem. Soc., vol. 128, No. 29, pp. 9296-9297, 2006.
Horiuchi et al., Three-Dimensional Nanoscale Alignment of Metal Nanoparticles Using Block Copolymer Films as Nanoreactors, Langmuir, vol. 19, pp. 2963-2973 (2003).
Huang et al., "Stretchable gold conductors on elastomeric substrates," Applied Physics Letters, vol. 82, No. 15, Apr. 14, 2003, pp. 2404-2406.
Huang et al., "Using Surface Active Random Copolymers to Control the Domain Orientation in Diblock Copolymer Thin Films," Macromolecules, 1998, 31, 7641-7650.
Hur et al., "Nanotransfer printing by use of noncovalent surface forces: Applications to thin-film transistors that use single-walled carbon nanotube networks and semiconducting polymers," Applied Physics Letters, vol. 85, No. 23, Dec. 6, 2004, pp. 5730-5732.
Jiang, Xingyu, et al., "Electrochemical Desorption of Self-Assembled Monolayers Noninvasively Releases Patterned Cells from Geometrical Confinements," J. Am. Chem. Soc., vol. 125, No. 9, pp. 2366-2367, 2003.
Johnson, Daniel L., et al., "Probing the stability of the disulfide radical intermediate of thioredoxin using direct electrochemistry," Letters in Peptide Science, vol. 10, pp. 495-500, 2003.
Jun, Yongseok, et al., "Patterning protein molecules on poly(ethylene glycol) coated Si(111)," Biomaterials, vol. 25, pp. 3503-3509, 2004.
Kavakli et al., Single and Double-Layer Antireflection Coatings on Silicon, Turk J Phys, vol. 26, pp. 349-354 (2002).
Krishnamoorthy et al., Block Copolymer Micelles as Switchable Templates for Nanofabrication, Languir, vol. 22, No. 8, Mar. 17, 2006, pp. 3450-3452.
Krishnamoorthy et al., Nanopatterned Self-Assembled Monolayers by Using Diblock Copolymer Micelles as Nanometer-Scale Adsorption and Etch Masks, Advanced Materials, 2008, pp. 1-4.
Kuhnline et al., "Detecting thiols in a microchip device using micromolded carbon ink electrodes modified with cobalt phthalocyanine", Analyst, vol. 131, pp. 202-207, (2006).
Li, Yong, et al., "A Method for Patterning Multiple Types of Cells by Using Electrochemical Desorption of Self-Assembled Monolayers within Microfluidic Channels," Angew. Chem. Int. Ed., vol. 46, pp. 1094-1096, 2007.
Liu et al., Pattern Transfer Using Poly(styrene-block-methyl methacrylate) Copolymer Films and Reactive Ion Etching, J. Vac. Sci. Technol. B vol. 25, No. 6, Nov/Dec 2007, pp. 1963-1968.
Loo et al., "Additive, nanoscale patterning of metal films with a stamp and a surface chemistry mediated transfer process: Applications in plastic electronics," Applied Physics Letters, vol. 81, No. 3, 15 Jul. 2002, pp. 562-564.
Lopes et al., Hierarchical Self-Assembly of Metal Nanostructures on Diblock Copolymer Scaffolds, Nature, vol. 414, Dec. 13, 2001, pp. 735-738.
Lutz, Jean-Francois, "1,3-Dipolar Cycloadditions of Azides and Alkynes: A Universal Ligation Tool in Polymer and Materials Science," Angew. Chem. Int. Ed., vol. 46, pp. 1018-1025, 2007.
Malenfant et al., Self-Assembly of an Organic-Inorganic Block Copolymer for Nano-Ordered Ceramics, Nature Nanotechnology, vol. 2, pp. 43-46 (2007).

(56) References Cited

OTHER PUBLICATIONS

Niu, Sanjun, et al., "Stability of Order in Solvent-Annealed Block Copolymer Thin Films," Macromolecules, vol. 36, No. 7, 2003, Univ. of Nebraska, USA, pp. 2428-2440, (web release date: Mar. 13, 2003) (http:lldigitalcommons.uni. edu/cgi/viewcontent.cgi?article+1005 &contect=chemeng_nanotechnology).

Park et al., Fabrication of Highly Ordered Silicon Oxide Dots and Stripes from Block Copolymer Thin Films, Advanced Materials, vol. 20, pp. 681-685, 2008.

Park et al., High-Aspect-Ratio Cylindrical Nanopore Arrays and Their Use for Templating Titania Nanoposts, Advanced Materials, vol. 20, pp. 738-742, 2008.

Reed, M.A., et al., "Molecular random access memory cell," Appl. Phys. Lett., vol. 78, No. 23, pp. 3735-3737, Jun. 2001.

Sang et al., "Epitaxial self-assembly of block copolymers on lithographically defined nanopatterned substrates", Nature, vol. 24, pp. 411-414, (Jul. 2003).

Sato et al., Novel Antireflective Layer Using Polysilane for Deep Ultraviolet Lithography, J. Vac. Sci. Technol. B, vol. 17, No. 6, pp. 3398-3401 (1999).

Sohn et al., Fabrication of the Multilayered Nanostructure of Alternating Polymers and Gold Nanoparticles with Thin Films of Self-Assembling Diblock Copolymers, Chem, Mater, vol. 13, pp. 1752-1757 (2001).

Tadd et al., Spatial Distribution of Cobalt Nanoclusters in Block Copolymers, Langmuir, vol. 18, pp. 2378-2384 (2002).

Tang et al., Evolution of Block Copolymer Lithography to Highly Ordered Square Arrays, Science, vol. 322, No. 5900, Sep. 25, 2008, pp. 429-432.

Trimbach et al., Block Copolymer Thermoplastic Elastomers for Microcontact Printing, Langmuir, vol. 19, 2003, pp. 10957-10961.

Tseng et al., Enhanced Block Copolymer Lithography Using Sequential Infiltration Synthesis, J. of Physical Chemistry, Jul. 11, 2011, 16 pgs.

Xia et al., An Approach to Lithographically Defined Self-Assembled Nanoparticle Films, Advanced Materials, vol. 18, pp. 930-933 (2006).

Xia, Younan, et al., "Soft Lithography," Annu. Rev. Mater. Sci., vol. 28, pp. 153-184, 1998.

Xu et al., Electric Field Alignment of Symmetric Diblock Copolymer Thin Films, Department of Polymer Science and Engineering, University of Massachusetts, 5 pp. (2003).

Xu et al., Interfacial Interaction Dependence of Microdomain Orientation in Diblock Copolymer Thin Films, Macromolecules, vol. 38, pp. 2802-2805 (2005).

Xu et al., Surface-Initiated Atom Transfer Radical Polymerization from Halogen-Terminated Si(111) (Si-X, X=Cl, Br) Surfaces for the Preparation of Well-Defined Polymer—Si Hybrids, Langmuir, vol. 21, No. 8, 2005, pp. 3221-3225.

Yang et al., Covalently Attached Graft Polymer Monolayer on Organic Polymeric Substrate via Confined Surface Inhibition Reaction, Journal of Polymer Science—A—Polymer Chemistry Edition, 2007, pp. 745-755, vol. 45, Issue 5.

Fujita et al., Thin Silica Film with a Network Structure as Prepared by Surface Sol-Gel Transcription on the Poly (styrene-b-4-vinylpyridine) Polymer Film, Chemistry Letters, vol. 32, No. 4, Dec. 31, 2003, pp. 352-353.

Melde et al., Silica Nanostructures Templated by Oriented Block Copolymer Thin Films Using Pore-Filling and Selective-Mineralization Routes, Chem. Mater., vol. 17, No. 18, Aug. 13, 2005, pp. 4743-4749.

Niu et al., Selective Assembly of Nanoparticles on Block Copolymer by Surface Modification, Nanotechnology, vol. 18, (2007), pp. 1-4.

\* cited by examiner

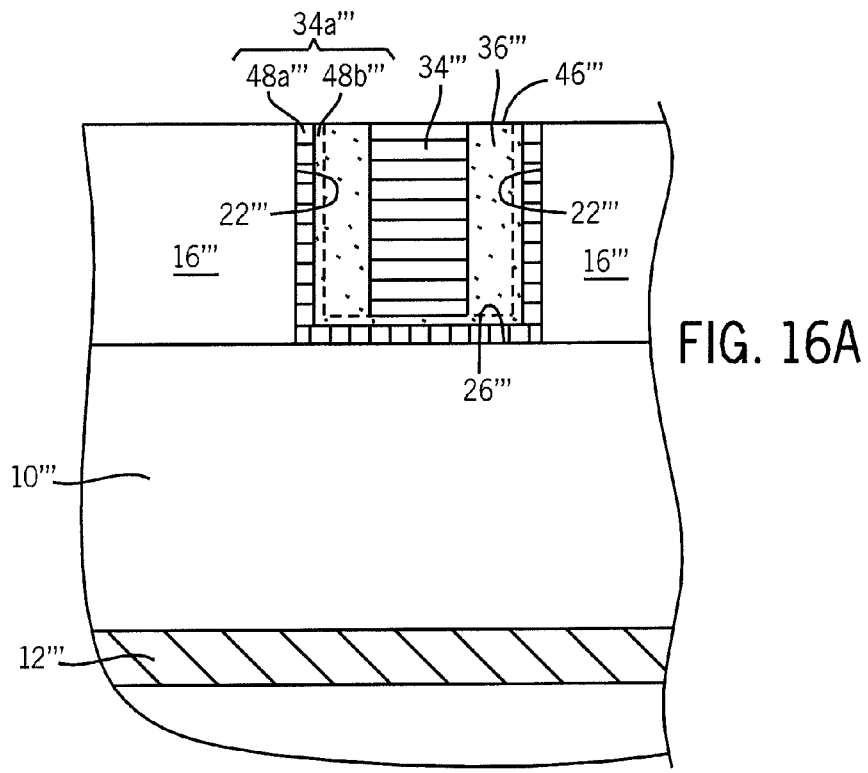

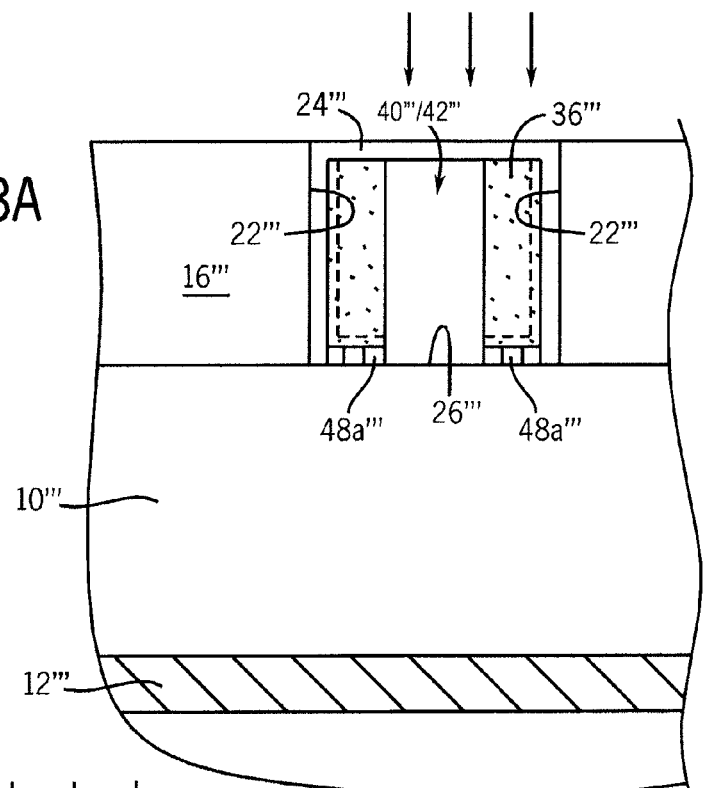
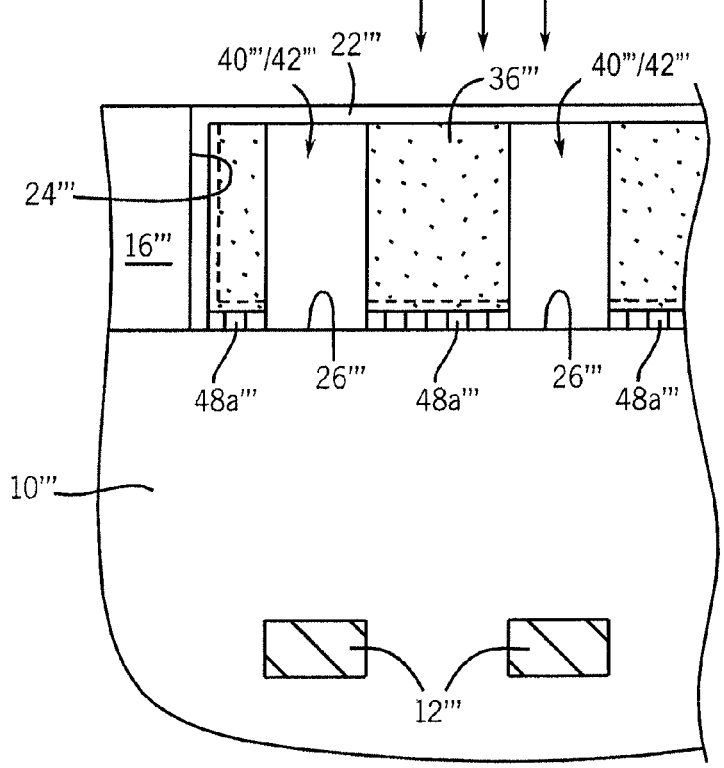

US 8,642,157 B2

ONE-DIMENSIONAL ARRAYS OF BLOCK COPOLYMER CYLINDERS AND APPLICATIONS THEREOF

CROSS REFERENCE TO RELATED APPLICATION

This application is a continuation of U.S. patent application Ser. No. 12/030,562, filed Feb. 13, 2008, now U.S. Pat. No. 8,101,261, issued Jan. 24, 2012, the disclosure of which is hereby incorporated herein by this reference in its entirety.

TECHNICAL FIELD

The invention relates to methods of fabricating thin films of self-assembling block copolymers, and devices resulting from those methods.

BACKGROUND OF THE INVENTION

As the development of nanoscale mechanical, electrical, chemical and biological devices and systems increases, new processes and materials are needed to fabricate nanoscale devices and components. Making electrical contacts to conductive lines has become a significant challenge as the dimensions of semiconductor features shrink to sizes that are not easily accessible by conventional lithography. Optical lithographic processing methods have difficulty fabricating structures and features at the sub-30 nanometer level. The use of self-assembling diblock copolymers presents another route to patterning at nanoscale dimensions. Diblock copolymer films spontaneously assemble into periodic structures by microphase separation of the constituent polymer blocks after annealing, for example, by thermal annealing above the glass transition temperature of the polymer or by solvent annealing, forming ordered domains at nanometer-scale dimensions.

The film morphology, including the size and shape of the microphase-separated domains, can be controlled by the molecular weight and volume fraction of the AB blocks of a diblock copolymer to produce lamellar, cylindrical, or spherical morphologies, among others. For example, for volume fractions at ratios greater than about 80:20 of the two blocks (AB) of a diblock polymer, a block copolymer film will microphase separate and self-assemble into periodic spherical domains with spheres of polymer B surrounded by a matrix of polymer A. For ratios of the two blocks between about 60:40 and 80:20, the diblock copolymer assembles into a periodic hexagonal close-packed or honeycomb array of cylinders of polymer B within a matrix of polymer A. For ratios between about 50:50 and 60:40, lamellar domains or alternating stripes of the blocks are formed. Domain size typically ranges from 5 nm to 50 nm.

Researchers have reported producing a 1-D (one-dimensional) array of spheres of the minority block of a block copolymer in a matrix of the majority block by templating a spherical-morphology block copolymer within a narrow groove. However, a 1-D array of spheres provides a poor etch mask structure where, even if the sphere material can be removed, there is little aspect ratio to the remaining porous film. In addition, the spheres in adjacent grooves were offset along the y-axis and not aligned. Moreover, applications for forming structures in an underlying substrate for semiconductor systems require a complex layout of elements for forming contacts, conductive lines and/or other elements such as DRAM (dynamic random access memory) capacitors.

It would be useful to provide methods of fabricating films of one-dimensional arrays of ordered nanostructures that overcome these problems.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 16A and 16B are elevational, cross-sectional views of the substrate depicted in FIG. 16 taken along lines 16A-16A and 16B-16B, respectively.

FIGS. 17A and 18A illustrate elevational, cross-sectional views of a portion of the substrate depicted in FIGS. 17 and 18 taken along lines 17A-17A and 18A-18A, respectively. FIGS. 17B and 18B are cross-sectional views of the substrate depicted in FIGS. 17 and 18 taken along lines 17B-17B and 18B-18B, respectively.

FIG. 19 illustrates a top plan view of a portion of a substrate at a preliminary processing stage showing a trench in a material layer.

FIG. 20 is a top plan view of the substrate of FIG. 19 at a subsequent stage in the fabrication of a self-assembled cylindrical-phase block copolymer material within the trench according to an embodiment of the invention. FIG. 21 is a top plan view of the substrate of FIG. 20 at a subsequent stage after removal of the cylindrical domains of the block copolymer material. FIG. 22 is a top plan view of FIG. 21 after etching of the substrate and filling of the etched openings.

DETAILED DESCRIPTION OF THE INVENTION

Figure 1:
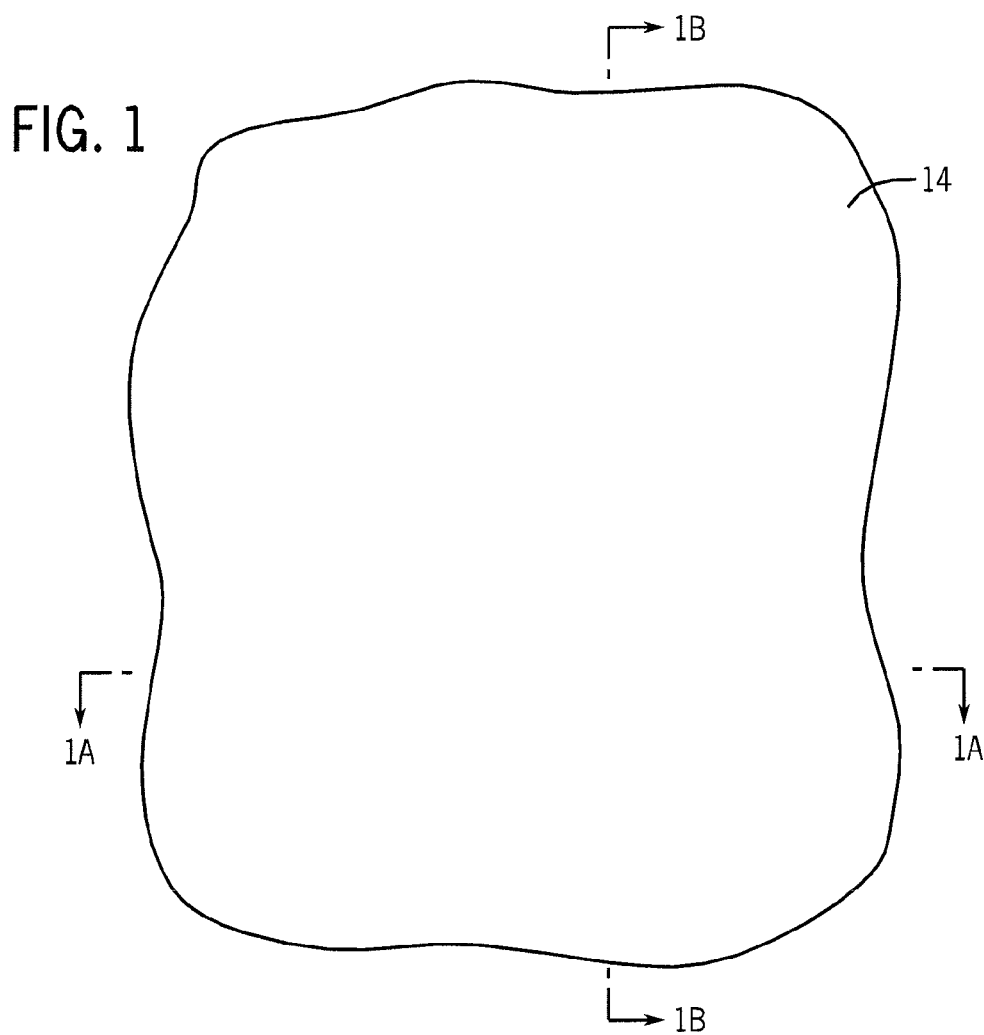
FIG. 1 illustrates a diagrammatic top plan view of a portion of a substrate at a preliminary processing stage according to an embodiment of the present disclosure, showing the substrate with a neutral wetting material thereon.

The following description with reference to the drawings provides illustrative examples of devices and methods according to embodiments of the invention. Such description is for illustrative purposes only and not for purposes of limiting the same.

In the context of the current application, the terms "semiconductor substrate," "semiconductive substrate," "semiconductive wafer fragment," "wafer fragment," or "wafer" will be understood to mean any construction comprising semiconductor material, including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

"$L_o$," as used herein, is the inherent periodicity or "pitch value" (bulk period or repeat unit) of structures that self-assemble upon annealing from a self-assembling (SA) block copolymer. "$L_B$," as used herein, is the periodicity or pitch value of a blend of a block copolymer with one or more of its constituent homopolymers. "L," is used herein, to indicate the center-to-center cylinder pitch or spacing of cylinders of the block copolymer or blend, and is equivalent to "$L_o$" for a pure block copolymer and "$L_B$" for a copolymer blend.

In embodiments of the invention, a polymer material (e.g., film, layer) is prepared by guided self-assembly of block copolymers, with both polymer domains at an air interface. Block copolymer materials spontaneously assemble into periodic structures by microphase separation of the constituent polymer blocks after annealing, forming ordered domains at nanometer-scale dimensions. In embodiments of the invention, a one-dimensional (1-D) array of perpendicularly-oriented cylinders is formed within a trench. In other embodiments, two rows of cylinders can be formed in each trench. Following self-assembly, the pattern of perpendicularly-oriented cylinders that is formed on the substrate can then be used, for example, as an etch mask for patterning nano-sized features into the underlying substrate through selective removal of one block of the self-assembled block copolymer. Since the domain sizes and periods (L) involved in this method are determined by the chain length of a block copolymer (molecular weight, MW), resolution can exceed other techniques such as conventional photolithography. Processing costs using this technique are significantly less than extreme ultraviolet (EUV) photolithography, which has comparable resolution.

A method for fabricating a self-assembled block copolymer material that defines a one-dimensional (1-D) array of nanometer-scale, perpendicularly-oriented cylinders according to an embodiment of the invention is illustrated in FIGS. 1-6.

The described embodiment involves a thermal anneal of a cylindrical-phase block copolymer in combination with a graphoepitaxy technique that utilizes a lithographically defined trench as a guide with a floor composed of a material that is neutral wetting to both polymer blocks, and sidewalls and ends that are preferential wetting to one polymer block and function as constraints to induce the block copolymer to self-assemble into an ordered 1-D array of a single row of cylinders in a polymer matrix oriented perpendicular to the trench floor and registered to the trench sidewalls. In some embodiments, two rows of cylinders can be formed in each trench.

The block copolymer or blend is constructed such that all of the polymer blocks will have equal preference for the air interface during the anneal. For a thermal anneal, such diblock copolymers include, for example, poly(styrene)-b-poly(methylmethacrylate) (PS-b-PMMA) or other PS-b-poly (acrylate) or PS-b-poly(methacrylate), poly(styrene)-b-poly (lactide) (PS-b-PLA), and poly(styrene)-b-poly(tert-butyl acrylate) (PS-b-PtBA), among others. Although PS-b-PMMA diblock copolymers are used in the illustrated embodiments, other types of block copolymers (i.e., triblock or multiblock copolymers) can be used. Examples of triblock copolymers include ABC copolymers, and ABA copolymers (e.g., PS-PMMA-PS and PMMA-PS-PMMA).

The L value of the block copolymer can be modified, for example, by adjusting the molecular weight of the block copolymer. The block copolymer material can also be formulated as a binary or ternary blend comprising a block copolymer and one or more homopolymers (HPs) of the same type of polymers as the polymer blocks in the block copolymer, to produce a blend that will swell the size of the polymer domains and increase the L value. The volume fraction of the homopolymers can range from 0% to about 60%. An example of a ternary diblock copolymer blend is a PS-b-PMMA/PS/PMMA blend, for example, 60% of 46K/21K PS-b-PMMA, 20% of 20K polystyrene and 20% of 20K poly(methyl methacrylate). A blend of PS-PEO and about 0% to 40% PEO homopolymer (HP) can also be used to produce perpendicular cylinders during a thermal anneal; it is believed that the added PEO homopolymer may function, at least in part, to lower the surface energy of the PEO domains to that of PS.

The film morphology, including the domain sizes and periods ($L_o$) of the microphase-separated domains, can be controlled by chain length of a block copolymer (molecular weight, MW) and volume fraction of the AB blocks of a diblock copolymer to produce cylindrical morphologies (among others). For example, for volume fractions at ratios of the two blocks generally between about 60:40 and 80:20, the diblock copolymer will microphase separate and self-assemble into periodic cylindrical domains of polymer B within a matrix of polymer A. An example of a cylinder-forming PS-b-PMMA copolymer material ($L_o$~35 nm) to form about 20 nm diameter cylindrical PMMA domains in a matrix of PS is composed of about 70% PS and 30% PMMA with a total molecular weight ($M_n$) of 67 kg/mol.

Figure 1A:
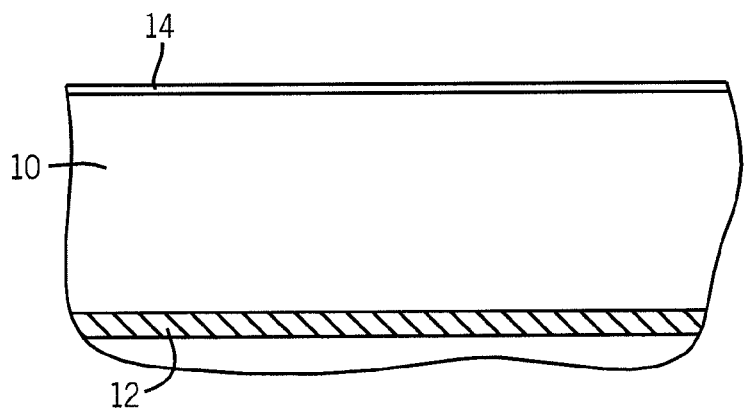
FIGS. 1A and 1B are elevational, cross-sectional views of the substrate depicted in FIG. 1 taken along lines 1A-1A and 1B-1B, respectively.
Figure 1B:
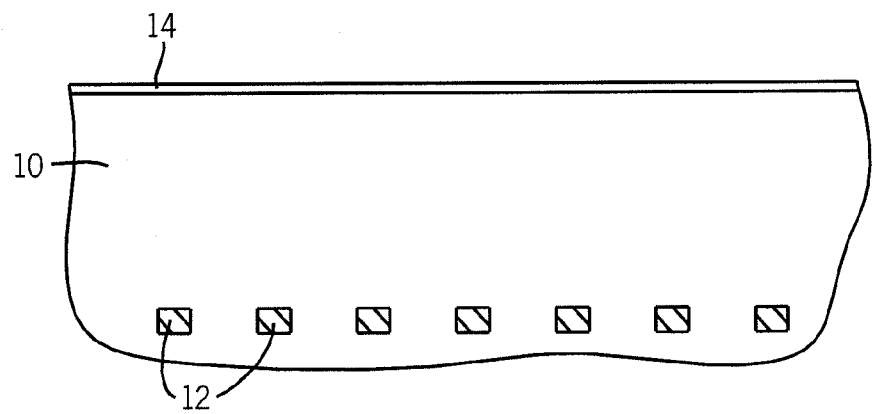

As depicted in FIGS. 1, 1A and 1B, a substrate 10 is provided, which can be silicon, silicon oxide, silicon nitride, silicon oxynitride, and silicon oxycarbide, among other materials. As further depicted, conductive lines 12 (or other active areas, e.g., semiconducting regions) are situated within the substrate 10.

In any of the described embodiments, a single trench or multiple trenches can be formed in the substrate, and can span the entire width of an array of lines (or other active areas). In embodiments of the invention, the substrate 10 is provided with an array of conductive lines 12 (or other active areas) at a pitch of L. The trench or trenches are formed over the active areas (e.g., conductive lines 12) such that when the block copolymer material is annealed, each cylinder will be situated above a single active area (e.g., conductive line 12). In some embodiments, multiple trenches 18 are formed with the ends 24 of each adjacent trench 18 aligned or slightly offset from each other at less than 5% of L such that cylinders in adjacent trenches 18 are aligned and situated above the same conductive line 12.

Figure 2:
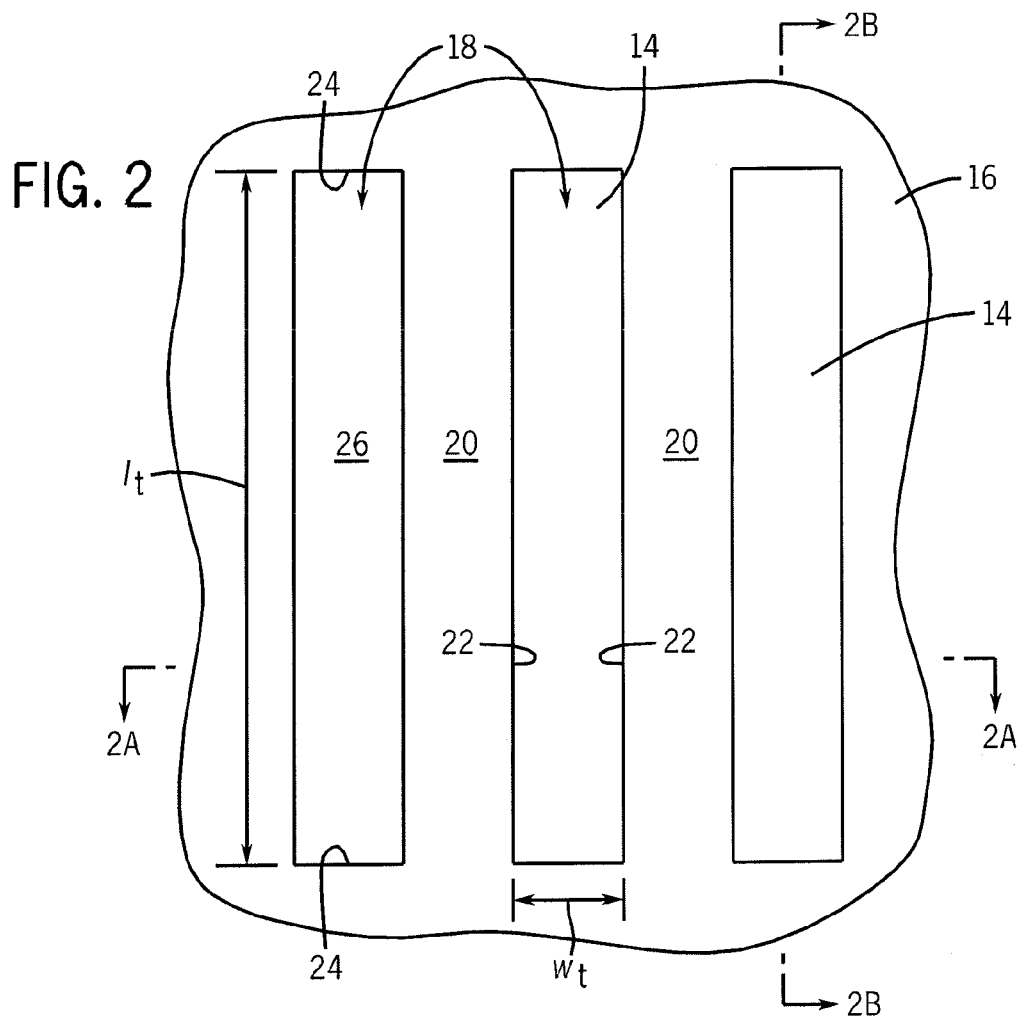
FIG. 2 illustrates a diagrammatic top plan view of the substrate of FIG. 1 at a subsequent stage showing formation of trenches in a material layer formed on the neutral wetting material.
Figure 2A:
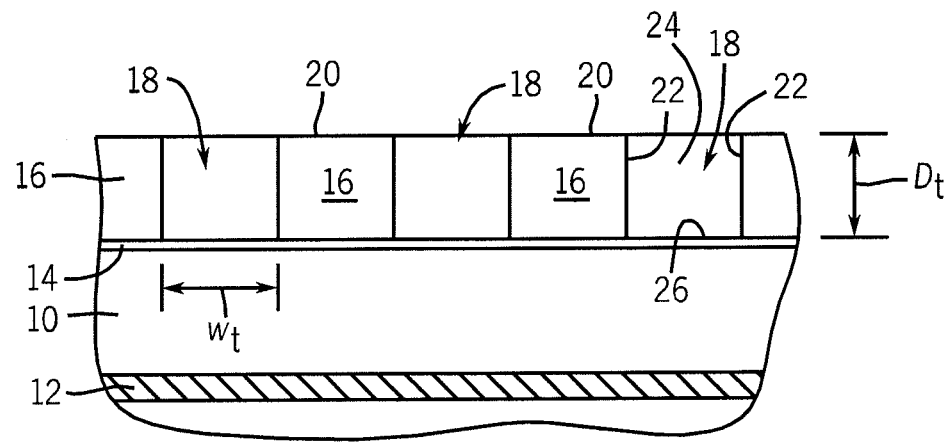
FIGS. 2A and 2B illustrate elevational, cross-sectional views of a portion of the substrate depicted in FIG. 2 taken, respectively, along lines 2A-2A and 2B-2B.
Figure 2B:
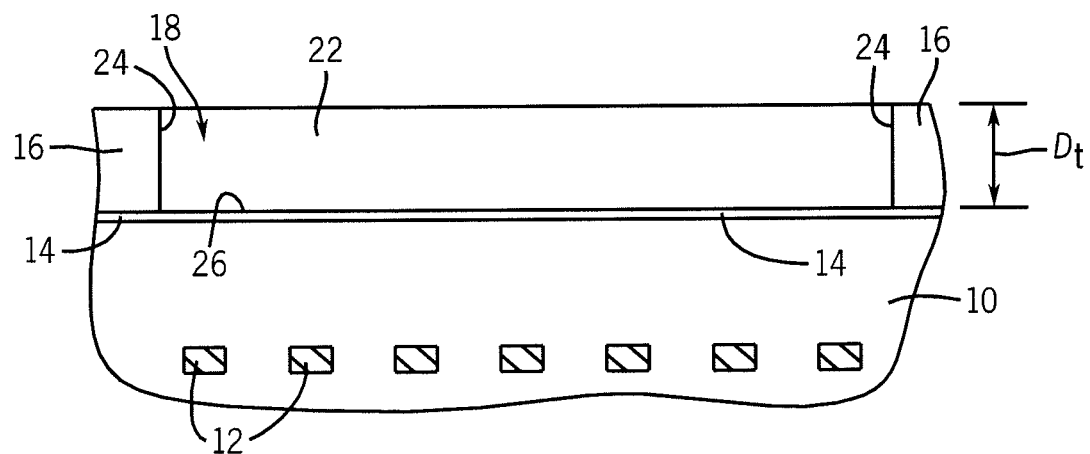

In the illustrated embodiment, a neutral wetting material 14 (e.g., random copolymer) has been formed over the substrate 10. A material layer 16 (or one or more material layers) can then be formed over the neutral wetting material 14 and etched to faun trenches 18 that are oriented perpendicular to the array of conductive lines 12, as shown in FIGS. 2, 2A and 2B. Portions of the material layer 16 form a spacer 20 outside and between the trenches 18. The trenches 18 are structured with opposing sidewalls 22, opposing ends 24, a floor 26, a width ($w_t$), a length ($l_t$) and a depth ($D_t$).

Figure 3:
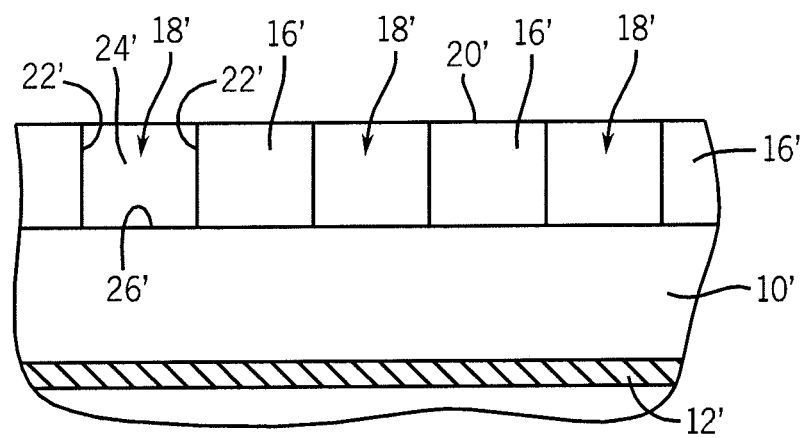
FIG. 3 illustrates a side elevational view of a portion of a substrate at a preliminary processing stage according to another embodiment of the disclosure, showing the substrate with trenches in a material layer formed on the substrate.
Figure 4:
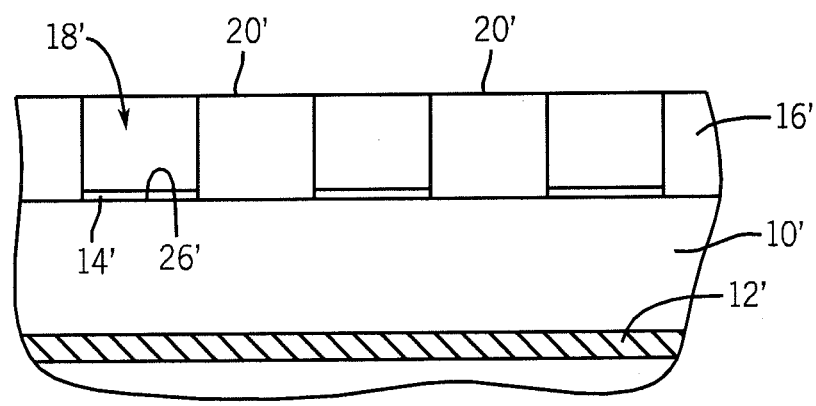
FIG. 4 illustrates a side elevational view of the substrate of FIG. 3 at a subsequent stage showing the formation of a neutral wetting material within the trenches.

In another embodiment illustrated in FIGS. 3 and 4, the material layer 16' can be formed on the substrate 10', etched to form the trenches 18', and a neutral wetting material 14' can then be formed on the floors 26' of trenches 18'. For example, a random copolymer material can be deposited into the trenches 18' and cross-linked to form a neutral wetting material 14' layer. Material on surfaces outside the trenches 18' such as on the spacers 20' (e.g., non-cross-linked random copolymer) can be subsequently removed.

Single or multiple trenches 18 (as shown) can be formed using a lithographic tool having an exposure system capable of patterning at the scale of L (10 nm to 100 nm). Such exposure systems include, for example, extreme ultraviolet (EUV) lithography, proximity X-rays and electron beam (e-beam) lithography, as known and used in the art. Conventional photolithography can attain (at smallest) about 58 nm features.

A method called "pitch doubling" or "pitch multiplication" can also be used for extending the capabilities of photolithographic techniques beyond their minimum pitch, as described, for example, in U.S. Pat. No. 5,328,810 (Lowrey et al.), U.S. Pat. No. 7,115,525 (Abatchev et al.), US 2006/0281266 (Wells) and US 2007/0023805 (Wells). Briefly, a pattern of lines is photolithographically formed in a photoresist material overlying a layer of an expendable material, which in turn overlies a substrate, the expendable material layer is etched to form placeholders or mandrels, the photoresist is stripped, spacers are formed on the sides of the mandrels, and the mandrels are then removed leaving behind the spacers as a mask for patterning the substrate. Thus, where the initial photolithography formed a pattern defining one feature and one space, the same width now defines two features and two spaces, with the spaces defined by the spacers. As a result, the smallest feature size possible with a photolithographic technique is effectively decreased down to about 30 nm or less.

Factors in forming a single (1-D) array or layer of perpendicularly-oriented nano-cylinders within the trenches include the width ($w_t$) and depth ($D_t$) of the trench, the formulation of the block copolymer or blend to achieve the desired pitch (L), and the thickness (t) of the block copolymer material.

For example, a block copolymer or blend having a pitch or L value of 35-nm deposited into a 75-nm wide trench having a neutral wetting floor will, upon annealing, result in a zig-zig pattern of 35-nm diameter perpendicular cylinders that are offset by about one-half the pitch distance, or about 0.5*L) for the length ($l_t$) of the trench, rather than a single line row of perpendicular cylinders aligned with the sidewalls down the center of the trench. There is a shift from two rows to one row of the perpendicular cylinders within the center of the trench as the width ($w_t$) of the trench is decreased and/or the periodicity (L value) of the block copolymer is increased, for example, by forming a ternary blend by the addition of both constituent homopolymers. The boundary conditions of the sidewalls 22' of the trench 18' in both the x- and y-axis impose a structure wherein each trench contains "n" number of features (e.g., cylinders).

In some embodiments, the trenches 18 are constructed with a width ($w_t$) of about L to about 1.5*L (or 1.5× the pitch value) of the block copolymer such that a cast block copolymer material (or blend) of about L will self-assemble upon annealing into a single row of perpendicular cylinders with a center-to-center pitch distance of adjacent cylinders at or about L. For example, in using a cylindrical phase block copolymer with an about 50 nm pitch value or L, the width ($w_t$) of the trenches 18 can be about 1-1.5*50 nm or about 50-80 nm. The length ($l_t$) of the trenches is at or about nL or an integer multiple of L, typically within a range of about n*10 to about n*100 nm (with n being the number of features or structures, e.g., cylinders). The depth ($D_t$) of the trenches 18 is greater than L ($D_t$>L). The width of the spacers 20 between adjacent trenches can vary and is generally about L to about nL. In some embodiments, the trench dimension is about 20-100 nm wide ($w_t$) and about 100-25,000 nm in length ($l_t$), with a depth ($D_t$) of about 10-100 nm.

Figure 5:
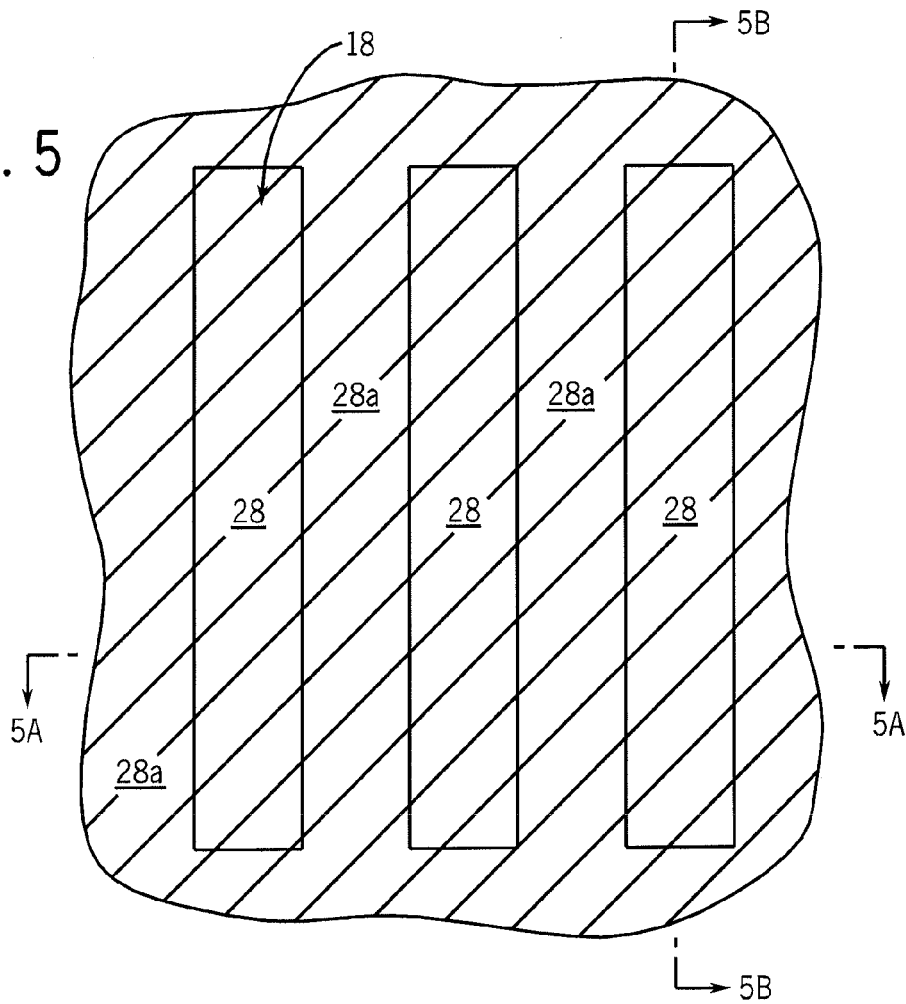
FIGS. 5 and 6 are diagrammatic top plan views of the substrate of FIG. 2 at subsequent stages in the fabrication of a self-assembled block copolymer film composed of a single row of perpendicularly-oriented cylinders in a polymer matrix within the trenches according to an embodiment of the disclosure.
Figure 5A:
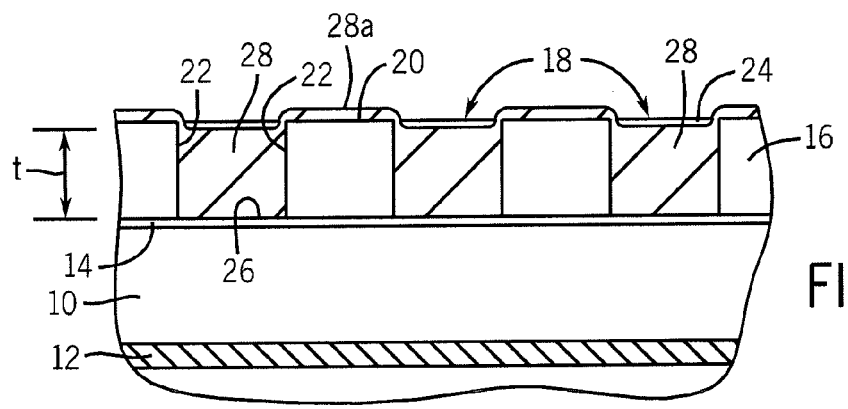
FIGS. 5A and 6A illustrate elevational, cross-sectional views of a portion of the substrate depicted in FIGS. 5 and 6 taken along lines 5A-5A and 6A-6A, respectively.
Figure 5B:
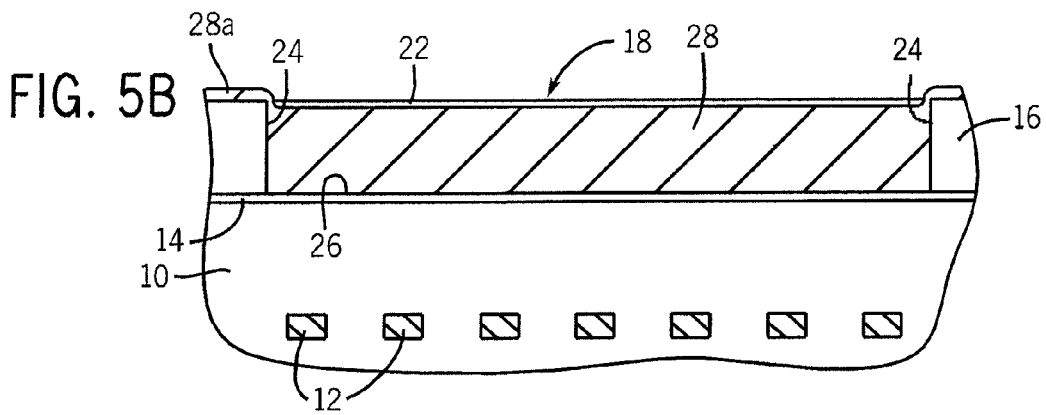
FIGS. 5B and 6B are cross-sectional views of the substrate depicted in FIGS. 5 and 6 taken along lines 5B-5B and 6B-6B, respectively.

Referring now to FIGS. 5, 5A and 5B, a self-assembling, cylindrical-phase block copolymer material 28 having an inherent pitch at or about $L_o$ (or a ternary blend of block copolymers and homopolymers blended to have a pitch at or about $L_B$) is deposited into the trenches 18 such that the thickness (t) on the trench 18 of the deposited block copolymer material 28 is generally at or about L after annealing and the block copolymer material 28 will self-assemble to form a single layer of cylinders across the width ($w_t$) of the trench 18. For example, a typical thickness (t) of a cylindrical-phase PS-b-PMMA block copolymer material 28 within the trench 18 is about ±20% of the L value of the block copolymer material 28 (e.g., about 10-100 nm) to form cylinders having a diameter of about 0.5*L (e.g., 5 nm to 50 nm or about 20 nm, for example) within a polymer matrix in a single row within each trench 18. The thickness of the block copolymer material 28 can be measured, for example, by ellipsometry techniques.

The block copolymer material 28 can be deposited by spin-casting (spin-coating) from a dilute solution (e.g., about 0.25-2 wt % solution) of the copolymer in an organic solvent such as dichloroethane ($CH_2Cl_2$) or toluene, for example. Capillary forces pull excess block copolymer material 28 (e.g., greater than a monolayer) into the trenches 18. As shown in FIG. 5A, a thin layer or film 28a of the block copolymer material 28 can be deposited onto the material layer 16 outside the trenches 18, e.g., on the spacers 20. Upon annealing, the thin layer or film 28a will flow into the trenches 18 leaving a structureless brush layer on the material layer 16 from a top-down perspective.

Figure 6:
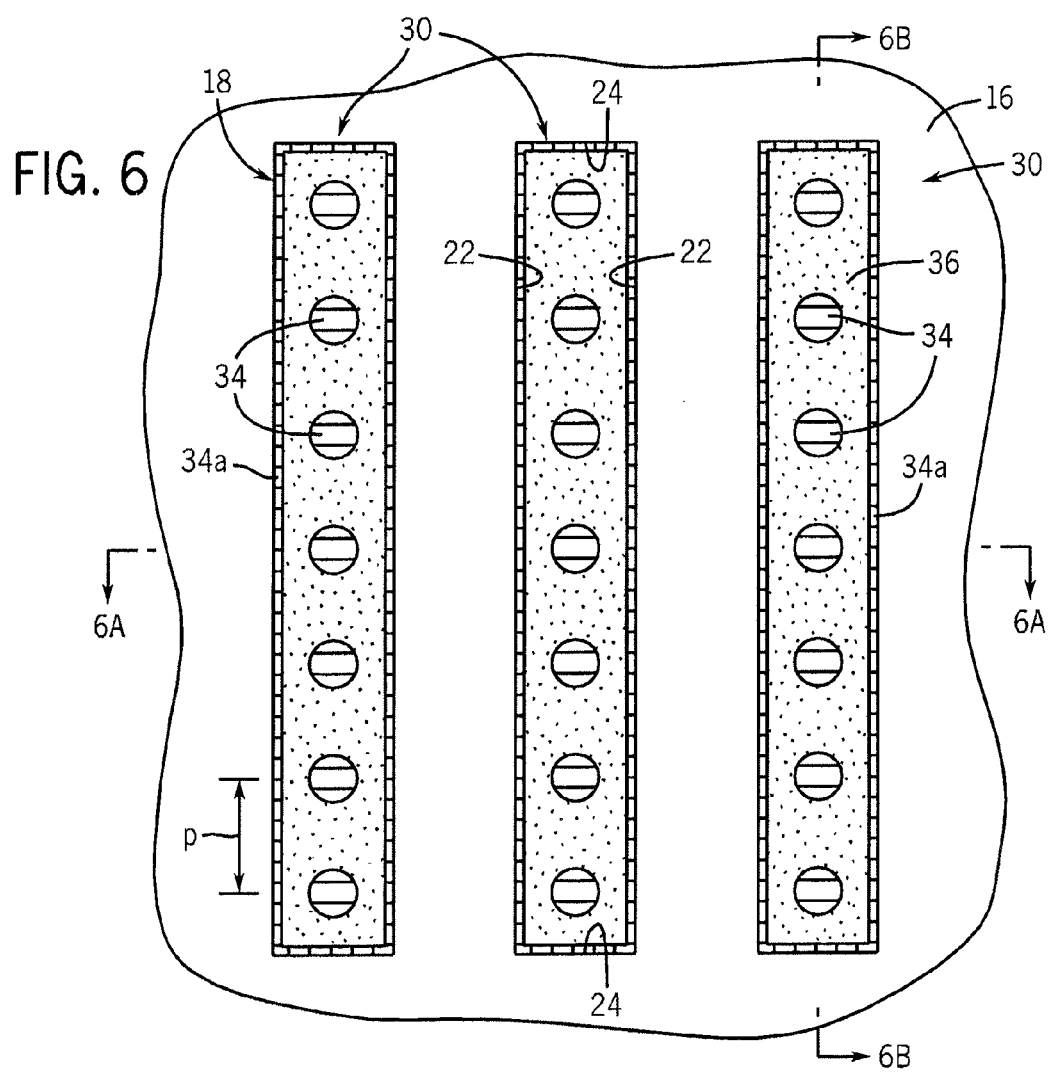
Figure 6A:
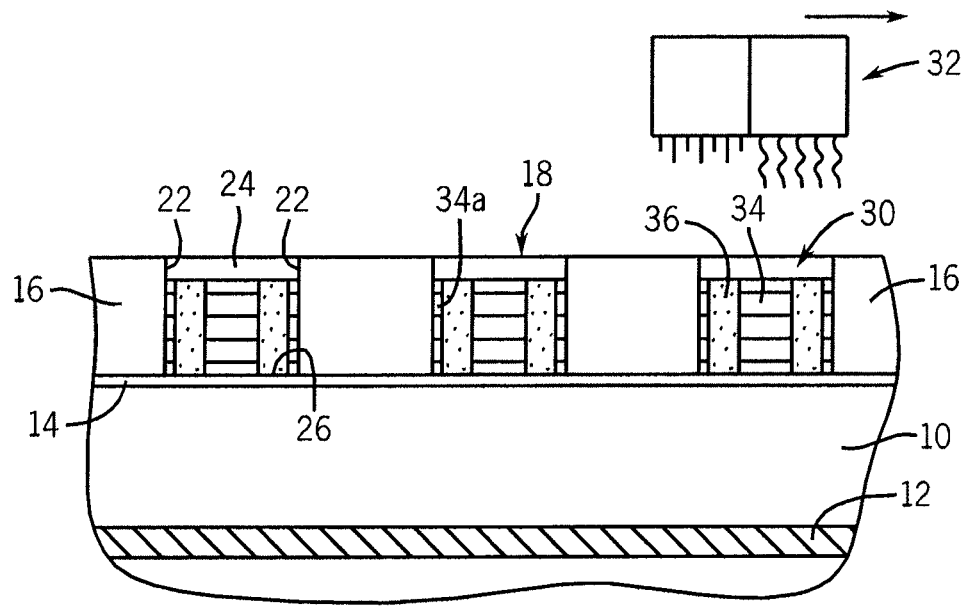
Figure 6B:
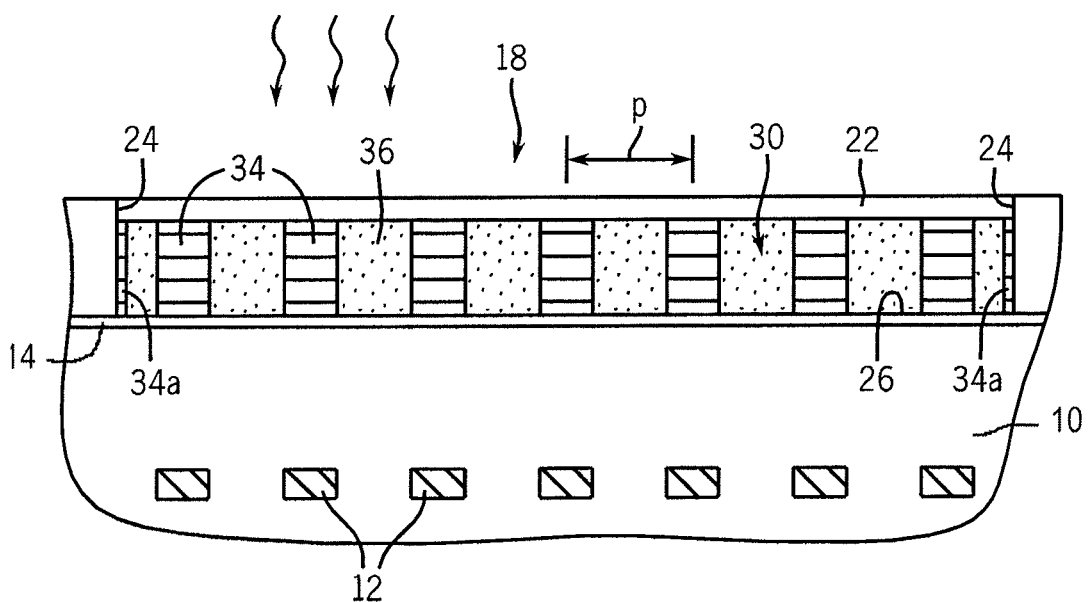

In the present embodiment, the floors 26 of trench 18 are structured to be neutral wetting (equal affinity for both blocks of the copolymer) to induce formation of cylindrical polymer domains 34 that are oriented perpendicular to the floors 26 of trenches 18 and the sidewalls 22 and ends 24 of trench 18 are structured to be preferential wetting by one block of the block copolymer to induce registration of the cylinders to the sidewalls 22 as the polymer blocks self-assemble. In response to the wetting properties of the trench surfaces, upon annealing, the preferred or minority block of the cylindrical-phase block copolymer will self-assemble to form a single row of cylindrical domains in the center of a polymer matrix for the length of the trench 18 and segregate to the sidewalls 22 and ends 24 of the trench 18 to form a thin interface or wetting layer, as depicted in FIGS. 6, 6A and 6B. Entropic forces drive the wetting of a neutral wetting surface by both blocks, and enthalpic forces drive the wetting of a preferential-wetting surface by the preferred block (e.g., the minority block).

To provide preferential wetting surfaces, for example, in the use of a PS-b-PMMA block copolymer, the material layer 16 can be composed of silicon (with native oxide), oxide (e.g., silicon oxide, $SiO_x$), silicon nitride, silicon oxycarbide, indium tin oxide (ITO), silicon oxynitride, and resist materials such as methacrylate-based resists and polydimethyl glutarimide resists, among other materials, which exhibit preferential wetting toward the PMMA block. In the use of a PS-PMMA cylinder-phase block copolymer material, the copolymer material will self-assemble to form a thin interface layer and cylinders of PMMA in a PS matrix.

In other embodiments, a preferential wetting material such as a polymethylmethacrylate (PMMA) polymer modified with an —OH containing moiety (e.g., hydroxyethylmethacrylate) can be applied onto the surfaces of the trenches 18, for example, by spin-coating and then heating (e.g., to about 170° C.) to allow the terminal OH groups to end-graft to oxide sidewalls 22 and ends 24 of the trenches 18. Non-grafted material can be removed by rinsing with an appropriate solvent (e.g., toluene). See, for example, Mansky et al., Science, 1997, 275, 1458-1460, and In et al., Langmuir, 2006, 22, 7855-7860.

A neutral wetting floor 26 of trench 18 allows both blocks of the copolymer material to wet the floor 26 of the trench 18. A neutral wetting material 14 can be provided by applying a neutral wetting polymer (e.g., a neutral wetting random copolymer) onto the substrate 10, forming the material layer 16 and then etching the trenches 18 to expose the underlying neutral wetting material 14, as illustrated in FIGS. 2, 2A and 2B.

In another embodiment illustrated in FIGS. 3 and 4, a neutral wetting random copolymer material can be applied after forming the trenches 18', for example, as a blanket coat by casting or spin-coating into the trenches 18', as depicted in FIG. 4. The random copolymer material can then be thermally processed to flow the material into the bottom of the trenches 18' by capillary action, which results in a layer (mat) of neutral wetting material 14' composed of the cross-linked, neutral wetting random copolymer. In another embodiment, the random copolymer material within the trenches 18' can be photo-exposed (e.g., through a mask or reticle) to cross-link the random copolymer within the trenches to form the neutral wetting material 14'. Non-cross-linked random copolymer material outside the trenches 18' (e.g., on the spacers 20') can be subsequently removed.

Neutral wetting surfaces can be specifically prepared by the application of random copolymers composed of monomers identical to those in the block copolymer and tailored such that the mole fraction of each monomer is appropriate to form a neutral wetting surface. For example, in the use of a poly(styrene-block-methyl methacrylate) block copolymer (PS-b-PMMA), a neutral wetting material 14 can be formed from a thin film of a photo-cross-linkable random PS:PMMA copolymer (PS-r-PMMA) that exhibits non-preferential or neutral wetting toward PS and PMMA (e.g., a random copolymer of PS-PMMA containing an about 0.6 mole fraction of styrene), which can be cast onto the substrate 10 (e.g., by spin-coating). The random copolymer material can be fixed in place by chemical grafting (on an oxide substrate) or by thermally or photolytically cross-linking (any surface) to form a mat that is neutral wetting to PS and PMMA and insoluble when the block copolymer material is cast onto it, due to the cross-linking.

In another embodiment, a neutral wetting random copolymer of polystyrene (PS), polymethacrylate (PMMA) with hydroxyl group(s) (e.g., 2-hydroxyethyl methacrylate (P(S-r-MMA-r-HEMA))) (e.g., about 58% PS) can be can be selectively grafted to a substrate 10 (e.g., an oxide) as a neutral wetting material 14 about 5-10 nm thick by heating at about 160° C. for about 48 hours. See, for example, In et al., Langmuir, 2006, 22, 7855-7860.

A surface that is neutral wetting to PS-b-PMMA can also be prepared by spin-coating a blanket layer of a photo- or thermally cross-linkable random copolymer such as a benzocyclobutene- or azidomethylstyrene-functionalized random copolymer of styrene and methyl methacrylate (e.g., poly(styrene)-r-benzocyclobutene-r-methyl methacrylate (PS-r-PMMA-r-BCB)). For example, such a random copolymer can comprise about 42% PMMA, about (58-x) % PS and x % (e.g., about 2-3%) of either polybenzocyclobutene or poly (para-azidomethylstyrene)). An azidomethylstyrene-functionalized random copolymer can be UV photo-cross-linked (e.g., 1-5 MW/cm^2 exposure for about 15 seconds to about 30 minutes) or thermally cross-linked (e.g., at about 170° C. for about 4 hours) to form a cross-linked polymer mat as a neutral wetting material 14. A benzocyclobutene-functionalized random copolymer can be thermally cross-linked (e.g., at about 200° C. for about four hours or at about 250° C. for about 10 minutes).

In another embodiment in which the substrate 10 is silicon (with native oxide), another neutral wetting surface for PS-b-PMMA can be provided by hydrogen-terminated silicon. The floors 26 of the trenches 18 can be etched, for example, with a hydrogen plasma, to remove the oxide material and form hydrogen-terminated silicon, which is neutral wetting with equal affinity for both blocks of a block copolymer material. H-terminated silicon can be prepared by a conventional process, for example, by a fluoride ion etch of a silicon substrate (with native oxide present, about 12-15 Å) by exposure to an aqueous solution of hydrogen fluoride (HF) and buffered HF or ammonium fluoride ($NH_4F$), by HF vapor treatment, or by a hydrogen plasma treatment (e.g., atomic hydrogen). An H-terminated silicon substrate can be further processed by grafting a random copolymer such as PS-r-PMMA selectively onto the substrate resulting in a neutral wetting surface, for example, by an in situ free radical polymerization of styrene and methyl methacrylate using a diolefinic linker such as divinyl benzene, which links the polymer to the surface to produce about a 10-15 nm thick film.

In yet another embodiment, a neutral wetting surface for PS-b-PMMA and PS-b-PEO can be provided by grafting a self-assembled monolayer (SAM) of a trichlorosilane-base SAM such as 3-(para-methoxyphenyl)propyltrichorosilane grafted to oxide (e.g., $SiO_2$) as described, for example, by D. H. Park, *Nanotechnology* 18 (2007), p. 355304.

In the present embodiment, the block copolymer material 28 is then thermally annealed (arrows 1) to cause the polymer blocks to phase separate and self-assemble according to the preferential and neutral wetting of the trench surfaces to form a self-assembled block copolymer material 30, as illustrated in FIGS. 6, 6A and 6B. Thermal annealing can be conducted at above the glass transition temperature of the component blocks of the copolymer material 30. For example, a PS-b-PMMA copolymer material can be globally annealed at a temperature of about 180-230° C. in a vacuum oven (not shown) for about 1-24 hours to achieve the self-assembled morphology. The resulting morphology of the annealed block copolymer material 30 (e.g., perpendicular orientation of cylinders) can be examined, for example, using atomic force microscopy (AFM), transmission electron microscopy (TEM), scanning electron microscopy (SEM).

Rather than performing a global heating of the block copolymer material 28, in other embodiments, a zone or localized thermal anneal can be applied to portions or sections of the block copolymer material 28 (see FIG. 5B, FIGS. 6A and 6B) on the substrate 10. For example, the substrate 10 can be moved across a hot-to-cold temperature gradient 32 (FIG. 6A) positioned above or underneath the substrate 10 (or the thermal source can be moved relative to the substrate, e.g., arrow →) such that the block copolymer material 28 self-assembles upon cooling after passing through the heat source. Only those portions of the block copolymer material 28 that are heated above the glass transition temperature of the component polymer blocks will self-assemble, and areas of the material that were not sufficiently heated remain disordered and unassembled. "Pulling" the heated zone across the substrate can result in faster processing and better ordered structures relative to a global thermal anneal.

Upon annealing, the cylindrical-phase block copolymer material 28 will self-assemble into a self-assembled block copolymer material 30 (e.g., film) composed of perpendicularly-oriented cylinders 34 of one of the polymer blocks (e.g., PMMA) within a polymer matrix 36 of the other polymer block (e.g., PS) (FIGS. 6, 6A and 6B). The constraints provided by the width ($w_t$) of the trench 18 and the character of the block copolymer composition (e.g., PS-b-PMMA having an inherent pitch at or about L) combined with a floor 26 of trench 18 that exhibits neutral or non-preferential wetting toward both polymer blocks (e.g., a random graft copolymer) and sidewalls 22 that are preferential wetting by the minority or preferred block of the block copolymer (e.g., the PMMA block), results in perpendicularly-oriented cylindrical domains 34 of the minority polymer block (e.g., PMMA) within a polymer matrix 36 of the majority polymer block (e.g., PS) in a single row (1-D array) registered and parallel to the sidewalls 22 of the trench 18. The diameter of the cylinders 34 will generally be about one-half of the center-to-center distance between the cylinders 34. Upon annealing, a layer of the minority block segregates to and wets the sidewalls 22 and ends 24 of the trenches 18 to form a thin wetting layer 34a with the thickness of the wetting layer 34a being generally about one-fourth of the center-to-center distance between adjacent cylindrical domains 34. For example, a layer of PMMA domains will wet oxide interfaces, with attached PS domains consequently directed away from the oxide material.

In some embodiments, the self-assembled block copolymer material 30 is defined by an array of cylindrical domains (cylinders) 34, each with a diameter at or about 0.5*L, with the number (n) of cylinders 34 in the row according to the length of the trench 18, and the center-to-center distance (pitch distance, p) between each cylinder 34 at or about L.

Optionally, after the block copolymer material is annealed and ordered, the copolymer material can be treated to cross-link the polymer segments (e.g., the PS segments) to fix and enhance the strength of the self-assembled polymer blocks. The polymers can be structured to inherently cross-link (e.g., upon exposure to ultraviolet (UV) radiation, including deep ultraviolet (DUV) radiation), or one of the polymer blocks of the copolymer material can be formulated to contain a cross-linking agent.

Generally, the film 28a outside the trenches 18 will not be not thick enough to result in self-assembly. Optionally, the unstructured thin film 28a of the block copolymer material 28 outside the trenches 18 (e.g., on spacers 20) can be removed, as illustrated in FIGS. 6, 6A and 6B. For example, the trench regions can be selectively exposed through a reticle (not shown) to cross-link only the annealed and self-assembled polymer material 30 within the trenches 18, and a wash can then be applied with an appropriate solvent (e.g., toluene) to remove the non-cross-linked portions of the thin film 28a of the block copolymer material 28 (e.g., on the spacers 20), leaving the registered self-assembled block copolymer material 30 within the trench and exposing the surface of the material layer 16 above/outside the trenches. In another embodiment, the annealed polymer material 30 can be cross-linked globally, a photoresist material can be applied to pattern and expose the areas of the thin film 28a outside the trench regions, and the exposed portions of the thin film 28a can be removed, for example, by an oxygen ($O_2$) plasma treatment.

Figure 7:
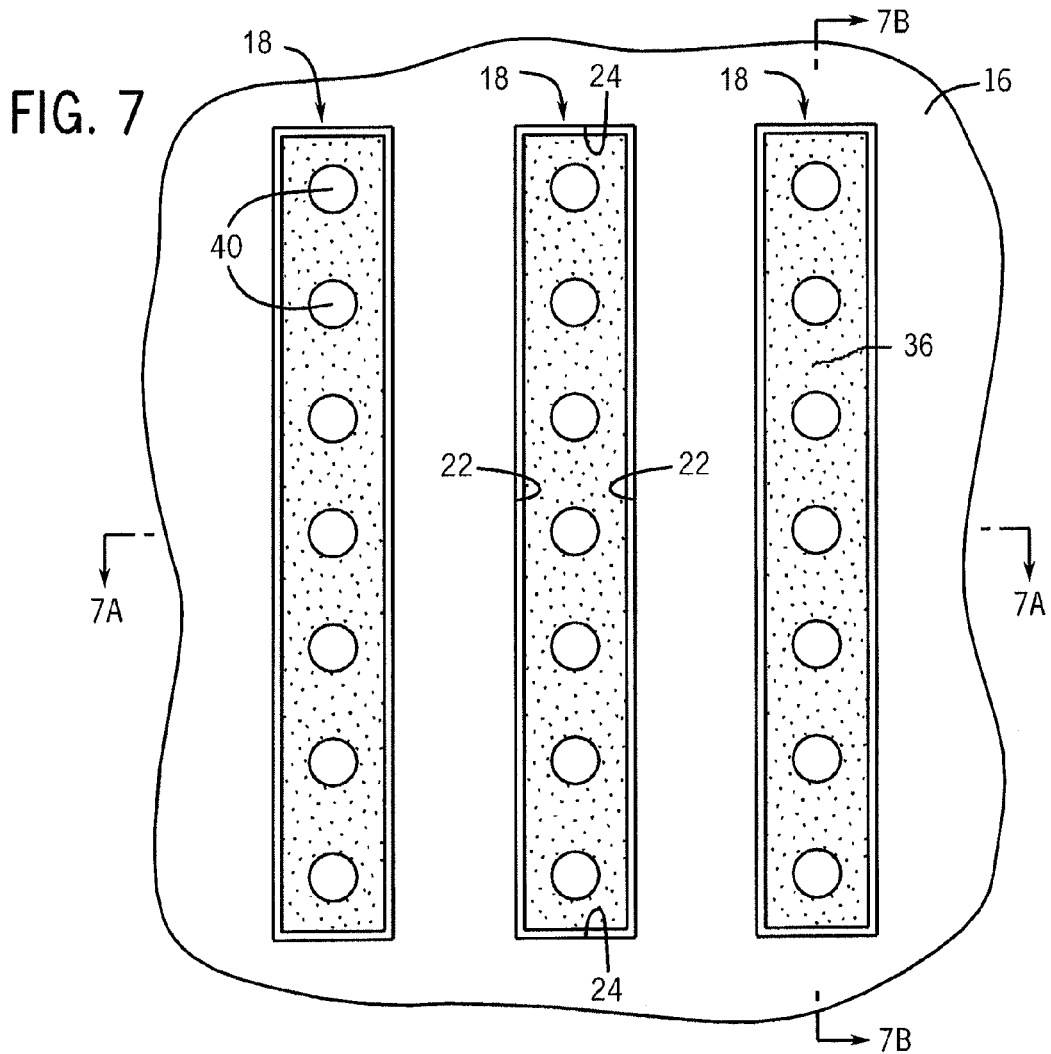
FIGS. 7, 8 and 9 are top plan views of the substrate of FIG. 6 at subsequent stages, illustrating an embodiment of the use of the self-assembled block copolymer film after removal of one of the polymer blocks as a mask to etch the substrate and filling of the etched openings.
Figure 7A:
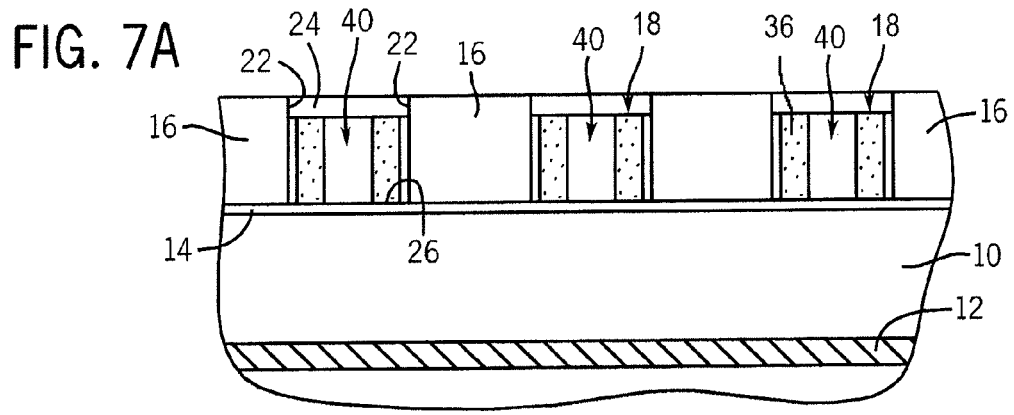
FIGS. 7A, 8A and 9A illustrate elevational, cross-sectional views of a portion of the substrate depicted in FIGS. 7, 8 and 9 taken along lines 7A-7A, 8A-8A and 9A-9A, respectively.
Figure 7B:
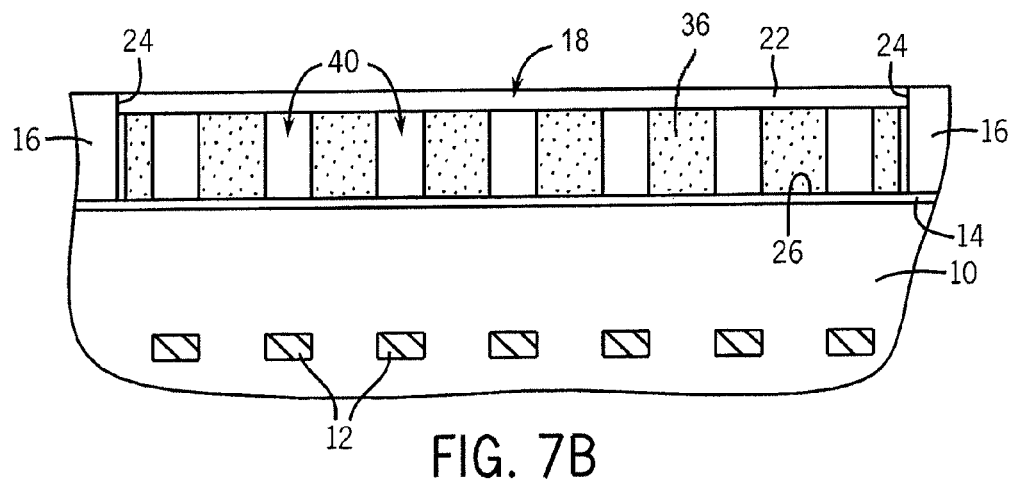
FIGS. 7B, 8B and 9B are cross-sectional views of the substrate depicted in FIGS. 7, 8 and 9 taken along lines 7B-7B, 8A-8A and 9B-9B, respectively.
Figure 8:
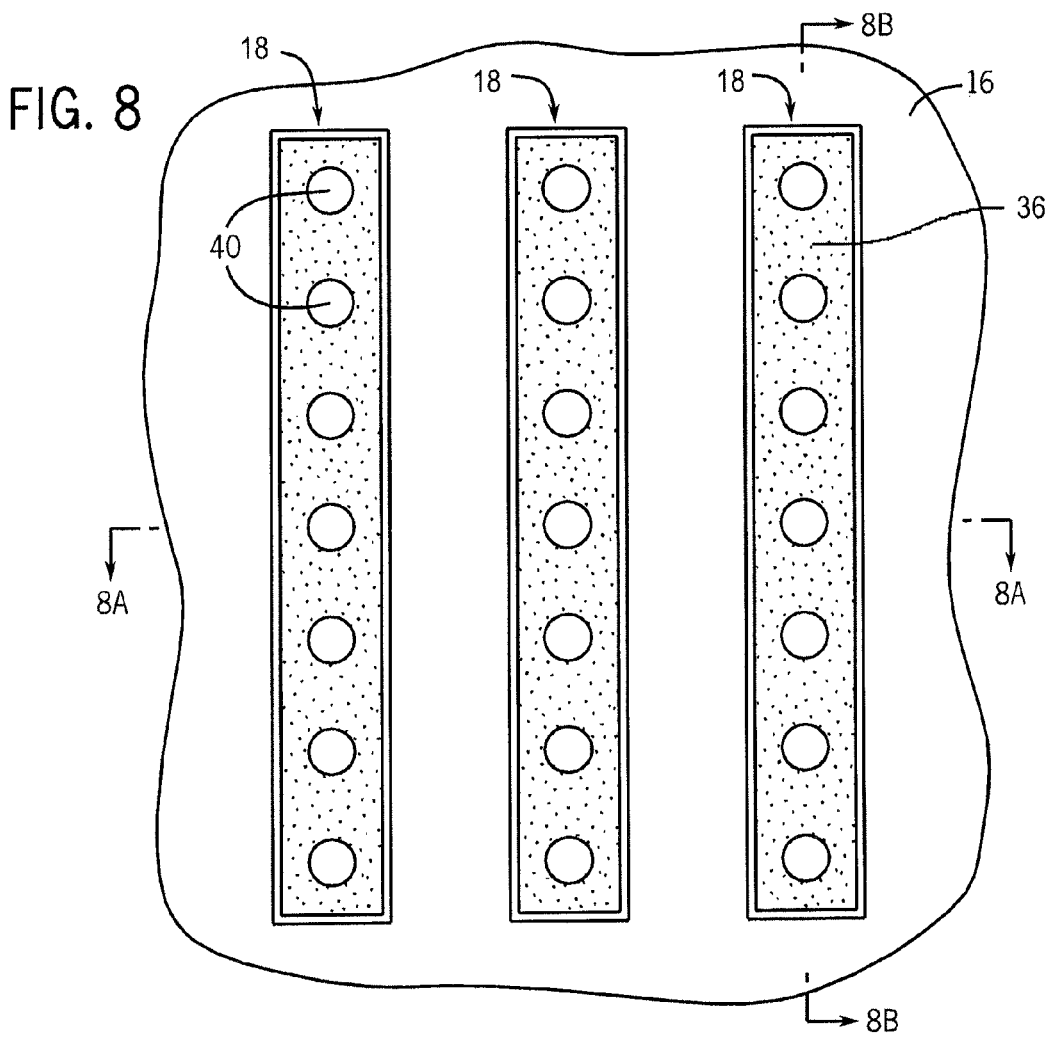
Figure 8A:
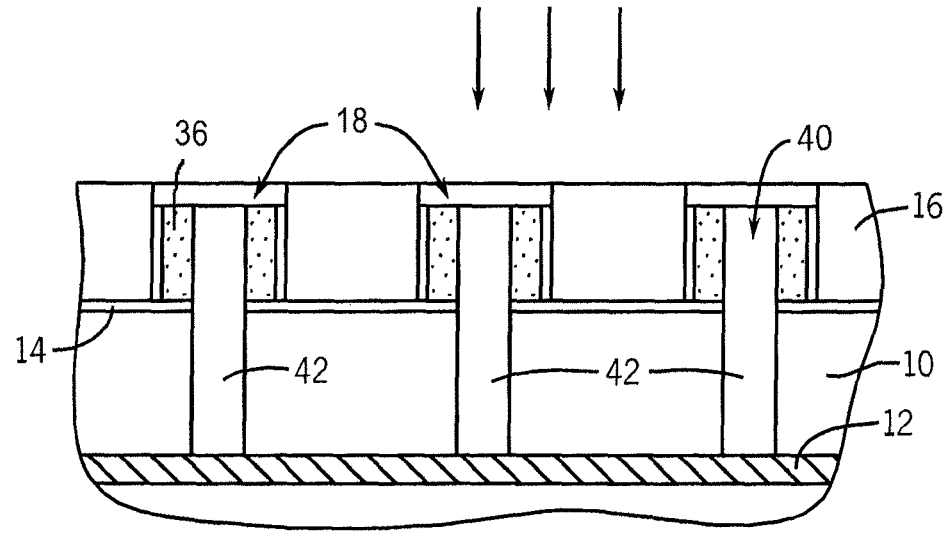
Figure 8B:
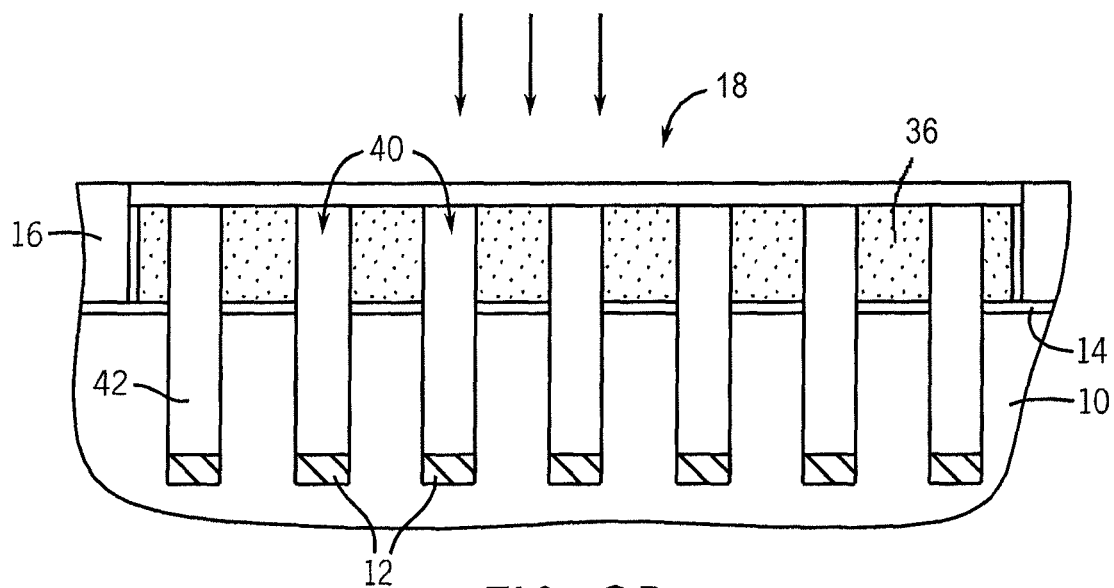

An application of the self-assembled block copolymer material 30 is as an etch mask to form openings in the substrate 10. For example, as illustrated in FIGS. 7, 7A and 7B, in one embodiment, the cylindrical domains 34 of the self-assembled block copolymer material 30 can be selectively removed resulting in a polymer matrix 36 with openings 40 exposing the floor 26 of trench 18. For example, PMMA domains can be selectively removed by UV exposure/acetic acid development or by selective reactive ion etching (RIE). The remaining porous polymer (e.g., PS) matrix 36 can then be used as a mask to etch (arrows 11) a series of openings or contact holes 42 to the conductive lines 12, semiconducting regions, or other active area in the underlying substrate 10 (or an underlayer), as depicted in FIGS. 8, 8A and 8B, for example, using a selective reactive ion etching (RIE) process.

Figure 9:
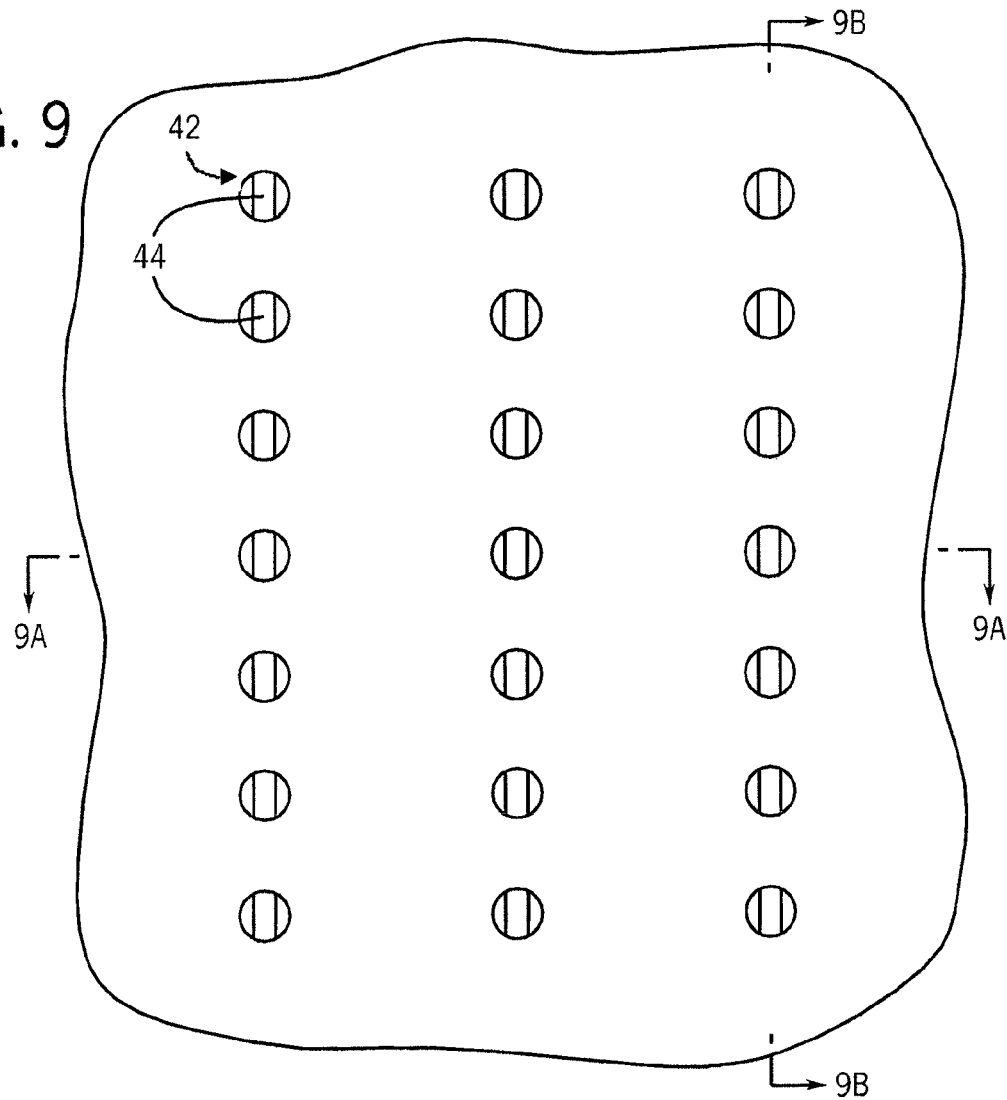
Figure 9A:
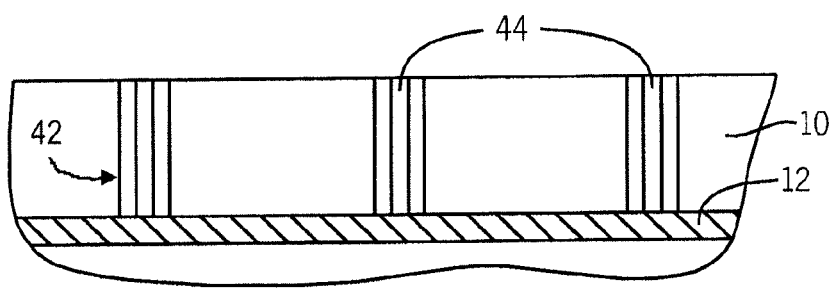
Figure 9B:
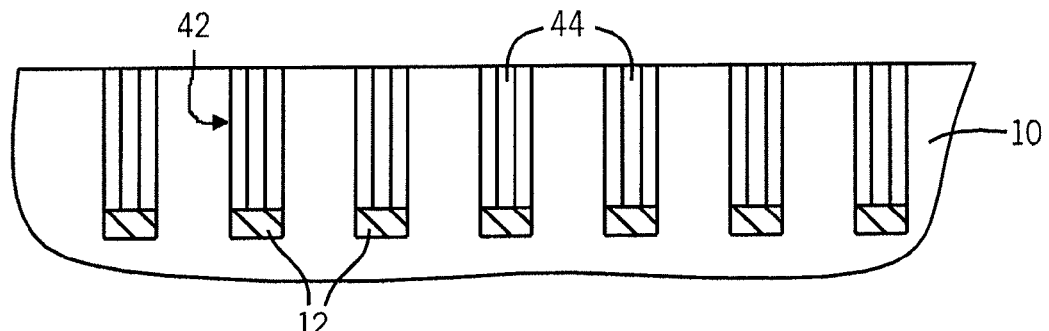

Further processing can then be performed as desired. For example, as depicted in FIGS. 9, 9A and 9B, the residual polymer matrix 36 can be removed and the openings 42 of substrate 10 can be filled with a material 44 such as a metal or metal alloy such as Cu, Al, W, Si, and $Ti_3N_4$, among others, to form arrays of cylindrical contacts to the conductive lines 12. The cylindrical openings 42 in the substrate 10 can also be filled with a metal-insulator-metal stack to form capacitors with an insulating material such as $SiO_2$, $Al_2O_3$, $HfO_2$, $ZrO_2$, $SrTiO_3$, and the like.

Another embodiment of a method according to the invention utilizes a solvent anneal in combination with a graphoepitaxy technique to induce ordering and registration of a cylindrical-phase block copolymer material within a trench, as depicted in FIGS. 10-15, to form a 1-D array of a single row of perpendicularly-oriented cylinders in a polymer matrix.

The diblock copolymer is constructed such that both polymer blocks will wet the air interface during the solvent anneal. Examples of diblock copolymers include poly(styrene)-b-poly(ethylene oxide) (PS-b-PEO); a PS-b-PEO block copolymer having a cleavable junction such as a triphenylmethyl (trityl)ether linkage between PS and PEO blocks (optionally complexed with a dilute concentration (e.g., about 1%) of a salt such as KCl, KI, LiCl, LiI, CsCl or CsI (Zhang et al., *Adv. Mater.* 2007, 19, 1571-1576); PS-b-PMMA block copolymer doped with PEO-coated gold nanoparticles of a size less than the diameter of the self-assembled cylinders (Park et al., *Macromolecules*, 2007, 40(11), 8119-8124); poly(styrene)-b-poly(methylmethacrylate) (PS-b-PMMA) or other PS-b-poly(acrylate) or PS-b-poly(methacrylate), poly(styrene)-b-poly(lactide) (PS-b-PLA), poly(styrene)-b-poly(vinylpyridine) (PS-b-PVP), poly(styrene)-b-poly(tert-butyl acrylate) (PS-b-PtBA), and poly(styrene)-b-poly(ethylene-co-butylene (PS-b-(PS-co-PB)). Examples of triblock copolymers include ABC polymers such as poly(styrene-b-methyl methacrylate-b-ethylene oxide) (PS-b-PMMA-b-PEO), and ABA copolymers such as PS-b-PI-b-PS.

The present embodiment utilizing a solvent anneal eliminates the formation of a neutral wetting material on the trench floor, which reduces the number of processing steps. In addition, each of the trench surfaces (e.g., sidewalls 22", ends 24", floor 26") is structured to be preferential wetting to the minority block of the PS-b-PEO block copolymer material (e.g., PEO).

The trenches 18" are also structured with a width ($w_t$) that is about 1-1.5*L or 1 to 1½ times the pitch value of the block copolymer material. For example, for a cylindrical-phase PS-b-PEO copolymer with an L value of about 50 nm, the trench is constructed to have a width ($w_t$) of about 50 nm. The depth ($D_t$) of the trenches can be at or about L.

Figure 10:
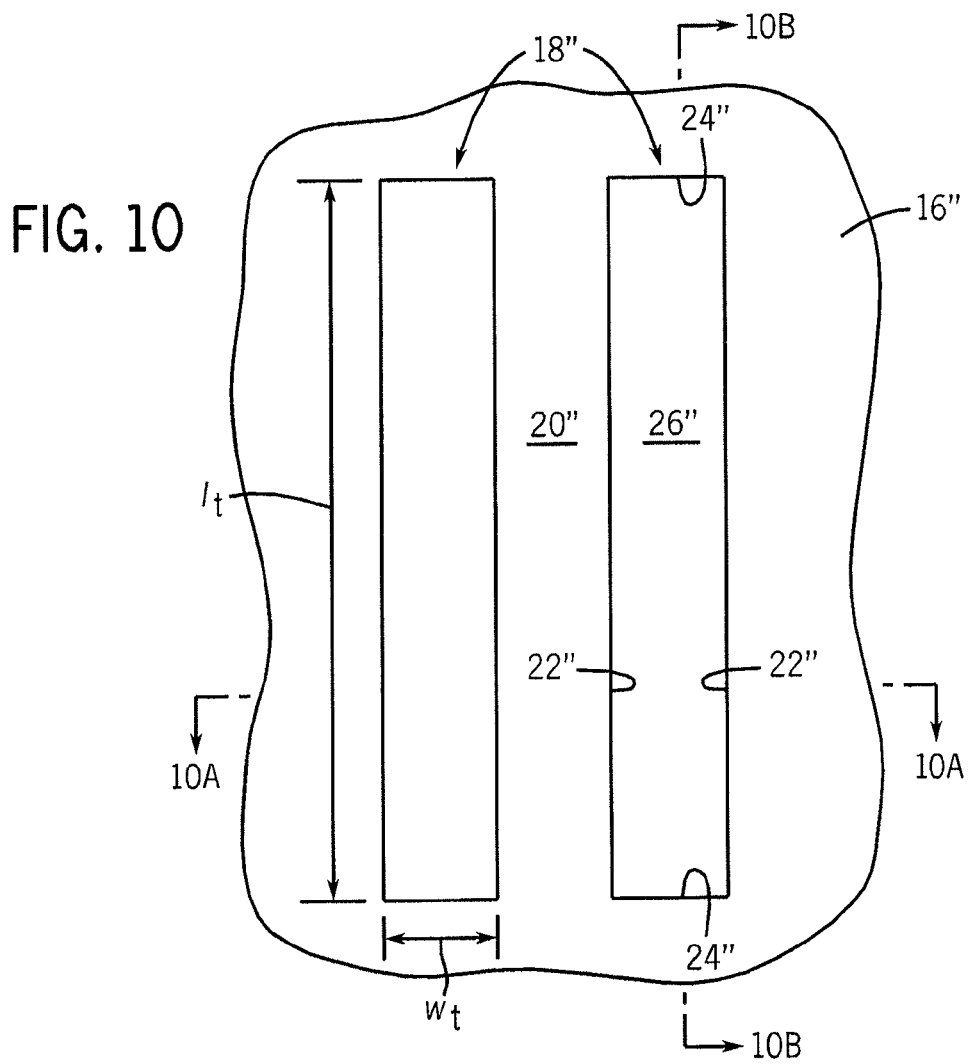
FIG. 10 is a diagrammatic top plan view of a portion of a substrate at a preliminary processing stage according to another embodiment of the disclosure, showing trenches in a material layer exposing the substrate.
Figure 10A:
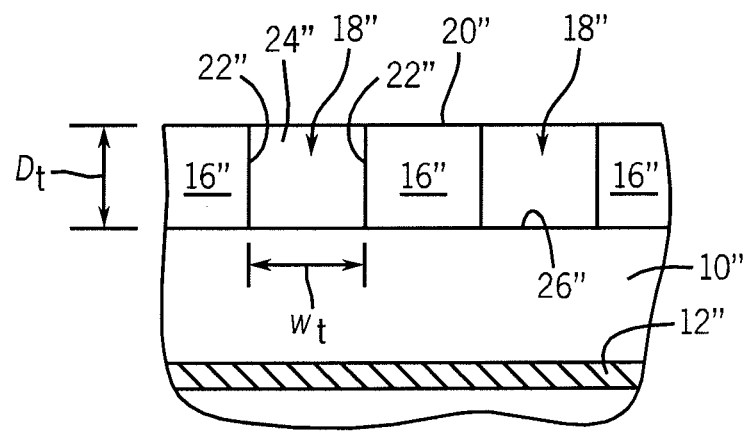
FIGS. 10A and 10B are elevational, cross-sectional views of the substrate depicted in FIG. 10 taken along lines 10A-10A and 10B-10B, respectively.
Figure 10B:
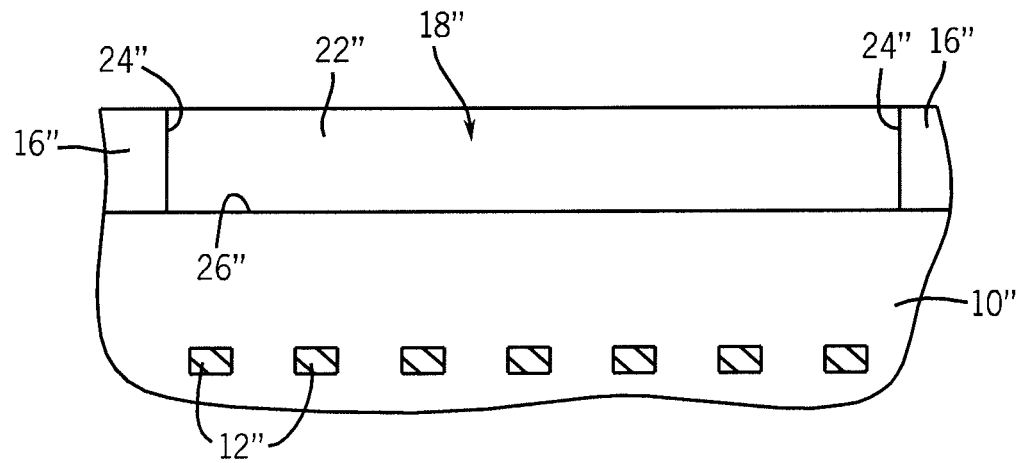

Referring to FIGS. 10, 10A and 10B, a substrate 10" is shown with conductive lines 12" (or other active areas) and an overlying material layer 16" in which trenches 18" have been etched. The substrate 10" and material layer 16" defining the trench 18" surfaces can be a material that is inherently preferential wetting to one of the polymer blocks, or in other embodiments, a preferential wetting material can be applied onto the surfaces of the trenches 18". For example, in the use of a PS-b-PEO block copolymer, the substrate 10" and material layer 16" can be formed of silicon (with native oxide), oxide (e.g., silicon oxide, $SiO_x$), silicon nitride, silicon oxycarbide, indium tin oxide (ITO), silicon oxynitride, and resist materials such as such as methacrylate-based resists, among other materials, which exhibit preferential wetting toward the PEO block. In the use of a PS-PEO cylinder-phase block copolymer material, the copolymer material will self-assemble to form cylinders of PEO in a PS matrix and a thin interface brush or wetting layer on the sidewalls 22" and ends 24" of the trenches 18".

Figure 11:
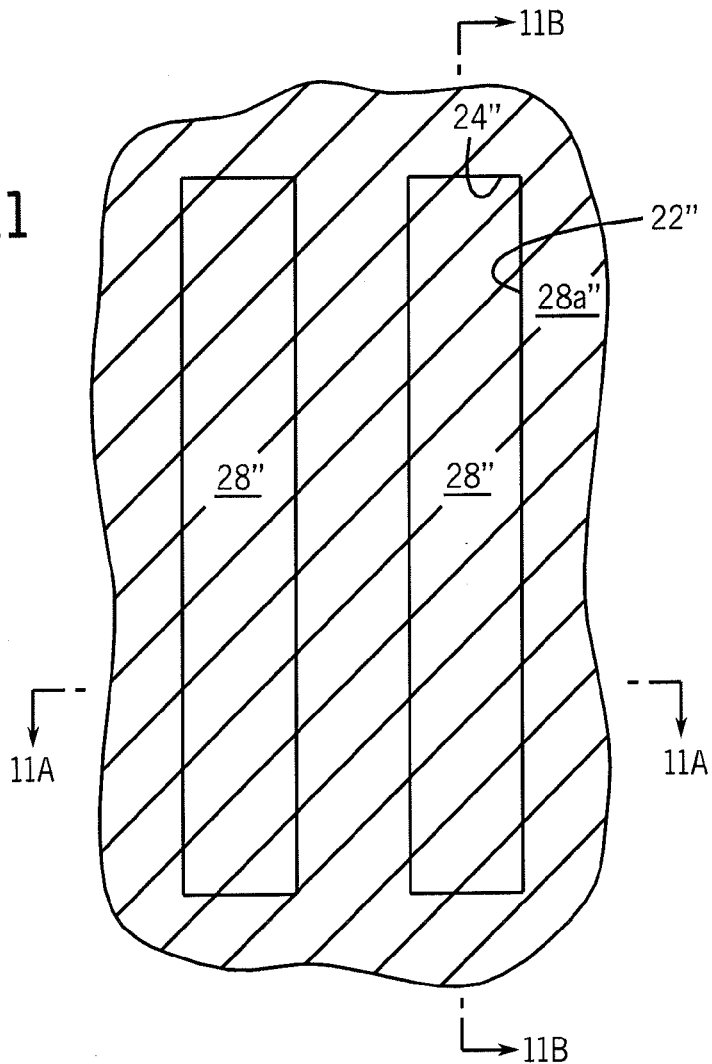
FIGS. 11 and 12 are diagrammatic top plan views of the substrate of FIG. 10 at subsequent stages in the fabrication of a self-assembled block copolymer film within the trenches in the material layer.
Figure 11A:
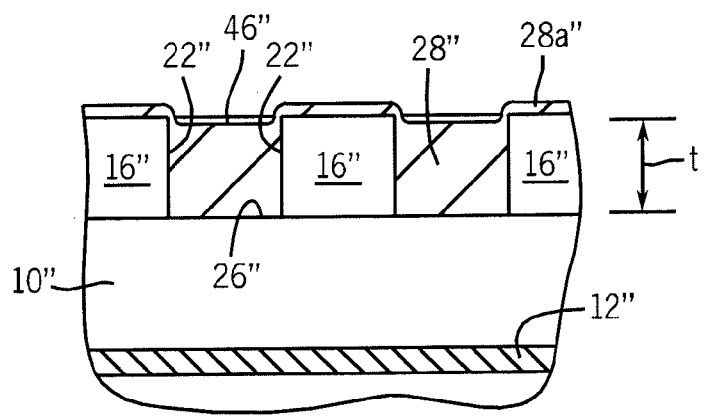
FIGS. 11A and 12A illustrate elevational, cross-sectional views of a portion of the substrate depicted in FIGS. 11 and 12 taken along lines 11A-11A and 12A-12A, respectively.
Figure 11B:
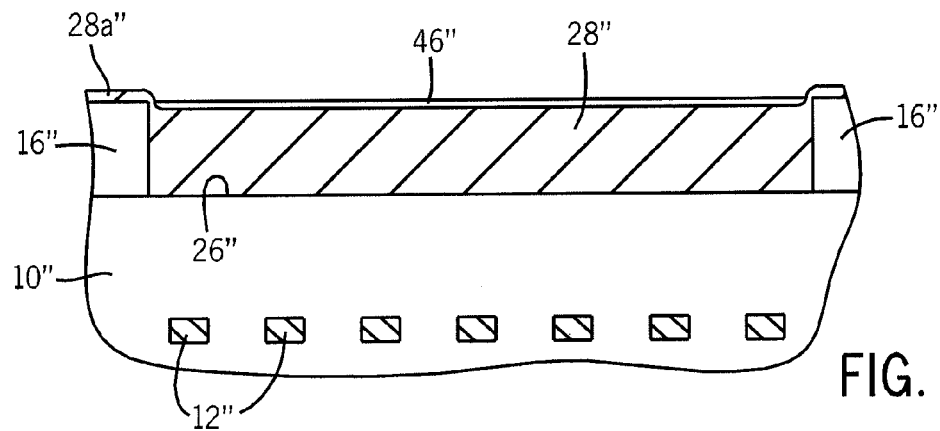
FIGS. 11B and 12B are cross-sectional views of the substrate depicted in FIGS. 11 and 12 taken along lines 11B-11B and 12B-12B, respectively.

A cylindrical-phase PS-b-PEO block copolymer material 28" (or blend with homopolymers) having an inherent pitch at or about L can be deposited into the trenches 18", as shown in FIGS. 11, 11A and 11B. With the use of a solvent anneal, the thickness (t) of the block copolymer material 28" deposited into the trench 18" can be about the L value of the material or greater, e.g., up to about 1000% of the L value.

The volume fractions of the two blocks (AB) of the PS-b-PEO diblock copolymer are generally at a ratio of about 60:40 and 80:20, such that the block copolymer will microphase separate and self-assemble into cylindrical domains of polymer B (i.e., PEO) within a matrix of polymer A (i.e., PS). An example of a cylinder-forming PS-b-PEO copolymer material (L=50 nm) to form about 25 nm diameter cylindrical PEO domains in a matrix of PS is composed of about 70% PS and 30% PEO with a total molecular weight ($M_n$) of about 75 kg/mol. Although diblock copolymers are used in the illustrative embodiment, triblock or multiblock copolymers can also be used.

The PS-b-PEO block copolymer material can also be formulated as a binary or ternary blend comprising a PS-b-PEO block copolymer and one or more homopolymers (i.e., polystyrene (PS) and polyethylene oxide (PEO) to produce blends that swell the size of the polymer domains and increase the L value of the polymer. The volume fraction of the homopolymers can range from 0% to about 40%. An example of a ternary diblock copolymer blend is a PS-b-PEO/PS/PEO blend. The L value of the polymer can also be modified by adjusting the molecular weight of the block copolymer.

Figure 12:
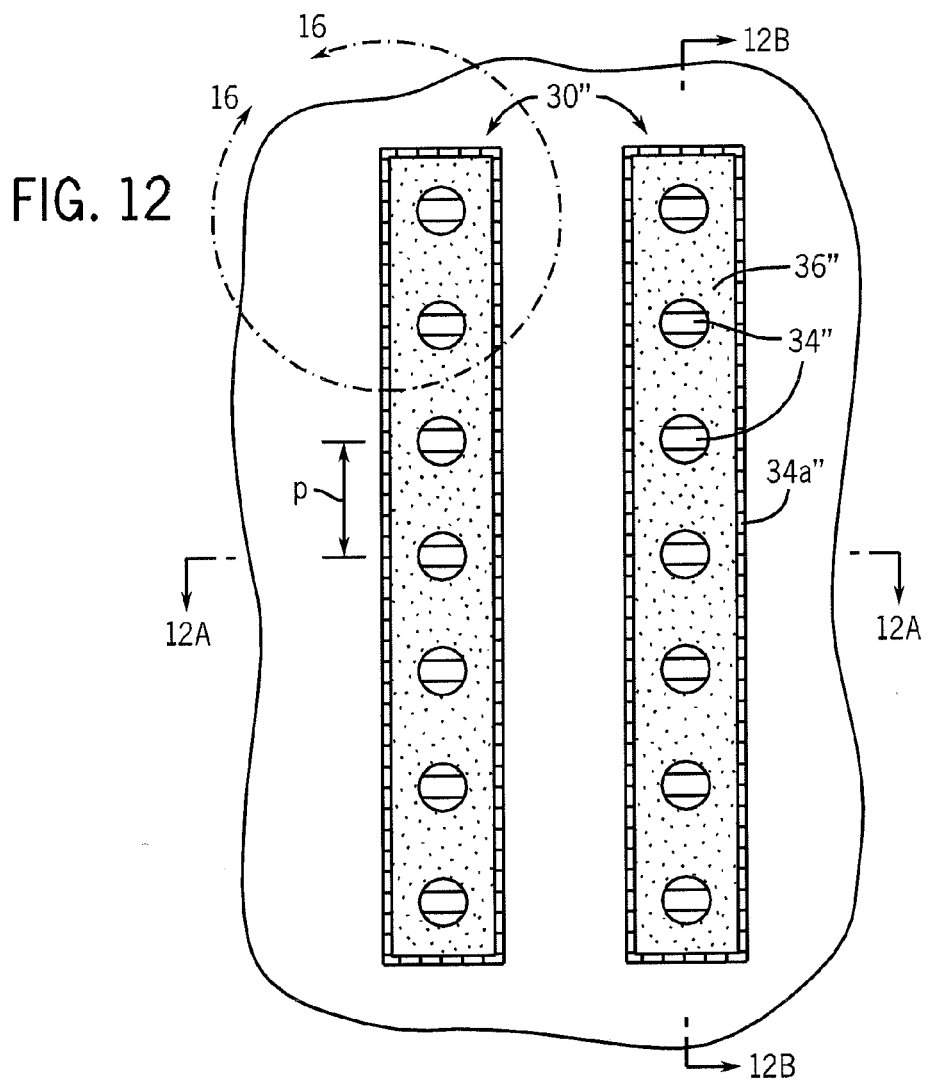
Figure 12A:
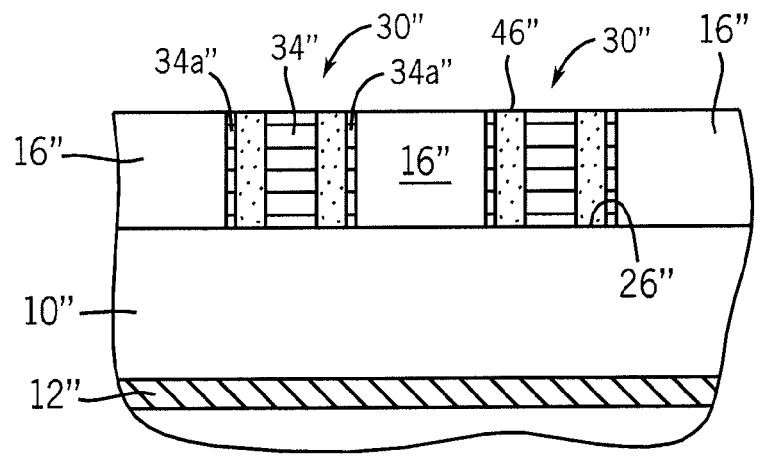
Figure 12B:
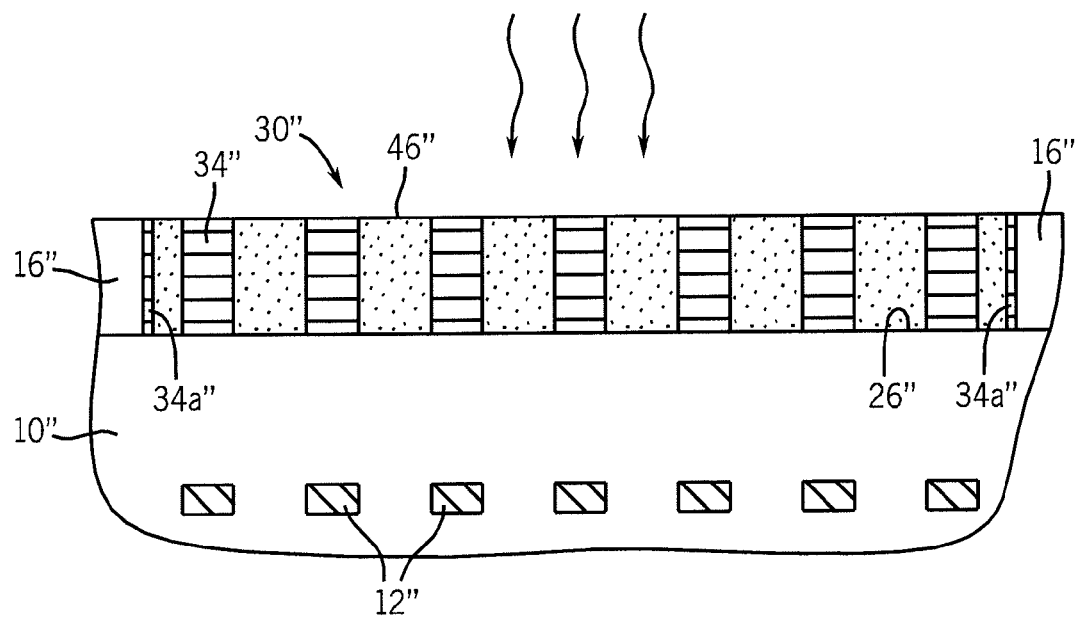

The PS-b-PEO block copolymer material 28" is then solvent annealed (arrows 1), to faun a self-assembled polymer material 30", as illustrated in FIGS. 12, 12A and 12B.

In a solvent anneal, the block copolymer material is swollen by exposure to a vapor of a "good" solvent for both blocks, for example, benzene, chloroform or a chloroform/octane mixture. The block copolymer material 28" is exposed to the solvent vapors to slowly swell both polymer blocks (PS, PEO) of the material. The solvent and solvent vapors are then allowed to slowly diffuse out of the swollen polymer material and evaporate. The solvent-saturated vapor maintains a neutral air-surface interface 46" (see FIGS. 11A and 11B) with the copolymer material 28", which induces the formation of perpendicular features throughout the copolymer material. The evaporation of the solvent forms a gradient that causes self-assembly and formation of structures starting at the neutral air-surface interface 46" and driven downward to the floor 26" of the trench 18", with formation of perpendicularly-oriented cylindrical domains 34" guided by the trench sidewalls 22" and extending completely from the neutral air-surface interface 46" to the substrate surface (trench floor 26"). In some embodiments, a solvent anneal can be conducted in high humidity (e.g., about 70% to 85%) with water condensation on the film, which cools as the solvent (e.g., benzene) evaporates.

The constraints provided by the width ($w_t$) of trench 18" and the character of the block copolymer material 28". preferential wetting sidewalls 22" and ends 24" combined with a solvent anneal results in a one-dimensional (1-D) array of a single row of perpendicularly-oriented cylindrical domains 34" of the minority polymer block (e.g., PEO) within a polymer matrix 36" of the major polymer block (e.g., PS), with the minority block segregating to the sidewalls 22" of the trench 18" to form a wetting layer 34a" with a thickness generally about one-fourth of the center-to-center distance of adjacent cylindrical domains 34". In some embodiments, the cylinders have a diameter at or about 0.5*L (e.g., about one-half of the center-to-center distance between cylinders), the number (n) of cylinders in the row is according to the length ($l_t$) of the trench, and the center-to-center distance (pitch distance, p) between cylinder domains is at or about L.

Optionally, the annealed and ordered self-assembled block copolymer material 30" can be treated to cross-link the polymer segments (e.g., the PS matrix 36"). An unstructured thin layer or film 28a" of the block copolymer material outside the trenches can then be optionally removed, as shown in FIGS. 12, 12A and 12B.

Figure 13:
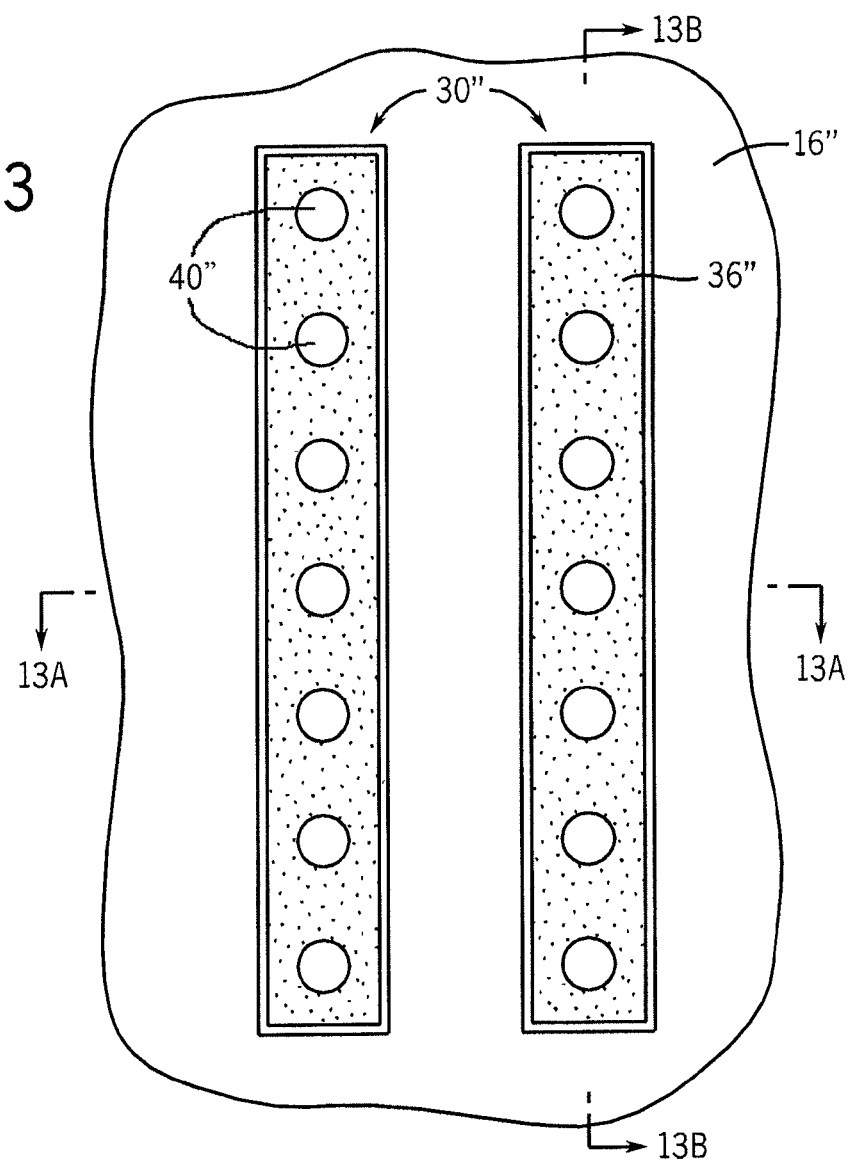
FIGS. 13, 14 and 15 are top plan views of the substrate of FIG. 12 at subsequent stages, illustrating the use of the self-assembled block copolymer film after removal of one of the polymer blocks as a mask to etch the substrate and filling of the etched openings according to an embodiment of the disclosure.
Figure 13A:
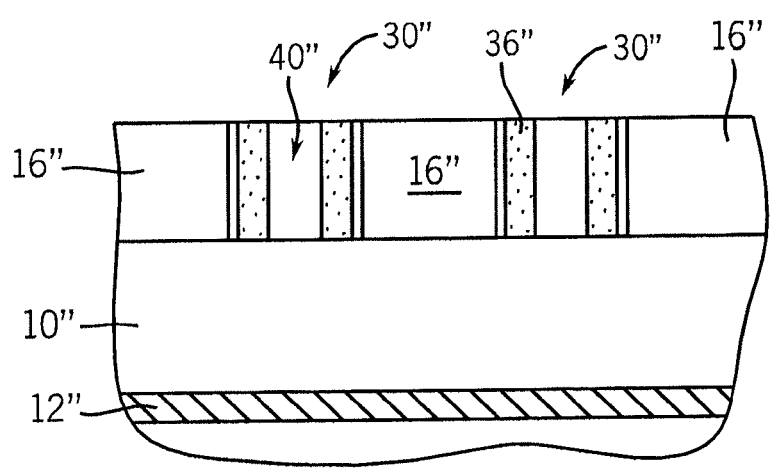
FIGS. 13A, 14A and 15A illustrate elevational, cross-sectional views of a portion of the substrate depicted in FIGS. 13, 14 and 15 taken along lines 13A-13A, 14A-14A and 15A-15A, respectively.
Figure 13B:
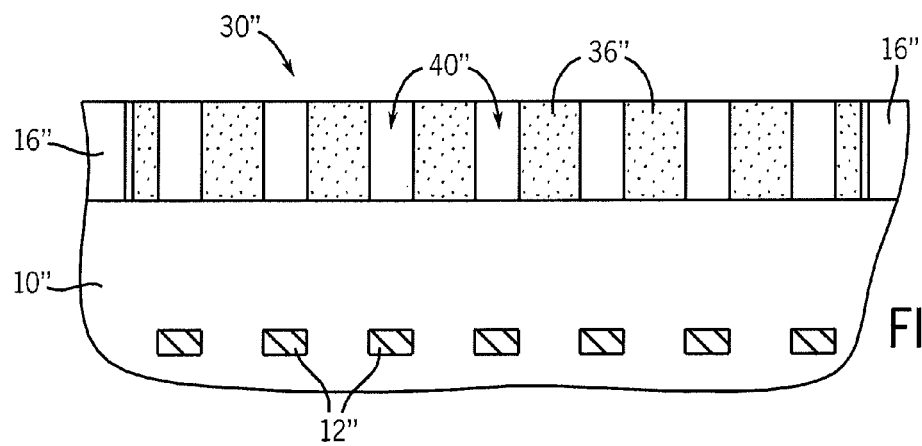
FIGS. 13B, 14B and 15B are cross-sectional views of the substrate depicted in FIGS. 13, 14 and 15 taken along lines 13B-13B, 14B-14B and 15B-15B, respectively.

As depicted in FIGS. 13, 13A and 13B, the self-assembled copolymer material 30" (optionally cross-linked) can then be processed to form, for example, an etch mask for use in etching openings in the substrate 10" or underlying material layer, by the selective removal of one of the polymer domains (e.g., PS or PEO). For example, the water-soluble PEO cylindrical domains 34" can be selectively removed to produce openings 40" in the PS polymer matrix 36" that can be used, for example, as a lithographic template or mask to etch openings 42" in the underlying substrate 10" (FIGS. 14, 14A and 14B) for semiconductor processing in the nanometer size range (i.e., about 10-100 nm). Removal of the PEO phase cylindrical domains 34" can be performed, for example, by exposure of the cross-linked self-assembled block copolymer material 30" (optionally cross-linked) to aqueous hydroiodic acid or exposure to water alone, which will draw PEO to the surface without cleaving the bonds to the PS domains. In embodiments in which the PS-b-PEO block copolymer includes an acid-cleavable linker (e.g., trityl alcohol linker) positioned between the polymer blocks, exposure of the cross-linked self-assembled block copolymer material 30" to an aqueous acid (e.g., trifluoroacetic acid) or to an acid vapor can be performed to cleave the polymer into PEO and PS fragments (S. Yurt et al., "Scission of Diblock Copolymers into their Constituent Blocks," *Macromolecules* 2006, 39, 1670-1672). Rinsing with water can then be performed to remove the cleaved PEO cylindrical domains 34". In other embodiments, exposure to water to draw the PEO cylindrical domains to the surface followed by a brief oxygen ($O_2$) plasma etch can also be performed to remove the PEO cylindrical domains.

Figure 15:
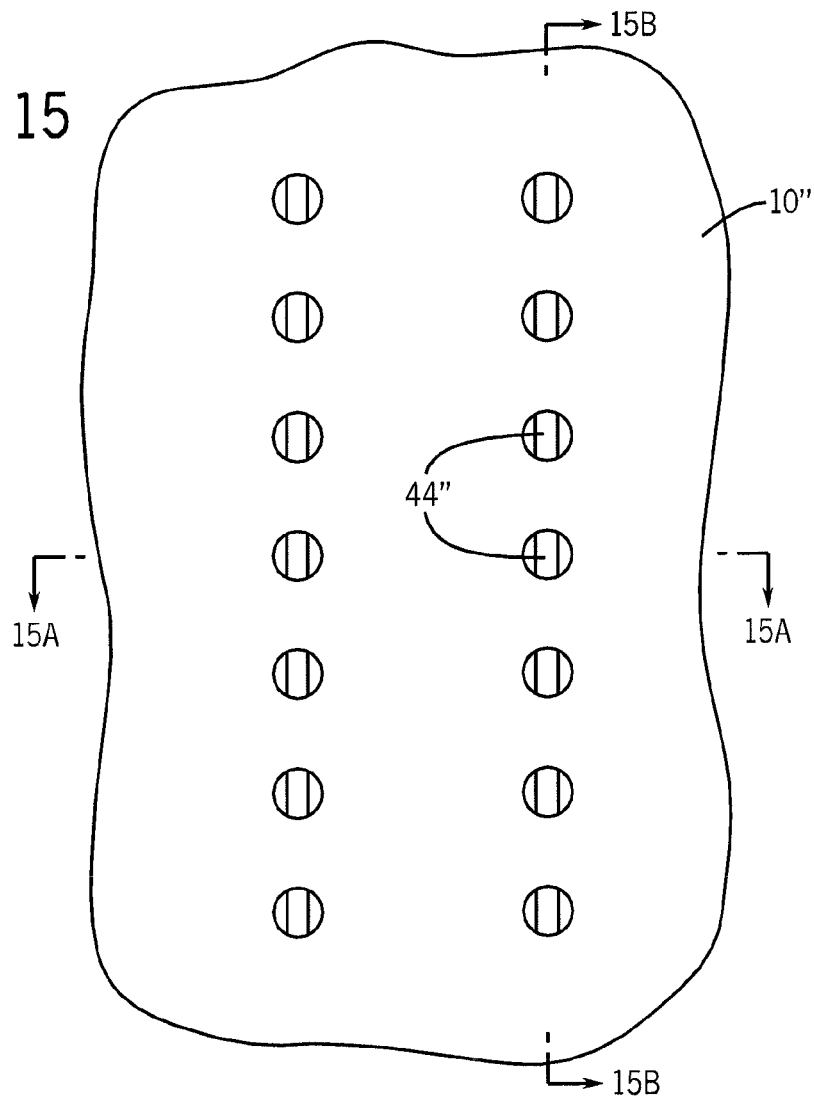
Figure 15A:
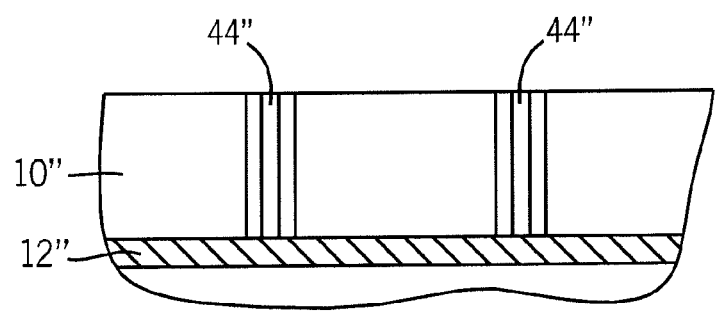
Figure 15B:
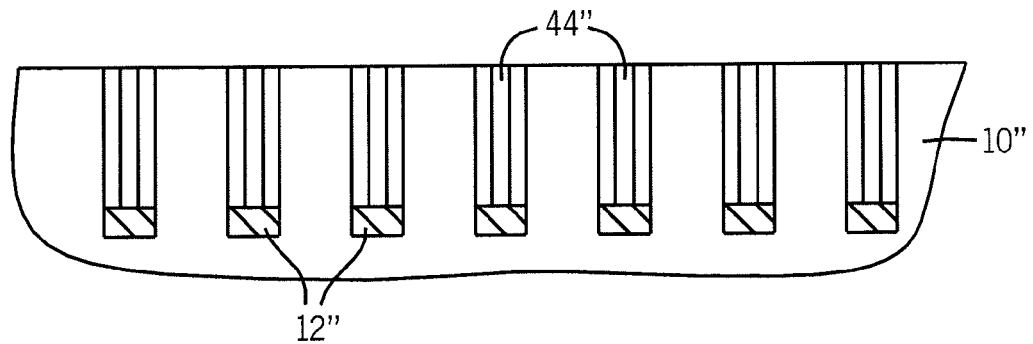

As shown in FIGS. 15, 15A and 15B, the residual polymer matrix 36" can then be removed and the openings 42" that have been formed in the substrate can be filled with a desired material 44".

Another embodiment of a method according to the invention utilizes a thermal anneal in combination with a cylindrical-phase, block copolymer material comprising polylactide (or polylactic acid) and graphoepitaxy to form a single row, 1-D array of perpendicularly-oriented cylinders in a polymer matrix. Examples of polylactide block copolymer materials include poly(styrene)-b-poly(lactide) (or poly(lactic acid)) (PS-b-PLA).

The described embodiment eliminates the formation of a neutral wetting material on the trench floor, thus reducing the number of processing steps. It also utilizes a thermal anneal process, which can provide faster processing than with a solvent anneal. In addition, the use of polylactic acid (PLA), a biodegradable, thermoplastic aliphatic polyester, allows relatively easy development and removal of the PLA domains to form cylindrical-shaped voids through the polymer matrix (e.g., PS, etc.). The trench surfaces (e.g., sidewalls, ends, floor) are structured using the same or highly similar material that is preferential wetting to the minority block, e.g., the PLA block of a PS-b-PLA copolymer material.

The present embodiments can also be described with reference to FIGS. 10-15. Referring to FIGS. 10, 10A and 10B, the substrate 10" and material layer 16" can be formed from a material that is inherently preferential wetting to the PLA block, or in other embodiments, a preferential wetting material can be applied onto the surfaces of the trenches 18", with the same or closely similar material being used to define the sidewalls 22", ends 24" and floor 26" of the trenches 18". For example, materials that are preferential wetting to the PLA block of a PS-b-PLA block copolymer include oxide (e.g., silicon oxide, $SiO_x$), silicon (with native oxide), silicon nitride, silicon oxycarbide, indium tin oxide (ITO), silicon oxynitride, and resist materials such as such as methacrylate-based resists, among other materials.

In the present embodiment, the trenches 18" are structured with a width ($w_t$) that is at about 1.5*L value of the PS-b-PLA copolymer material, a length ($l_t$) at or about $nL_o$ (where n=number of cylinders), and a depth ($D_t$) at greater than L ($D_t$>L) such that a cylindrical-phase block copolymer (or blend) that is cast into the trench to a thickness of about the inherent L value of the copolymer material will self-assemble upon annealing into a single layer of n cylinders according to the length ($l_t$) of the trench, the cylinders with a diameter at or about 0.5*L, and a center-to-center distance (p) of adjacent cylinders at or about L.

A cylindrical-phase PS-b-PLA block copolymer material 28" (or triblock or multiblock copolymers or blend with homopolymers) having an inherent pitch at or about L can be deposited into the trenches 18", as shown in FIGS. 11, 11A and 11B. For example, a PS-b-PLA copolymer material (L=49 nm) can be composed of about 71% PS and 29% PLA with a total molecular weight ($M_n$) of about 60.5 kg/mol to form about 27-nm diameter cylindrical PLA domains in a matrix of PS.

Figure 16:
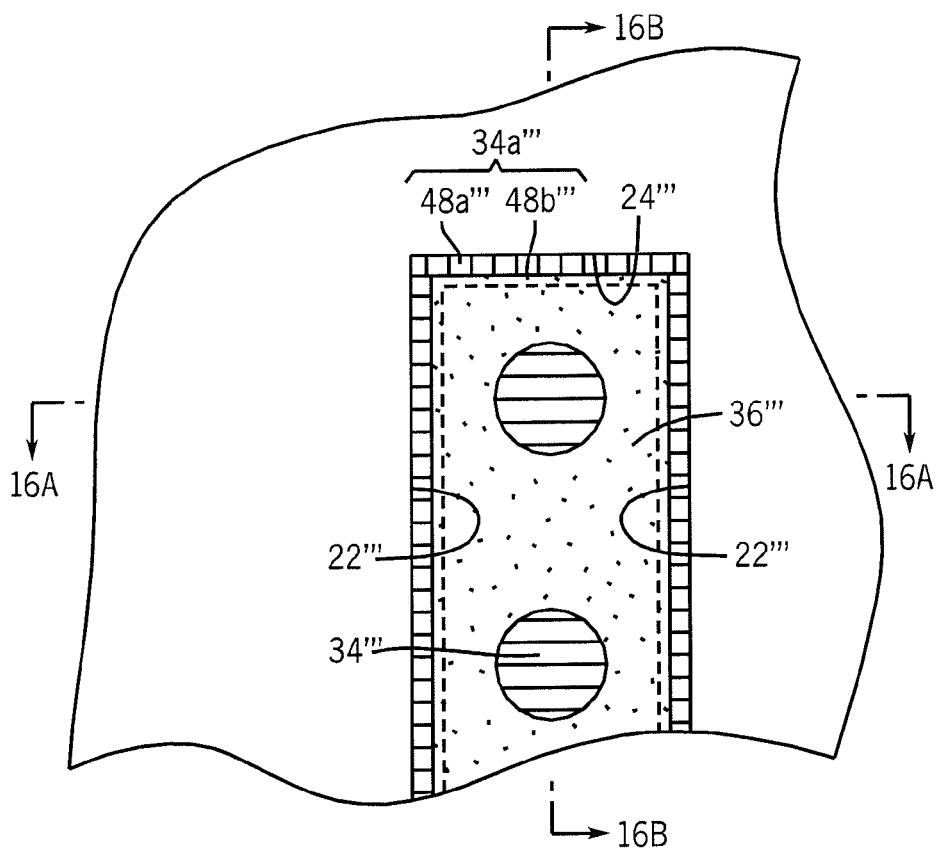
FIG. 16 is a top plan view of a portion of the substrate of FIG. 12 taken along the dashed circular line 16 according to another embodiment of the invention, showing a bilayer wetting layer along the trench surfaces.

Upon casting the block copolymer material 28" into the trenches 18", both polymer blocks (e.g., PLA and PS) tend to wet the neutral air-surface interface 46" equally well, and the minority (e.g., PLA) block will preferentially wet the surfaces (sidewalls 22", ends 24", and floors 26") of the trench 18" to form a thin wetting layer 34a" on each of the trench surfaces as illustrated in FIGS. 12, 12A and 12B. Turning now to FIGS. 16, 16A and 16B, in the present embodiment, the wetting layer 34a'" is a bilayer of PLA 48a'" and PS 48b'". The PS 48b'" portion of the wetting layer (depicted with broken lining - - - ) is continuous with the overall PS polymer matrix 36'", as shown.

Thermal annealing of the block copolymer material 28'" in combination with the constraints provided by the width ($w_t$) of the trench 18'", the preferential wetting trench surfaces (sidewalls 22'", ends 24'", and floors 26'") and the composition of the block copolymer, causes the minority polymer block (e.g., PLA block) to self-assemble to form perpendicularly-oriented cylindrical domains 34'" in a single row within a polymer matrix 36'" of the majority polymer block (e.g., PS), with the PLA 48a'"/PS 48b'" bilayer along the trench surfaces sidewalls 22'", ends 24'", and floors 26'". In some embodiments, the block copolymer material 28'" can be "zone annealed" as previously described. As shown in FIGS. 16A-16B, the PLA cylindrical domains 34'" extend from the neutral air-surface interface 46''' to the wetting layer 34a''' composed of the PLA/PS bilayer 48a'''/48b''' overlying the surface of the substrate 10''' at the floor 26''' of trench 18'''. The PS bilayer 48b''', which is covalently bonded to the PLA bilayer 48a''', is in contact with the PS block (matrix 36'''), which in turn is covalently bonded to the PLA cylindrical domains 34'''.

Polymer segments (e.g., the PS matrix 36''') of the annealed polymer material 30''' may optionally be cross-linked, and any unstructured thin layer or film 28a''' of polymer material on surfaces outside the trenches can then be optionally removed, as depicted in FIGS. 16, 16A and 16B.

Figure 17:
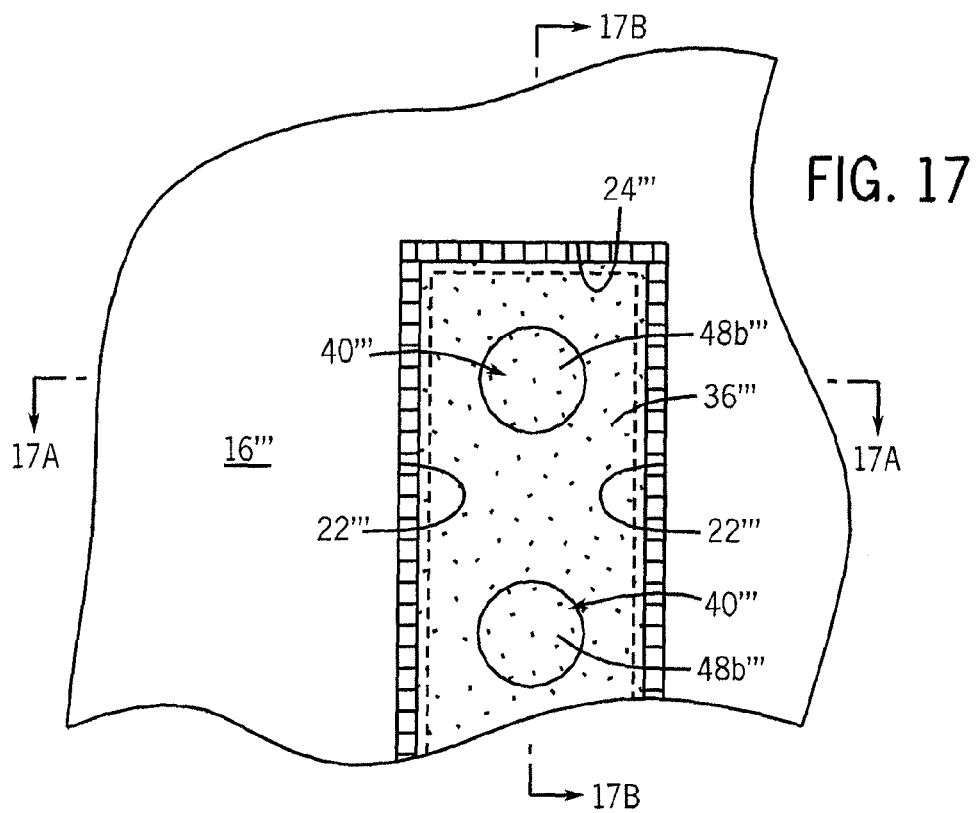
FIGS. 17 and 18 are top plan views of the substrate of FIG. 16 at subsequent stages, showing the removal of one of the polymer domains to form openings to the substrate according to another embodiment of the invention.
Figure 17A:
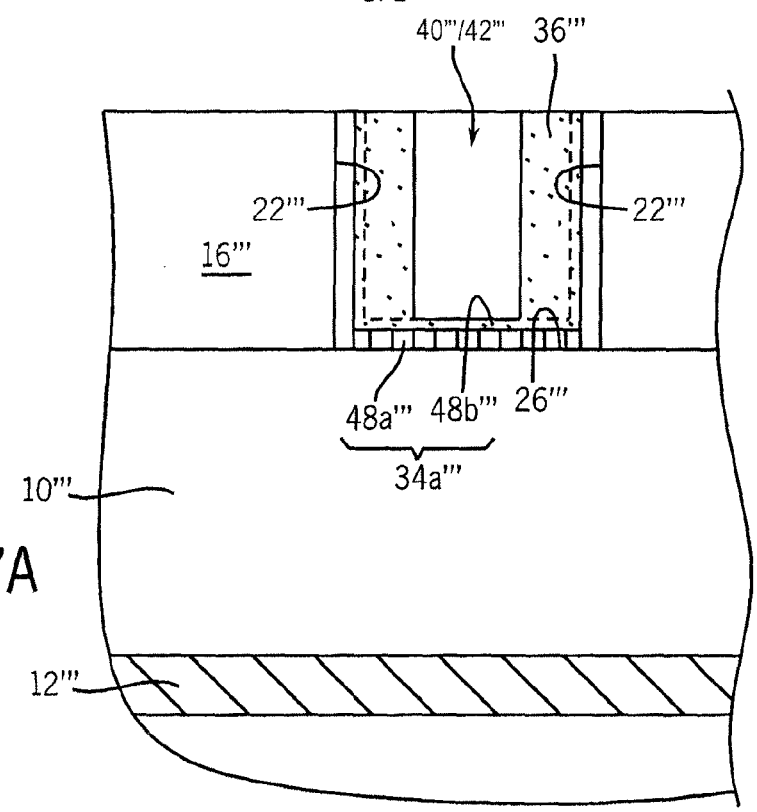
Figure 17B:
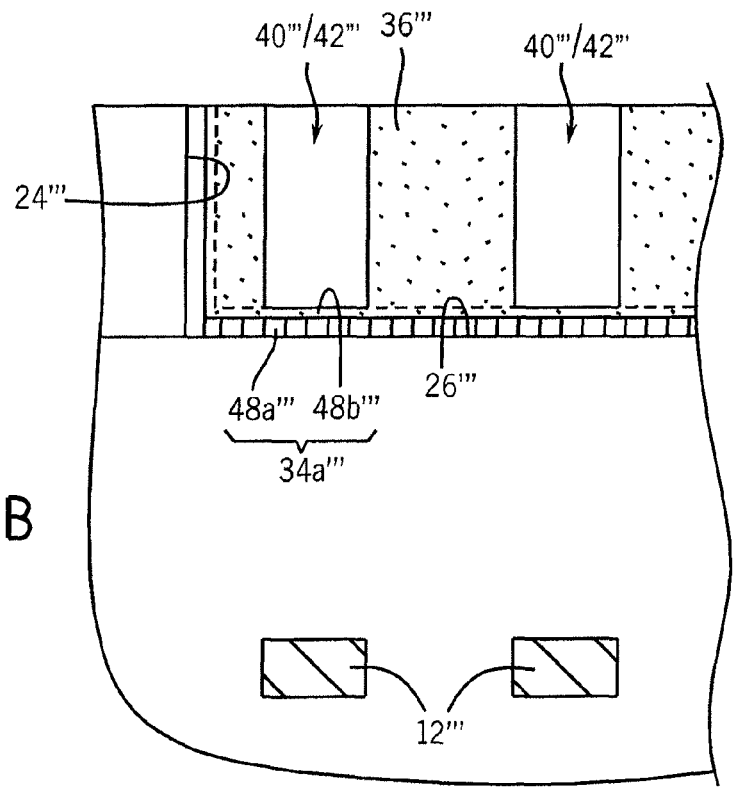
Figure 18:
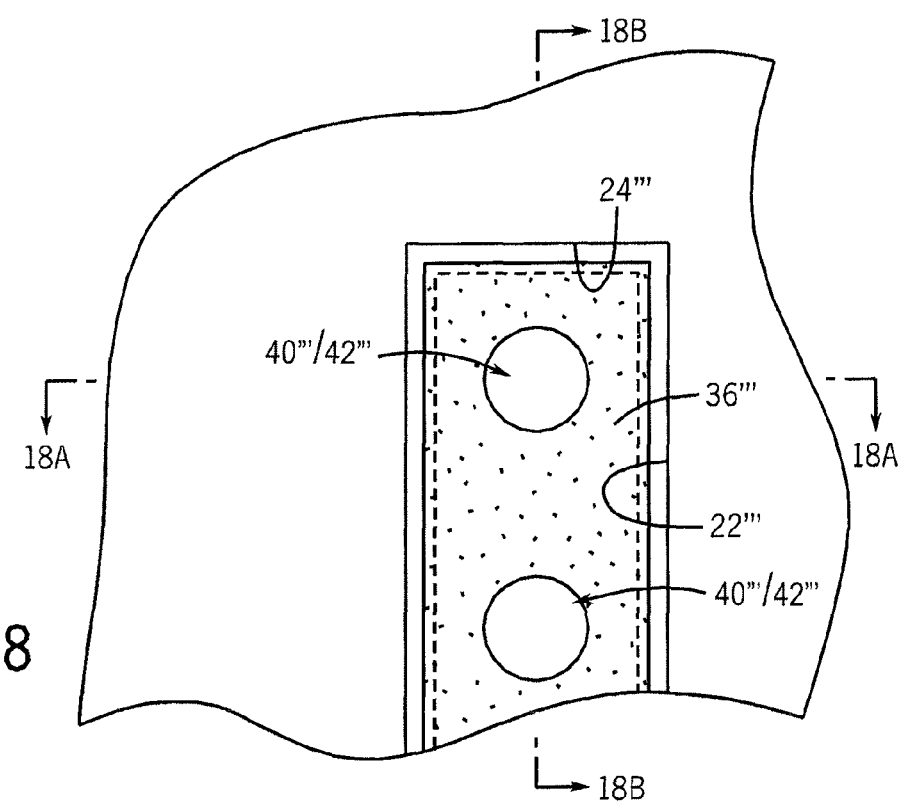

The self-assembled block copolymer material 30''' can then be further processed as desired, for example, to form a mask to etch openings 40''' in the substrate 10'''. For example, as illustrated in FIGS. 17, 17A and 17B, the PLA cylinders 34''' can be selectively removed, for example, using UV exposure and an acetic acid wash, or an aqueous methanol mixture containing sodium hydroxide to form cylindrical-shaped openings 40''' extending through the PS matrix. Due to the PLA/PS bilayer 48a''', 48b''' that overlies the floor 26''' of the trench, the openings 40''' do not extend all the way to the surface of the substrate 10''' at the trench floor 26'''. As depicted in FIGS. 18, 18A and 18B, an RIE etching process (arrows I), for example, can be conducted to remove the bilayer material and expose the trench floors 26''' and the substrate 10''' within the openings 40'''/42'''. The RIE etch may thin the matrix (mask) 36''', as shown, although not to a significant extent.

Figure 14:
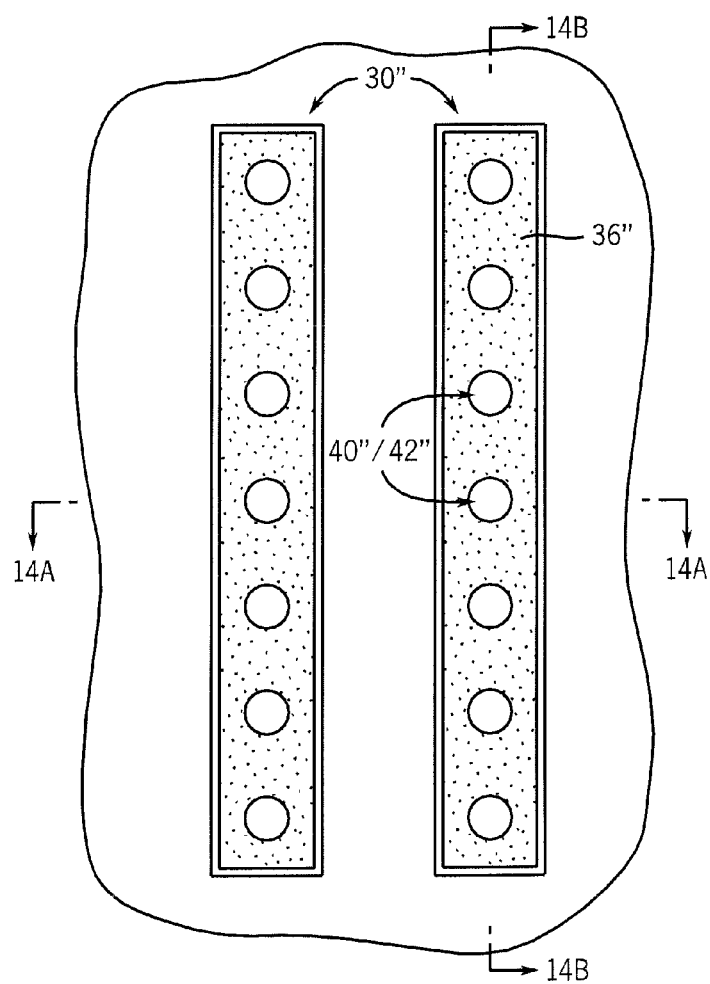
Figure 14A:
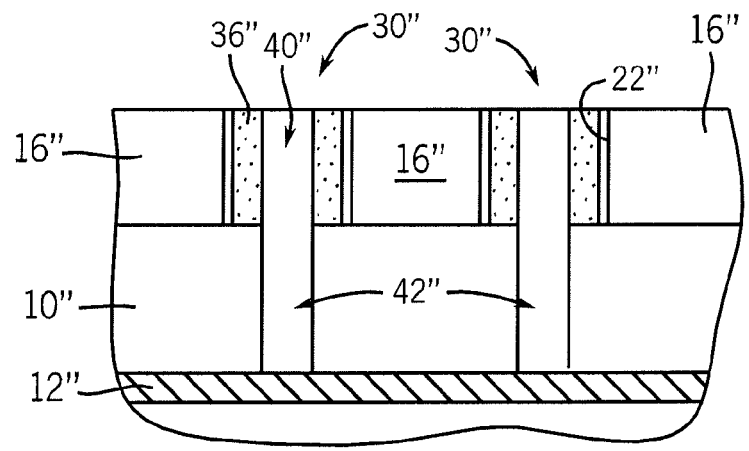
Figure 14B:
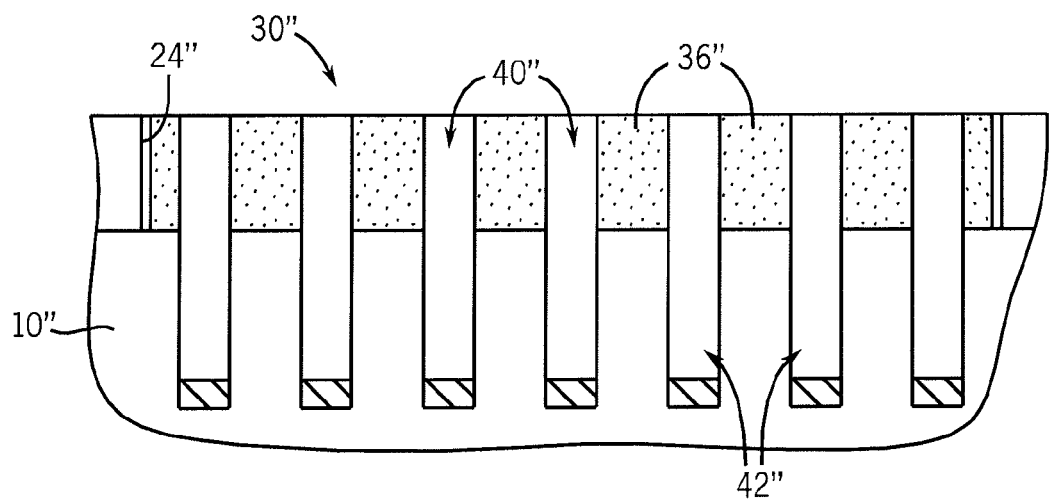

Referring now to FIGS. 14, 14A and 14B, the matrix 30" can then be used as a mask to etch cylindrical-shaped openings 42" in the substrate 10" down to an active area such as a conductive line 12" or to semiconducting regions, etc. The remnants of the polymer matrix 36" (functioning as an etch mask) can be subsequently removed and the openings 42" can be filled as desired, as described with respect to FIGS. 15, 15A and 15B

In another embodiment, the trenches are constructed with a width ($w_t$) of about 1.75-2.5*L of the block copolymer such that, upon annealing, a block copolymer material or blend of about L will self-assemble into two rows of perpendicular cylinders with each cylinder being offset to faun a zig-zag pattern, and the center-to-center pitch distance between adjacent cylinders at or about one-half L ($\simeq$0.5*L). For example, referring to FIGS. 19, 19A and 19B, in the use of a cylinder-forming block copolymer material or blend with an L (pitch) value of about 40 nm, a trench 18"" can be constructed with a width ($w_t$) about 70-100 nm wide (or according to 1+((square root of 3)/2)*L). The length ($l_t$) of the trench 18"" can be at or about [1+0.5(n−1)]*L, where n equals the number of cylinders in the trench 18'''. The depth ($D_t$) of the trench 18"" can be greater than L ($D_t$>L) for embodiments employing a thermal anneal of the block copolymer (e.g., FIGS. 2-8) or at or about L ($D_t \simeq$L) for embodiments utilizing a solvent anneal process (e.g., FIGS. 11-14).

Figure 19:
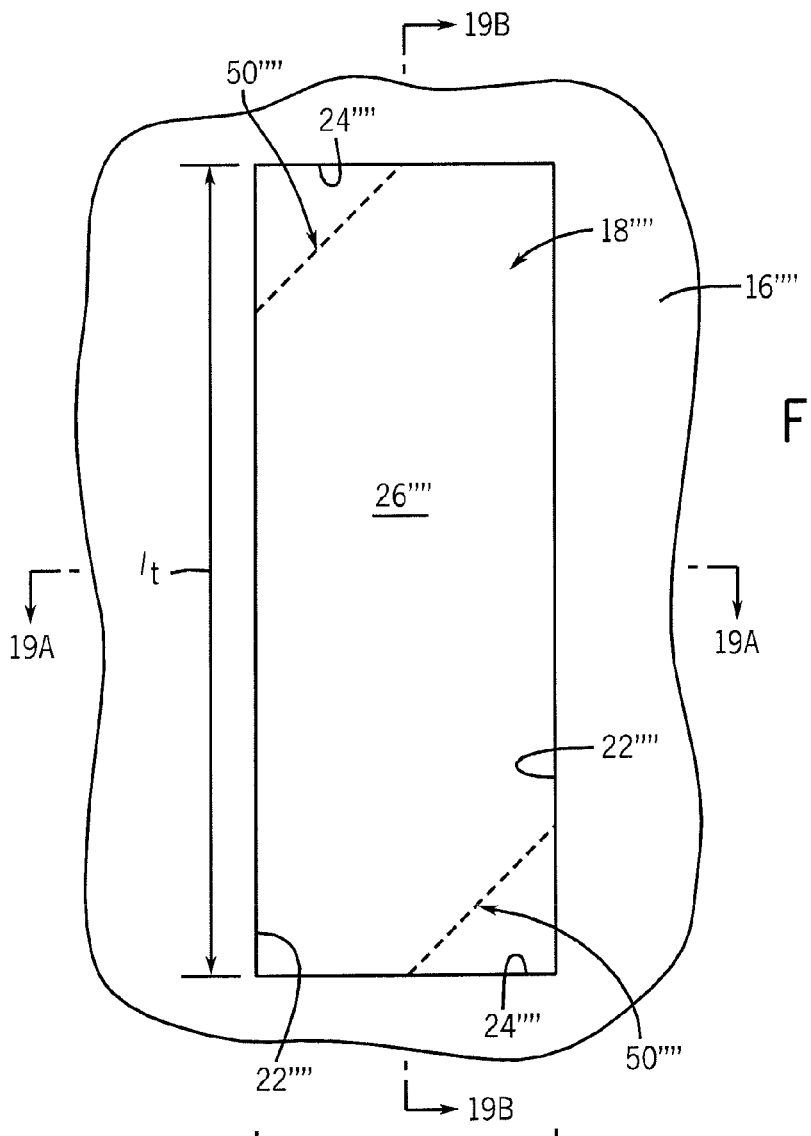
FIGS. 19-22 illustrate another embodiment of the invention for forming two rows of cylinders in a single trench.
Figure 19A:
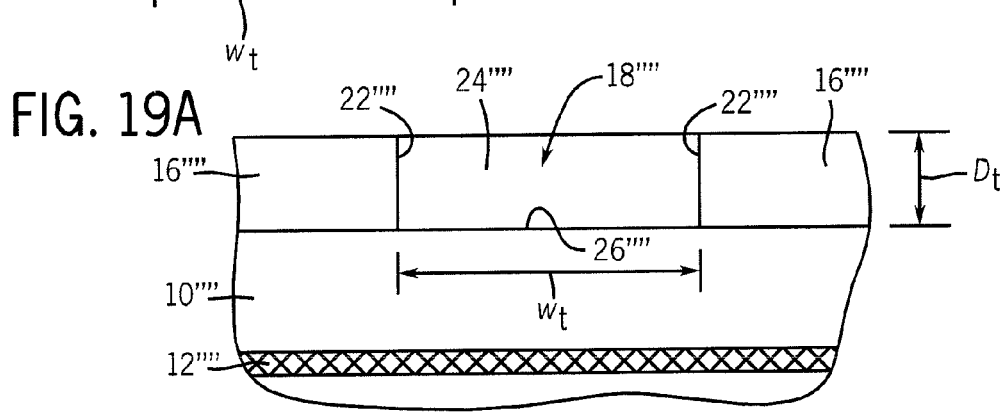
FIGS. 19A and 19B are elevational, cross-sectional views of a portion of the substrate depicted in FIG. 19 taken, respectively, along lines 19A-19A and 19B-19B.
Figure 19B:
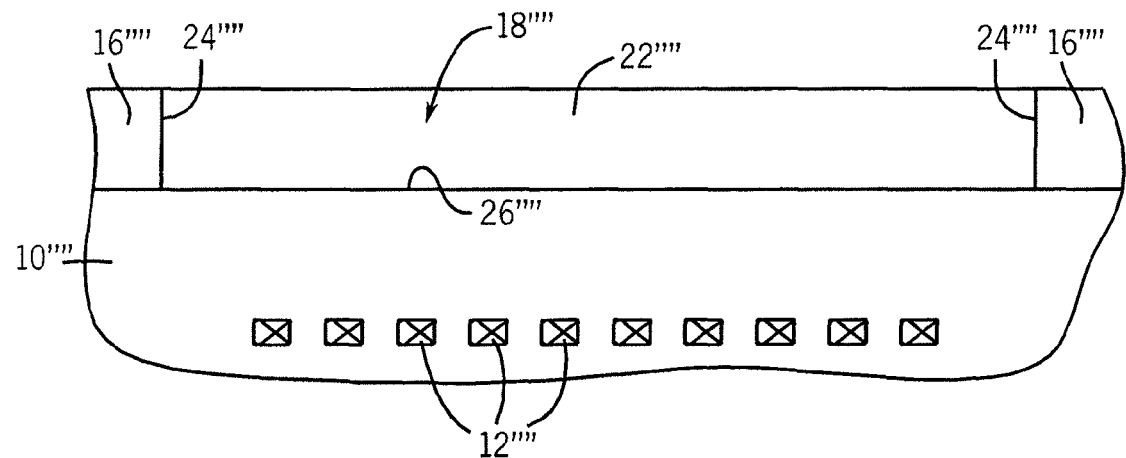
Figure 20:
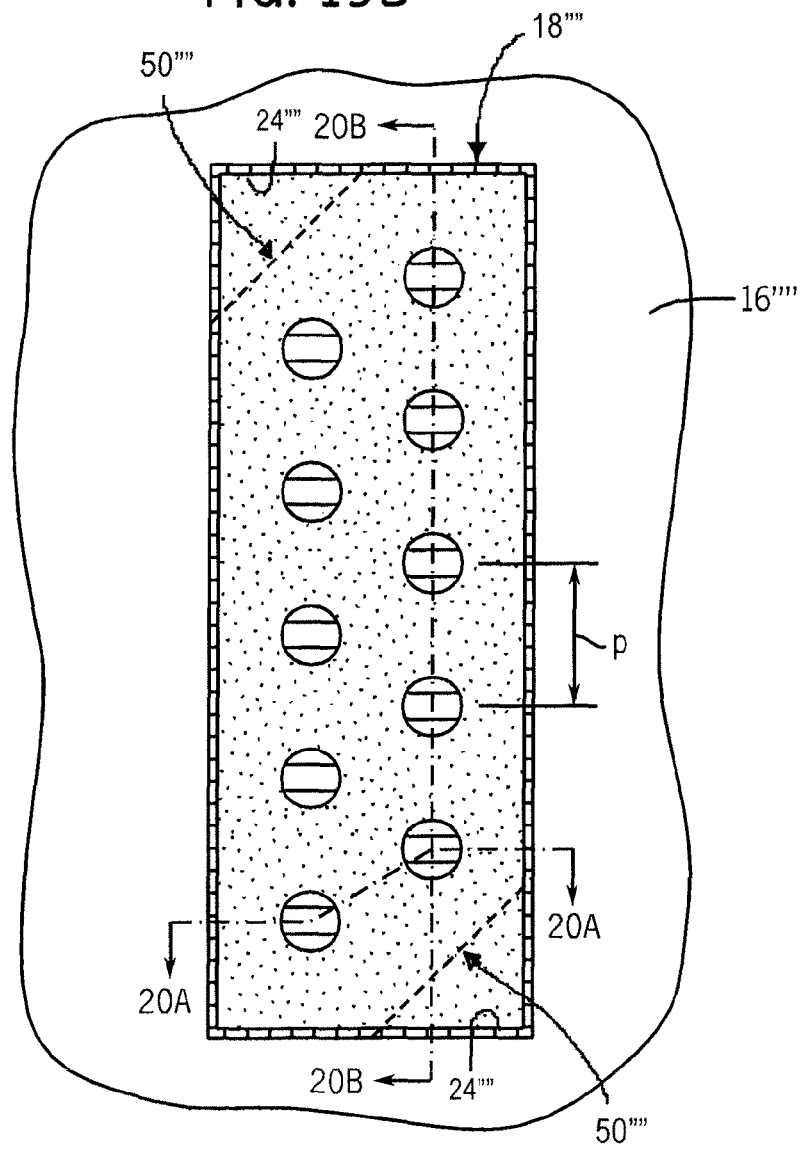

Optionally, the ends 24"" can be angled or beveled as depicted by the dashed line 50"" in FIGS. 19 and 20. The dimensions of the trench 18"" can be, for example, about 70-100 nm wide ($w_t$), about 100-25,000 nm long ($l_t$), and about 40-200 nm deep ($D_t$).

Any of the above-described cylindrical-phase block copolymers (e.g., PS-b-PMMA, PS-b-PEO, PS-b-PLA, etc.) can be deposited within the trench 18"", and thermal or solvent annealed as previously described.

Figure 20A:
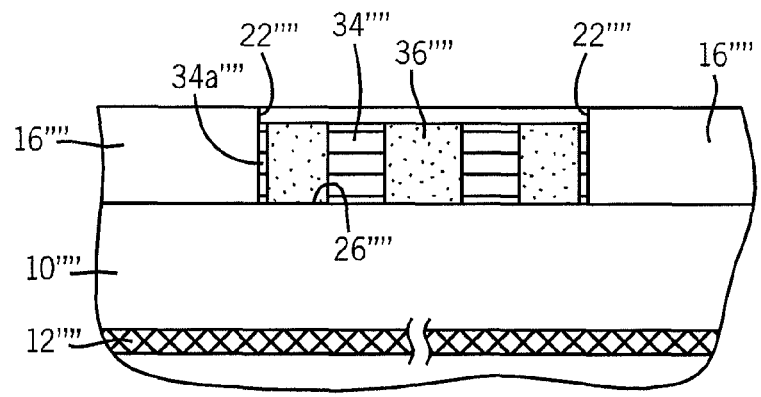
FIGS. 20A, 21A and 22A are elevational, cross-sectional views of the substrates of FIGS. 20, 21 and 22 taken, respectively, along lines 20A-20A, 21A-21A and 22A-22A.
Figure 20B:
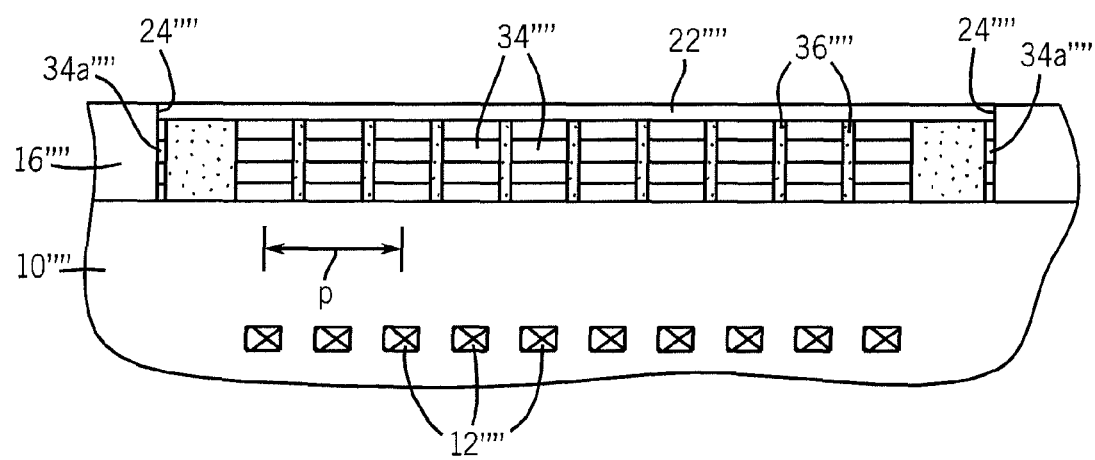
FIGS. 20B, 21B and 22B are elevational, cross-sectional views of the substrates of FIGS. 20, 21 and 22 taken along lines 20B-20B, 21B-21B and 22B-22B, respectively, showing both lines of cylinders.
Figure 21:
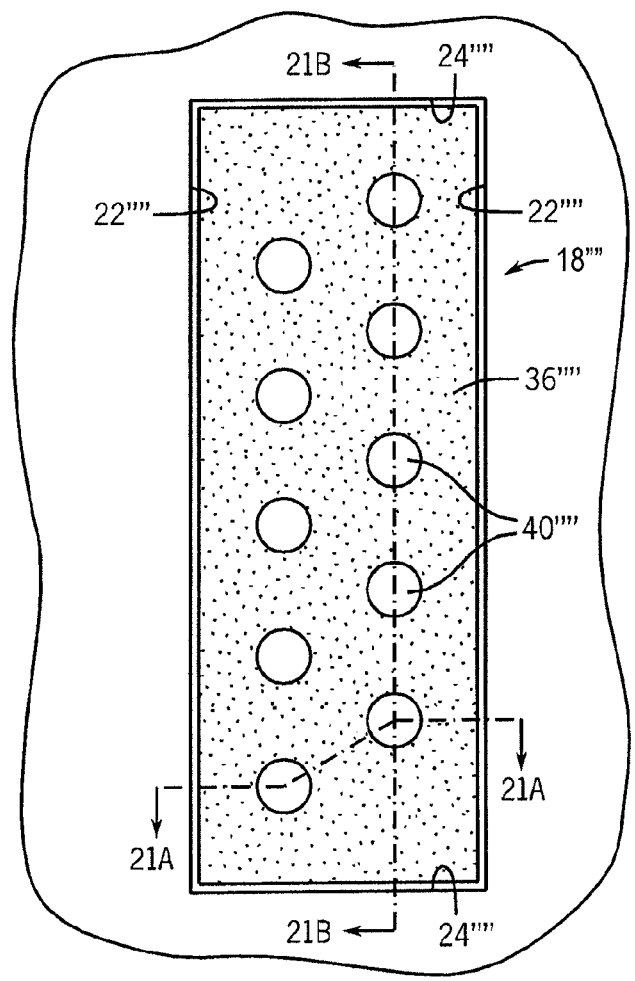
Figure 21A:
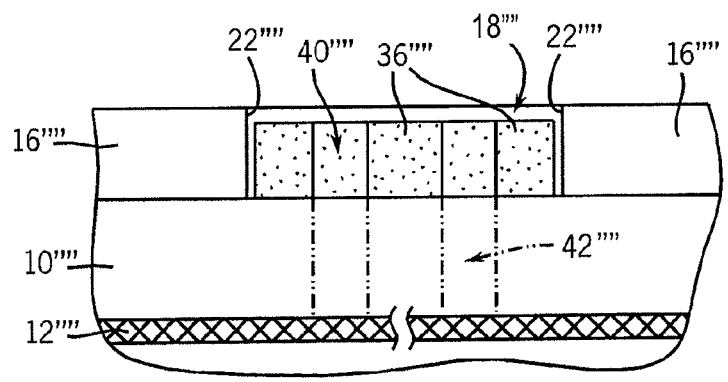
Figure 21B:
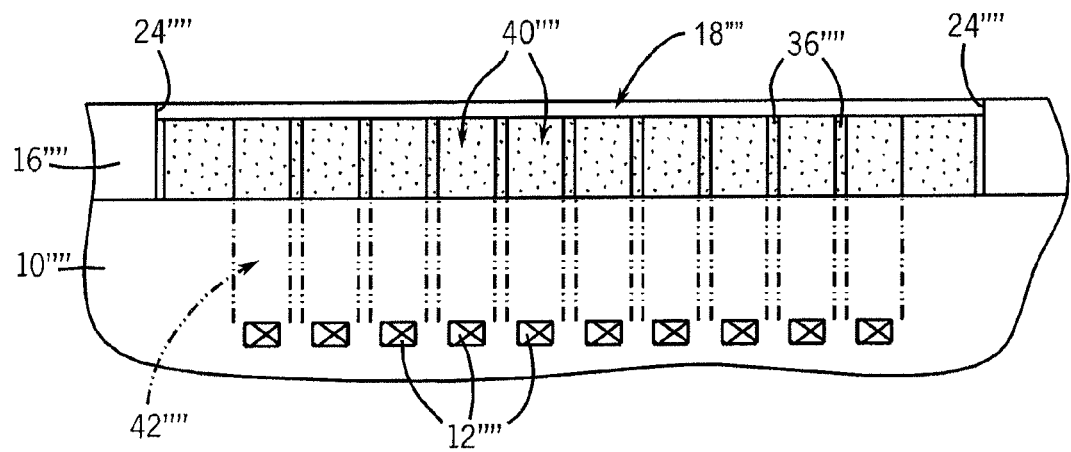
Figure 22:
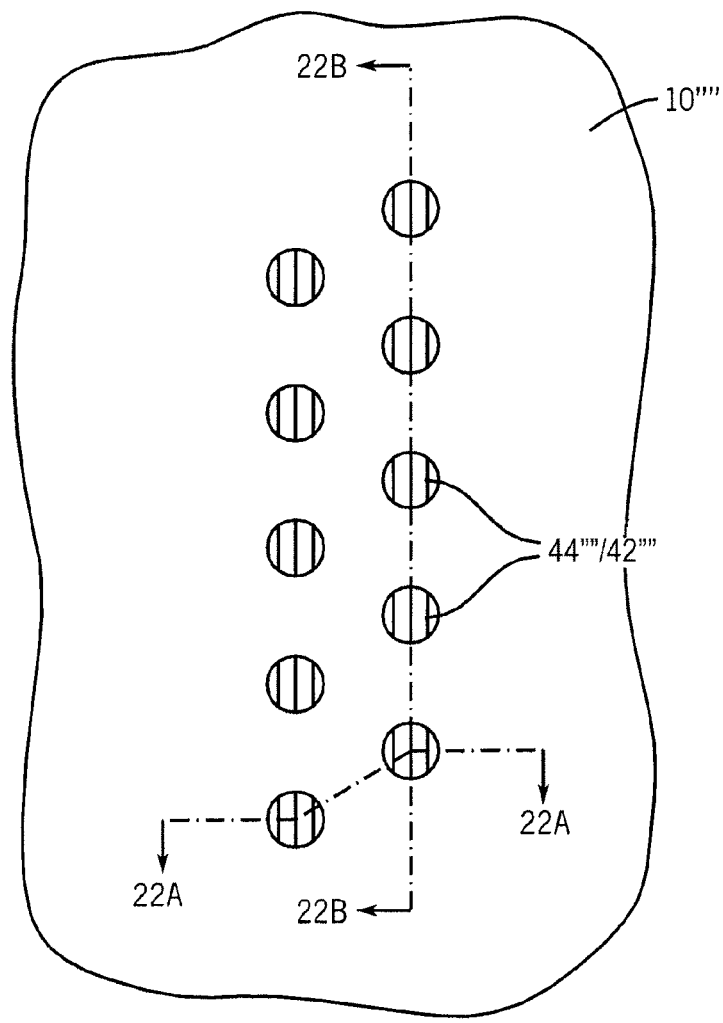
Figure 22A:
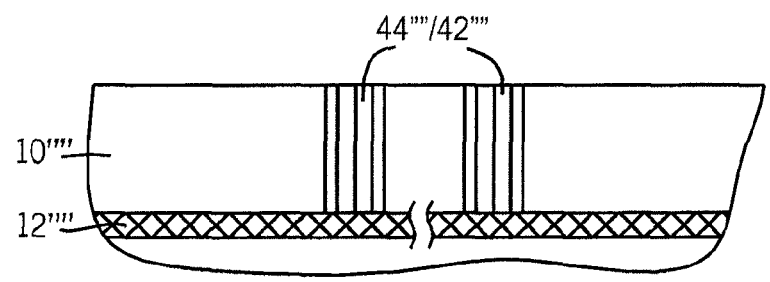
Figure 22B:
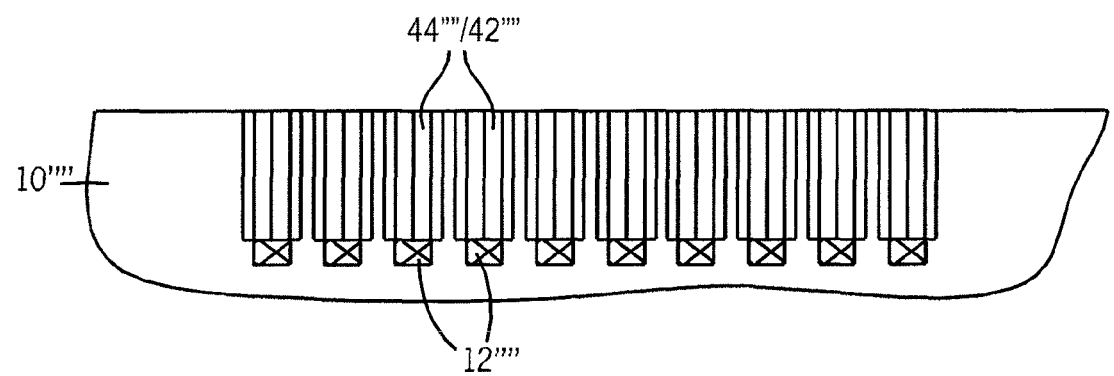

The trench 18"" is fabricated with the appropriate neutral or preferential wetting layer 34a"" on the sidewalls 22"", ends 24"", and floor 26"" of trench 18"" to drive the block copolymer to self-assemble into perpendicularly-oriented cylindrical domains 34"" upon annealing, as depicted in FIGS. 20, 20A and 20B. The resulting cylindrical domains 34"" are formed in a staggered two-row arrangement parallel to the sidewalls 22"" in which the center-to-center pitch distance (p) of adjacent cylindrical domains 34"" within a row is at or about 0.5*L. FIG. 20B illustrates a schematic cross-sectional, elevational view of both rows of cylindrical domains in relation to the underlying conductive lines 12"". The self-assembled polymer film can then be processed to formed a mask (FIGS. 21, 21A and 21B) by removing the cylindrical domains 34"" (e.g., PMMA) leaving a polymer matrix 36"" (e.g., PS) with cylindrical openings 40"" to the underlying substrate 10"", which can then be etched to faun openings 42"" (shown in phantom) to "buried" active areas (e.g., conductive lines 12"") and the openings 42"" can then be filled (FIGS. 22, 22A and 22B) with a desired material 44"", e.g., metal, to form, for example, a contact to underlying conductive lines 12"". In some embodiments, the feature size of the conductive lines 12"" is less than the diameter of the cylindrical domains 34"" (e.g., by about 50%) such that a variance in the diameter of the cylindrical domains 34"" and the subsequently formed cylindrical openings 42"" avoids electrical shorts that can occur from overlapping diameters of adjacent cylindrical domains.

With the present embodiment of two rows of cylinders in an offset arrangement, contact openings 42"" can be etched into a substrate to a denser array of buried conductive lines 12"" than with an embodiment utilizing a single row of cylinders (e.g., FIG. 6) for a given block copolymer pitch L. With the contact openings 42"" being offset, each contact opening 42"" can be connected to a single conductive line 12"" to address the lines individually.

Methods of the disclosure provide a means of generating self-assembled diblock copolymer films composed of perpendicularly-oriented cylinders in a polymer matrix. The methods provide ordered and registered elements on a nanometer scale that can be prepared more inexpensively than by electron beam lithography, EUV photolithography or conventional photolithography. The feature sizes produced and accessible by this invention cannot be easily prepared by conventional photolithography. The described methods and systems can be readily employed and incorporated into existing semiconductor manufacturing process flows and provide a low cost, high-throughput technique for fabricating small structures.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method of forming a polymer material, comprising:
   annealing a block copolymer material situated within a trench in a substrate to form cylinders of a first block of the block copolymer within a matrix of a second block of the block copolymer, the trench having a length, opposing ends, sidewalls and a floor that are preferentially wetting to the first block of the block copolymer,
   the annealed block copolymer material having a thickness, and the cylinders oriented perpendicular to and extending from the floor of the trench through the thickness of the annealed block copolymer material.

2. The method of claim 1, wherein the trench has a width of about 1 to about 1.5 times the L value of the block copolymer material.

3. The method of claim 2, wherein the cylinders are in a single row for the length of the trench.

4. The method of claim 1, wherein the width of the trench is about 1.75 to about 2.5 times the L value of the block copolymer material.

5. The method of claim 1, wherein the cylinders are in a zig-zag arrangement.

6. The method of claim 1, wherein the annealing comprises thermal annealing.

7. The method of claim 6, wherein the thermal annealing comprises globally heating the block copolymer material.

8. The method of claim 6, wherein the thermal annealing comprises passing a heat source across the block copolymer material to apply heat to a portion of the block copolymer material.

9. The method of claim 6, wherein the block copolymer comprises polystyrene and polylactide, and the block copolymer forms a bilayer of polylactide and polystyrene on the sidewalls, ends and floor of the trench.

10. The method of claim 1, wherein the annealing comprises solvent annealing.

11. The method of claim 10, wherein the solvent annealing is conducted in about 70% to 85% humidity.

12. The method of claim 10, wherein the solvent annealing comprises thermal annealing with a partial pressure of saturated solvent vapor.

13. The method of claim 1, wherein the block copolymer material is situated within a plurality of trenches and the ends of adjacent trenches are offset from each other.

14. The method of claim 13, wherein the ends of adjacent trenches are offset from each other by less than 5% of the L value of the block copolymer material.

15. A method of forming a polymer material, comprising:
thermally annealing a block copolymer material situated within a trench in a substrate to form cylinders of a first block of the block copolymer within a matrix of a second block of the block copolymer, the trench having a length, opposing ends and sidewalls that are preferentially wetting to the first block, and a neutral wetting floor,
the annealed block copolymer material having a thickness, and the cylinders oriented perpendicular to and extending from the neutral wetting floor of the trench through the thickness of the annealed block copolymer material in a single row for the length of the trench.

16. A method of forming a polymer material, comprising:
annealing a block copolymer material situated within a trench in a substrate to form cylinders of a first block of the block copolymer within a matrix of a second block of the block copolymer, the trench having a length, a floor, and opposing ends and sidewalls that are preferentially wetting to the first block of the block copolymer,
the annealed block copolymer material having a thickness, and the cylinders oriented perpendicular to and extending from the floor of the trench through the thickness of the annealed block copolymer material.

17. The method of claim 16, wherein the cylinders are in two rows for the length of the trench with adjacent cylinders offset from each other in a zig-zag arrangement.

18. The method of claim 17, wherein the adjacent cylinders are offset from each other at a center-to-center distance of about one-half the L value of the block copolymer material.

19. The method of claim 17, wherein the ends of the trench are angled.

20. A self-assembled block copolymer material situated within a trench in a material overlying a substrate, the trench having a length and a floor, sidewalls and ends that are preferential wetting to a first block of the block copolymer material, the block copolymer material comprising cylinders of the first block in a matrix of a second block of the block copolymer material, the cylinders oriented perpendicular to and extending from the floor of the trench through the thickness of the block copolymer material in a single row extending the length of the trench.

21. The block copolymer material of claim 20, wherein the block copolymer material is situated within a plurality of trenches with the ends of adjacent trenches being offset from each other.

22. The block copolymer material of claim 21, wherein the ends of adjacent trenches are offset from each other by less than 5% of the L value of the block copolymer material.

23. A self-assembled block copolymer material situated within a trench in a material overlying a substrate, the trench having a length, a floor that is neutral wetting, and sidewalls and ends that are preferential wetting to a first block of the block copolymer material, the block copolymer material comprising cylinders of the first block in a matrix of a second block of the block copolymer material, the cylinders oriented perpendicular to and extending from the trench floor through the thickness of the block copolymer material in a single row extending the length of the trench.

24. The block copolymer material of claim 23, wherein the block copolymer material is situated within a plurality of trenches with the ends of adjacent trenches being offset from each other.

25. A self-assembled block copolymer material situated within a trench in a material overlying a substrate, the trench having a length, the block copolymer material comprising cylinders of a first block in a matrix of a second block of the block copolymer material, the cylinders oriented perpendicular to and extending from the floor of the trench through the thickness of the block copolymer material in two rows for the length of the trench with adjacent cylinders offset from each other in a zig-zag arrangement.

26. The block copolymer material of claim 25, wherein the adjacent cylinders are offset from each other at a center-to-center distance of about one-half the L value of the block copolymer material.

27. The block copolymer material of claim 25, wherein the ends of the trench are angled.

28. The block copolymer material of claim 25, wherein the block copolymer material is situated within a plurality of trenches with the ends of adjacent trenches being offset from each other.

* * * * *